(12) United States Patent
Sumita

(10) Patent No.: US 8,030,969 B2
(45) Date of Patent: *Oct. 4, 2011

(54) SEMICONDUCTOR INTEGRATED CIRCUIT

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/945,290

(22) Filed: Nov. 12, 2010

(65) Prior Publication Data

US 2011/0063008 A1 Mar. 17, 2011

Related U.S. Application Data

(60) Continuation of application No. 12/430,469, filed on Apr. 27, 2009, now Pat. No. 7,859,310, which is a division of application No. 11/792,777, filed as application No. PCT/JP2006/320637 on Oct. 17, 2006, now Pat. No. 7,541,841.

(30) Foreign Application Priority Data

Oct. 18, 2005 (JP) ................................. 2005-302554

(51) Int. Cl.
*H03K 19/096* (2006.01)

(52) U.S. Cl. ............ 326/95; 326/98; 327/200; 327/214; 327/90

(58) Field of Classification Search .............. 326/93–98; 327/90, 200, 214

See application file for complete search history.

(56) References Cited

U.S. PATENT DOCUMENTS

| 5,559,449 | A | | 9/1996 | Padoan et al. |
| 5,818,068 | A | * | 10/1998 | Sasaki et al. ..................... 257/59 |
| 5,898,330 | A | | 4/1999 | Klass |
| 6,462,596 | B1 | | 10/2002 | Varma |
| 6,486,706 | B2 | | 11/2002 | Ye et al. |
| 6,597,201 | B1 | | 7/2003 | Parris et al. |
| 6,608,775 | B2 | | 8/2003 | Lu et al. |
| 6,653,866 | B2 | | 11/2003 | Narendra et al. |

(Continued)

FOREIGN PATENT DOCUMENTS

JP 63-093223 4/1988

(Continued)

*Primary Examiner* — Vibol Tan

(74) *Attorney, Agent, or Firm* — McDermott Will & Emery LLP

(57) ABSTRACT

In a dynamic flip-flop circuit with a data selection function, for example, when data having an H value has been selected using a selection signal S0, a first node N1 is L and a second node N2 of a second dynamic circuit 1B is H, so that an output signal Q has an H level. In this case, when none of a plurality of pieces of data D0 to D2 is selected using selection signals S0 to S2, the first node N1 is H, so that the electric charge of the second node N2 is discharged and the output signal Q erroneously has an L level. However, in this case, an output node N3 is H and a fourth node N4 is L, so that an n-type transistor Tr6 of the second dynamic circuit 1B is turned OFF, thereby preventing the second node N2 from being discharged. Therefore, a normal operation is performed while securing a satisfactorily high-speed operation even when none of the pieces of data is selected. This circuit is used in a predetermined circuit, such as, for example, a forwarding path of a data path, a crossbar bus switch, or an input portion of a reconfigurable processing unit.

4 Claims, 32 Drawing Sheets

U.S. PATENT DOCUMENTS

| | | |
|---|---|---|
| 6,686,775 B2 | 2/2004 | Campbell |
| 6,750,677 B2 | 6/2004 | Sumita |
| 6,833,735 B2 | 12/2004 | Kumar et al. |
| 6,907,556 B2 * | 6/2005 | Siegel .................. 714/726 |
| 6,995,586 B2 | 2/2006 | Campbell |
| 7,157,930 B2 | 1/2007 | Hirata |
| 7,161,390 B2 | 1/2007 | Aipperspach et al. |
| 7,282,957 B2 | 10/2007 | Sumita |
| 7,417,467 B2 | 8/2008 | Sumita |
| 2002/0180485 A1 | 12/2002 | Sumita |
| 2004/0070419 A1 | 4/2004 | Hirano et al. |
| 2006/0022716 A1 | 2/2006 | Sumita |
| 2008/0012601 A1 | 1/2008 | Sumita |
| 2009/0237137 A1 | 9/2009 | Kim |

FOREIGN PATENT DOCUMENTS

| | | |
|---|---|---|
| JP | 2003-060497 | 2/2003 |

* cited by examiner

FIG.3
(a) PRIOR ART
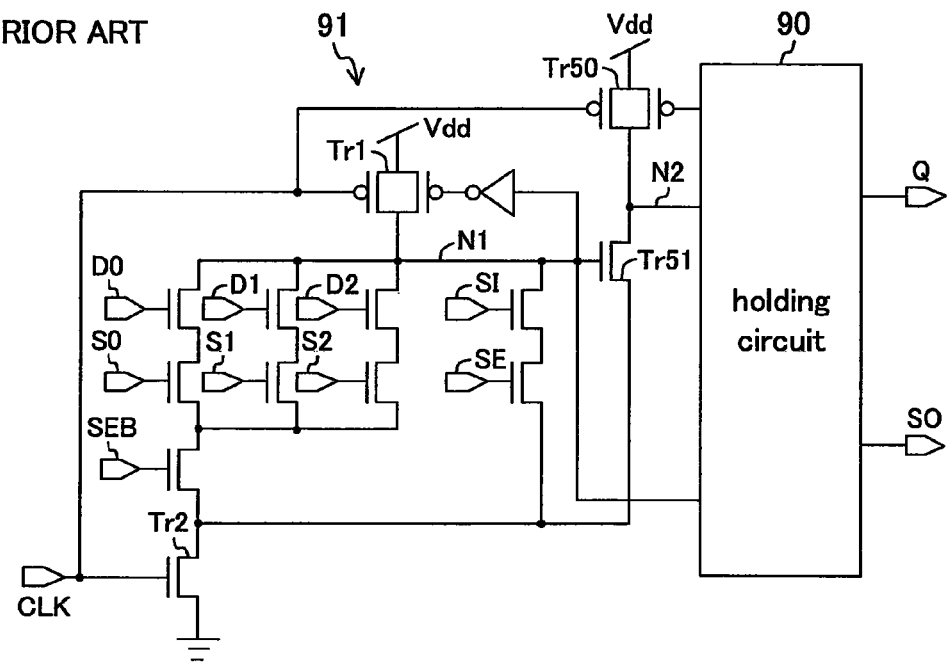
(b)
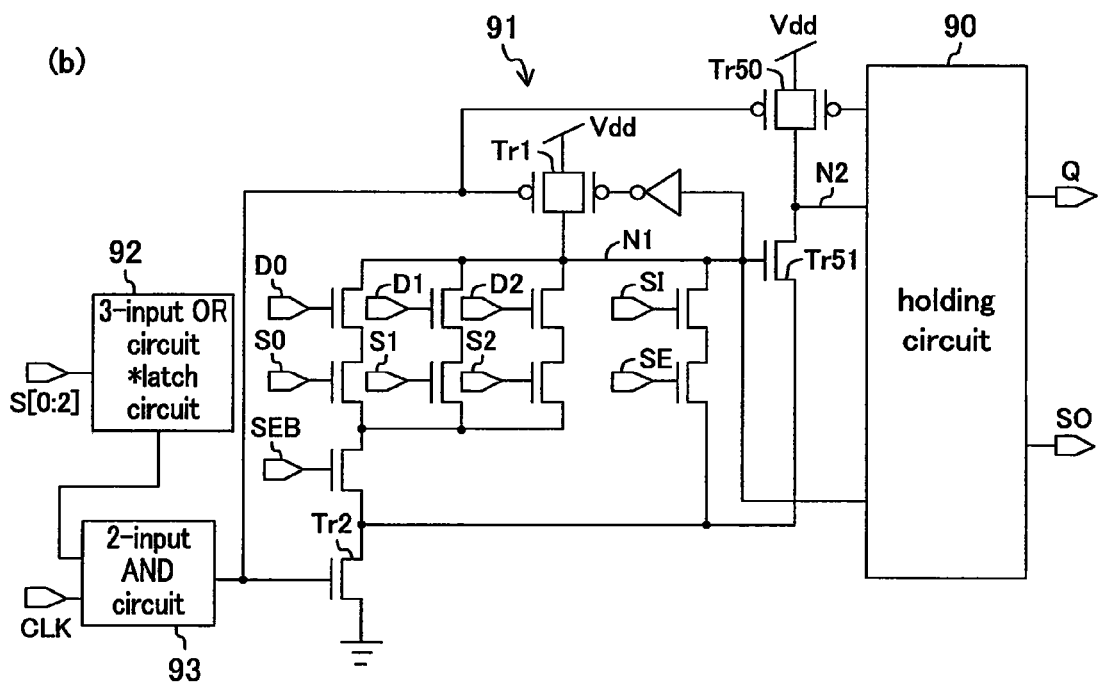

1G output circuit 1H clock generation circuit

SEMICONDUCTOR INTEGRATED CIRCUIT

RELATED APPLICATIONS

This application is a continuation of U.S. patent application Ser. No. 12/430,469, filed on Apr. 27, 2009, now U.S. Pat. No. 7,859,310, which is a divisional of U.S. patent application Ser. No. 11/792,777, filed Jun. 11, 2007, now U.S. Pat. No. 7,541,841, which is a U.S. National Phase under 35 U.S.C. §371 of International Application No. PCT/JP2006/320637, filed on Oct. 17, 2006, which in turn claims the benefit of Japanese Application No. 2005-302554, filed on Oct. 18, 2005, the entire contents of each of which are hereby incorporated by reference.

TECHNICAL FIELD

The present invention relates to a semiconductor integrated circuit, and more particularly, to a high-speed semiconductor integrated circuit.

BACKGROUND ART

Conventionally, the speed of a semiconductor integrated circuit, particularly a flip-flop circuit, is increased by incorporating a dynamic circuit into its internal structure as described in, for example, Patent Document 1. The dynamic flip-flop circuit described in Patent Document 1 has a function of receiving a plurality of pieces of data, selecting any one of them, and holding and outputting the selected data.

Hereinafter, the structure of the flip-flop circuit having the data selection function will be described with reference to FIG. 3(a). In FIG. 3(a), a data selection circuit 91 is provided at the previous stage of a holding circuit 90. In the data selection circuit 91, when a clock CLK is at a Low level (Low period), a node N1 is precharged to a power source potential Vdd by a p-type transistor Tr1, while a node N2 is precharged to the power source potential Vdd by a p-type transistor Tr50. Near the end of this period, one of selection signals S0 to S2 which is used to select any one of a plurality of pieces of data D0 to D2 is turned High. Subsequently, when the clock CLK goes to High and the selected data (e.g., D0) is High, the electric charge of the node N1 is discharged via an n-type transistor Tr2, so that the potential of the node N1 becomes equal to that of the ground. Therefore, an n-type transistor Tr51 is turned OFF, so that the precharge potential of the node N2 is held. In this case, this potential is held as an H value by the holding circuit 90, which in turn outputs an output signal Q having the H value.

On the other hand, when the selected data D0 is Low, the electric charge of the node N1 is not discharged, so that the potential of the node N1 is held as it is the precharge potential and the n-type transistor Tr51 is turned ON. As a result, the electric charge of the node N2 is discharged via the n-type transistor Tr51 and the n-type transistor Tr2, so that the potential of the node N2 becomes an L value. The L value is held by the holding circuit 90, which in turn outputs an output signal Q having the L value.

Note that, in FIG. 3(a), SI indicates a data input when scanning is performed, SE indicates a scan shift control signal, and SEB indicates an inverted signal of the scan shift control signal.

Patent Document 1: Japanese Unexamined Patent Application Publication No. 2003-060497

DISCLOSURE OF THE INVENTION

Problems to be Solved by the Invention

However, it was found that the conventional dynamic flip-flop circuit having the data selection function malfunctions when none of the plurality of pieces of data is selected. Hereinafter, the malfunction will be described.

In an ordinary operation, for example, the node N2 is at the precharge potential (H value) and the holding circuit 90 outputs the output signal Q having the H value. In this case, when none of the plurality of pieces of data D0 to D2 is selected during the next High period of the clock CLK (i.e., all of the selection signals S0 to S2 have the Low value), the n-type transistor Tr2 is turned ON. However, the precharge potential of the node N1 is held, so that the n-type transistor Tr51 is turned ON. Therefore, the electric charge of the node N2 is discharged via the n-type transistors Tr51 and Tr2 to the L value. As a result, the holding circuit 90 erroneously outputs an output signal Q having the L value.

To solve the above-described problems, for example, the following circuit is considered to be added, which inputs a signal to the gate of the n-type transistor Tr2 as shown in FIG. 3(b). Specifically, a static circuit comprising a circuit 92 including an OR circuit which receives all of the selection signals S0 to S2 and a latch circuit which latches an output of the OR circuit during a High period of the clock CLK, and an AND circuit 93 which receives an output of the latch circuit and the clock CLK, is additionally provided, and an output of the AND circuit 93 is input to the gate of the n-type transistor Tr2.

In this case, however, all of the selection signals S0 to S2 need to be passed through the OR circuit and the latch circuit by a rising time of the clock CLK. Therefore, an extra setup time (a time required for the static circuit to establish its output by a rising time of the clock CLK) is required, resulting in impairment of the speed of operation.

In view of the problems above, an object of the present invention is to provide a dynamic flip-flop circuit with a data selection function which can operate normally while securing a satisfactorily high-speed operation even when none of a plurality of pieces of data is selected.

Also, the area of the dynamic flip-flop circuit with a data selection function is decreased by reducing the number of circuit elements. Further, by providing a high-speed and small-area dynamic flip-flop circuit with a data selection function at an optimal portion, the performance of a semiconductor integrated circuit is caused to have higher precision.

Solution to the Problems

To achieve the object, according to the present invention, when none of a plurality of pieces of data is selected, for example, in the semiconductor integrated circuit of FIG. 3(a), the precharge of the node N2 is prevented from being discharged, so that the H value of the node N2 is maintained. The holding circuit holds and outputs the H value of the node N2.

Specifically, according to the present invention, in a semiconductor integrated circuit which receives a clock, a plurality of pieces of data, and a plurality of selection signals for selecting the data, and when the clock is transitioned, outputs a piece of data selected by the selection signal to a holding circuit, the semiconductor integrated circuit comprises a non-selected state detection circuit for detecting a state in which all of the plurality of selection signals select none of the plurality of pieces of data. When the non-selected state detection circuit detects a state in which all of the plurality of selection signals select none of the plurality of pieces of data, the previously selected data is prevented from being changed, so that output data of the holding circuit is held. The semiconductor integrated circuit is used in a predetermined circuit.

In the semiconductor integrated circuit of the present invention, the predetermined circuit is a forwarding path of a data path.

In the semiconductor integrated circuit of the present invention, the predetermined circuit is a crossbar bus switch.

In the semiconductor integrated circuit of the present invention, the predetermined circuit is an input portion of a reconfigurable processing unit.

The semiconductor integrated circuit of the present invention has a first dynamic circuit for receiving the plurality of pieces of data and the plurality of selection signals, and selecting any of the plurality of pieces of data based on the plurality of selection signals, a second dynamic circuit for receiving an output of the first dynamic circuit, and a differential amplification circuit for receiving the output of the first dynamic circuit and an output of the second dynamic circuit, and amplifying a differential voltage between the inputs, the differential amplification circuit being activated by the clock. An output of the differential amplification circuit is input to the holding circuit.

The semiconductor integrated circuit of the present invention has a first dynamic circuit for receiving the plurality of pieces of data and the plurality of selection signals, and selecting any of the plurality of pieces of data based on the plurality of selection signals, a second dynamic circuit for receiving an output of the first dynamic circuit, a third dynamic circuit for receiving the plurality of selection signals, and determining whether or not any of the plurality of selection signals is activated, a fourth dynamic circuit for receiving an output of the third dynamic circuit, and a differential amplification circuit for amplifying a differential voltage between the output of the first dynamic circuit and an output of the second dynamic circuit, the differential amplification circuit being activated by an output of the fourth dynamic circuit or an inverted output of the third dynamic circuit. An output of the differential amplification circuit is input to the holding circuit.

The semiconductor integrated circuit of the present invention has a first dynamic circuit for receiving the plurality of pieces of data and the plurality of selection signals, and selecting any of the plurality of pieces of data based on the plurality of selection signals, the number of stages of transistors connected in series so as to select any of the plurality of pieces of data being a predetermined number. In the non-selected state detection circuit, the number of stages of transistors connected in series so as to detect a state in which all of the plurality of selection signals select none of the plurality of pieces of data is smaller, by one or more, than the predetermined number of stages in the first dynamic circuit.

The semiconductor integrated circuit of the present invention comprises a first dynamic circuit for receiving the plurality of pieces of data and the plurality of selection signals, and selecting any of the plurality of pieces of data based on the plurality of selection signals, a second dynamic circuit for receiving an output of the first dynamic circuit, and a setup absorption circuit for absorbing a setup delay of data selected by the plurality of selection signals of the plurality of pieces of data, the setup absorption circuit being provided between the second dynamic circuit and the holding circuit.

In the semiconductor integrated circuit of the present invention, an output of the second dynamic circuit is input to the holding circuit. The setup absorption circuit is activated by a delayed clock signal which is obtained by delaying the clock by a predetermined time, the output of the first dynamic circuit is input to the setup absorption circuit, and an output side of the setup absorption circuit is connected to an output side of the second dynamic circuit via a switch circuit which is controlled by the delayed clock signal.

In the semiconductor integrated circuit of the present invention, an output of the second dynamic circuit is input to the holding circuit. The setup absorption circuit is activated by an output signal of the second dynamic circuit, the output of the first dynamic circuit is input to the setup absorption circuit, and an output side of the setup absorption circuit is connected to an output side of the second dynamic circuit via a buffer and a switch circuit which is controlled by the output signal of the second dynamic circuit.

According to the present invention, in a semiconductor integrated circuit which receives a clock and data, and when the clock is transitioned, outputs the data to a holding circuit, the semiconductor integrated circuit has a first dynamic circuit for receiving the data, a second dynamic circuit for receiving an output of the first dynamic circuit, and a differential amplification circuit for receiving the output of the first dynamic circuit and an output of the second dynamic circuit, and amplifying a differential voltage between the inputs. An output of the differential amplification circuit is input to the holding circuit.

According to the present invention, in a semiconductor integrated circuit which receives a clock, a plurality of pieces of data, and a plurality of selection signals for selecting any of the plurality of pieces of data, and when the clock is transitioned, outputs a piece of data selected by the selection signal to a holding circuit, the semiconductor integrated circuit has a first dynamic circuit for receiving the plurality of pieces of data and the plurality of selection signals, and selecting any of the plurality of pieces of data based on the plurality of selection signals, a second dynamic circuit for receiving an output of the first dynamic circuit, a third dynamic circuit for receiving the plurality of selection signals, and determining whether or not any of the plurality of selection signals is activated, a fourth dynamic circuit for receiving an output of the third dynamic circuit, and a differential amplification circuit for amplifying a differential voltage between the output of the first dynamic circuit and an output of the second dynamic circuit, the differential amplification circuit being activated by an output of the fourth dynamic circuit or an inverted output of the third dynamic circuit. An output of the differential amplification circuit is input to the holding circuit.

According to the present invention, in a semiconductor integrated circuit which receives a clock, a plurality of pieces of data, and a plurality of selection signals for selecting any of the plurality of pieces of data, and when the clock is transitioned, outputs selected data to a holding circuit, the semiconductor integrated circuit has a first dynamic circuit for receiving the plurality of pieces of data and the plurality of selection signals, and selecting any of the plurality of pieces of data, a second dynamic circuit for receiving an output of the first dynamic circuit, a third dynamic circuit for receiving the plurality of selection signals, and a fourth dynamic circuit for receiving an output of the third dynamic circuit. Only when an output of the fourth dynamic circuit is transitioned, an output of the second dynamic circuit is input to the holding circuit.

According to the present invention, in a semiconductor integrated circuit which receives a clock and data, and when the clock is transitioned, outputs the data to a holding circuit, the semiconductor integrated circuit has a first dynamic circuit for receiving the data, a second dynamic circuit for receiving an output of the first dynamic circuit, and a third dynamic circuit activated by a delayed clock signal which is obtained by delaying the clock by a predetermined time. An output of the second dynamic circuit is input to the holding circuit. An input of the third dynamic circuit is the output of the first dynamic circuit. An output of the third dynamic circuit is connected to the output of the second dynamic circuit via a switch circuit which is controlled by the delayed clock signal.

According to the present invention, in a semiconductor integrated circuit which receives a clock and data, and when the clock is transitioned, outputs the data to a holding circuit, the semiconductor integrated circuit has a first dynamic circuit for receiving the data, a second dynamic circuit for receiving an output of the first dynamic circuit, and a third dynamic circuit activated by an output signal of the second dynamic circuit. An output of the second dynamic circuit is input to the holding circuit. An input of the third dynamic circuit is the output of the first dynamic circuit. An output of the third dynamic circuit is connected to the output of the second dynamic circuit via a buffer and a switch circuit which is controlled by the output signal of the second dynamic circuit.

As described above, according to the present invention, in a dynamic flip-flop circuit with a data selection function, assuming that an output signal of a data selection circuit is, for example, High, even when a state subsequently occurs in which no selection signal is activated, so that no data is selected, this state is detected, so that the output signal of the data selection circuit is held High. Therefore, a flip-flop which does not malfunction, has a small area, and can switch with high speed, can be provided in a portion where the characteristics have the greatest effect, resulting in higher precision of performance of a semiconductor integrated circuit.

Further, assuming that selected data is transferred to and held in the holding circuit, when a differential voltage between the output voltages of the two dynamic circuits is small, the differential voltage is amplified by the differential amplification circuit with high speed, and the result is output to the holding circuit. Therefore, it is possible to increase the speed of transition of the output signal of the holding circuit.

In addition, in the non-selected state detection circuit, the number of stages of transistors connected in series so as to detect a state in which none of a plurality of selection signals is selected is smaller, by one or more, than the number of stages of transistors connected in series so as to select any of a plurality of pieces of data. Therefore, when a semiconductor integrated circuit is physically designed (layout design), a vertically symmetrical layout design can be achieved even if a cell height is low.

Also, even when there is some setup delay in data of a plurality of pieces of data selected by a plurality of selection signals, the setup delay is absorbed by the setup absorption circuit, so that the output signal of the holding circuit takes a normal value.

EFFECT OF THE INVENTION

As described above, according to the semiconductor integrated circuit of the present invention, in a dynamic flip-flop circuit with a data selection function, even when a state occurs in which no selection signal is activated, so that no data is selected, the output signal of the data selection circuit is held at the previous value, so that the output signal of the holding circuit can be satisfactorily held at the previous value.

Further, a flip-flop which has a small area and can switch with high speed can be provided in an optimal portion, resulting in higher precision of performance of the semiconductor integrated circuit.

Further, since the differential amplification circuit is provided, it is possible to increase the speed of transition of the output signal of the holding circuit, resulting in a high-speed operation.

In addition, when the semiconductor integrated circuit is physically designed (layout design), a vertically symmetrical layout design can be achieved even if a cell height is low.

Also, even when there is some setup delay in selected data, the setup delay is absorbed by the setup absorption circuit, so that the output signal of the holding circuit takes a normal value. Therefore, it is possible to achieve a circuit robust to variations in manufacturing process or fluctuations in power source voltage

BRIEF DESCRIPTION OF THE DRAWINGS

FIG. 3(*a*) is a diagram illustrating a major structure of a conventional semiconductor integrated circuit. FIG. 3(*b*) is a diagram illustrating a proposed example which removes a drawback of the semiconductor integrated circuit.

Figure 1:
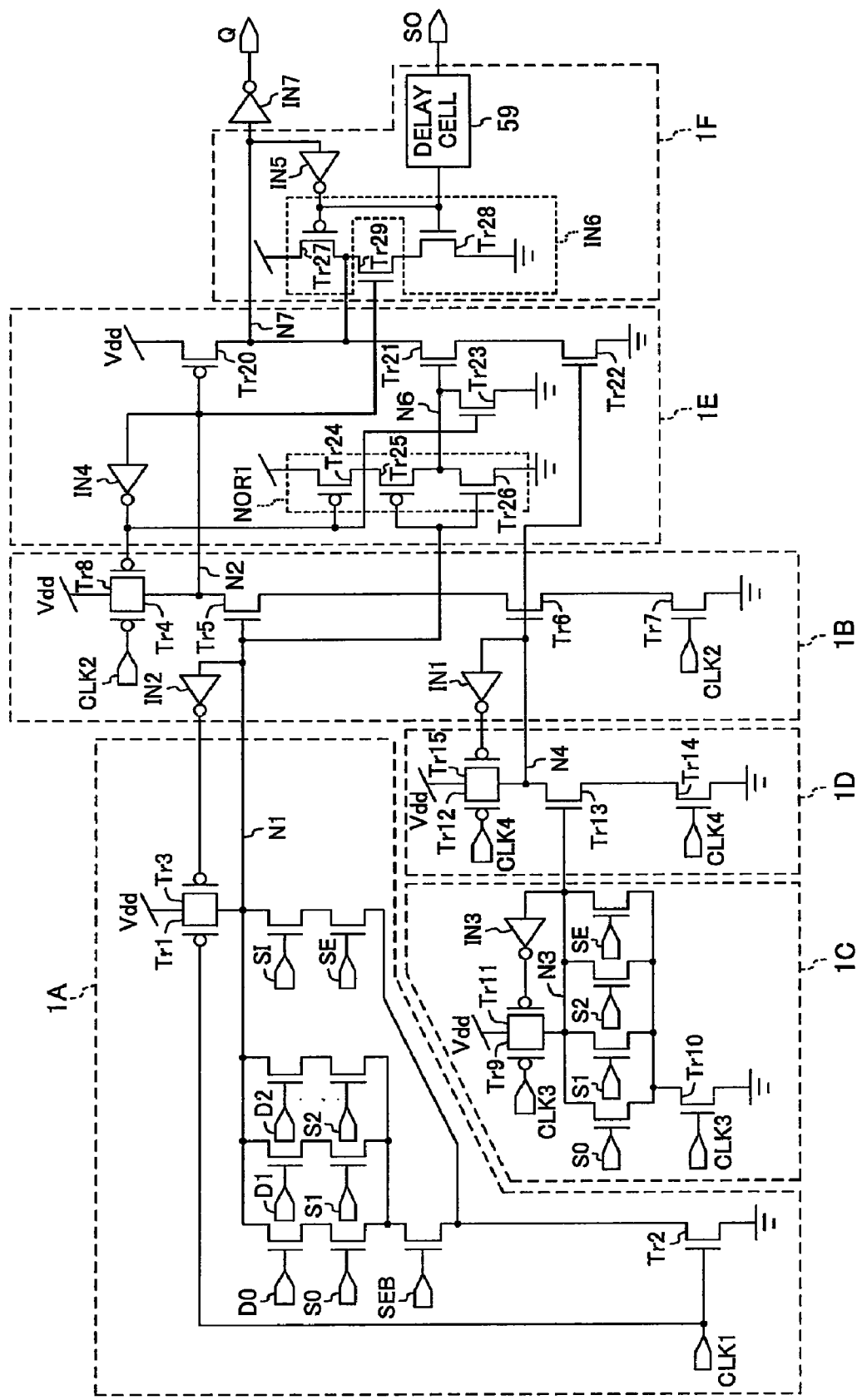
FIG. 1 is a diagram illustrating a semiconductor integrated circuit according to Embodiment 1 of the present invention.

DESCRIPTION OF THE REFERENCE CHARACTERS 1A first dynamic circuit of NOR type
2A first dynamic circuit of NOR type
1B second dynamic circuit of NAND type
1C third dynamic circuit of NOR type (non-selected state detection circuit)
2C third dynamic circuit of NOR type (matching detection circuit)
1D fourth dynamic circuit of NAND type
1E output circuit
Tr20 first p-type transistor
Tr21 first n-type transistor
Tr22 second n-type transistor
1F holding circuit
IN5 first inverter circuit
IN6 second inverter circuit
Tr27 first p-type transistor
Tr28 first n-type transistor
Tr29 second n-type transistor
1G output circuit
70 differential circuit
71 OR circuit
Tr36 n-type transistor (control transistor)
Tr37 n-type transistor (resistance element)
1H clock generation circuit (signal generation circuit)
75 short pulse generation circuit
NAND1 NAND circuit

BEST MODE FOR CARRYING OUT THE INVENTION

Hereinafter, embodiments of the present invention will be described with reference to the accompanying drawings.

Embodiment 1

FIG. 1 illustrates a semiconductor integrated circuit according to Embodiment 1 of the present invention.

In FIG. 1, D0, D1 and D2 indicate data; S0, S1 and S2 indicate selection signals which are used to select the data D0 to D2, respectively; SI indicates a data input when scanning is performed; SE indicates a scan shift control signal which is used to perform a scan shift operation; SEB indicates an inverted signal of the scan shift control signal; and Q and SO indicate output terminals.

The semiconductor integrated circuit of FIG. 1 has a first dynamic circuit 1A of NOR type, a second dynamic circuit 1B of NAND type, a third dynamic circuit 1C of NOR type, a fourth dynamic circuit 1D of NAND type, an output circuit 1E, and a holding circuit 1F. The output circuit 1E and the holding circuit 1F constitute a dynamic flip-flop circuit.

The first dynamic circuit 1A of NOR type receives the three pieces of data D0 to D2, the three selection signals S0 to S2, and a first clock CLK1, and has two p-type MOS transistors Tr1 and Tr3 and an n-type MOS transistor Tr2.

The first dynamic circuit 1A controls the selection signals S0 to S2 to be all Low during a first period which is a half period of the first clock CLK1 from falling to rising (i.e., the first clock CLK1 is Low). Therefore, during the first period, the p-type transistor Tr1 is ON and a first output node N1 is precharged to a power source voltage Vdd. Thereafter, during a second period which is a half period of the first clock CLK1 from rising to falling (i.e., the first clock CLK1 is High), the p-type transistors Tr1 and Tr3 are OFF, while the n-type transistor Tr2 is ON, so that any one of the selection signals S0 to S2 is controlled to be High. Therefore, during the second period, the potential of the first output node N1 is determined, depending on the value of one of the data D0 to D2 which is selected using the selection signal which is controlled to be High. For example, when the data D0 is Low, the precharged state of the first output node N1 is held and the first output node N1 is held at the power source potential Vdd. On the other hand, when the data D0 is High, the electric charge of the first output node N1 is discharged via the n-type transistor Tr2, so that the potential of the first output node N1 becomes equal to the ground potential.

The second dynamic circuit 1B of NAND type receives a second clock CLK2 and a signal from the first output node N1 of the first dynamic circuit 1A. Further, the second dynamic circuit 1B of NAND type has two p-type MOS transistors Tr4 and Tr8, and three n-type MOS transistors Tr5 to Tr7. The gate of the n-type transistor Tr5 receives a signal of the first output node N1 of the first dynamic circuit 1A.

In the second dynamic circuit 1B, during a first period in which the second clock CLK2 is Low, the p-type transistor Tr4 is ON and the n-type transistor Tr7 is OFF. Therefore, in this case, a second output node N2 is precharged to the power source potential Vdd. Thereafter, during a second period in which the second clock CLK2 is High, the precharge operation is stopped and the n-type transistor Tr5 is turned ON/OFF, depending on the potential of the first output node N1 of the first dynamic circuit 1A. For example, when Low data D0 is selected, the n-type transistor Tr5 is turned OFF and the precharged state of the second output node N2 is held. On the other hand, when High data D0 is selected, the n-type transistor Tr5 is turned ON and the electric charge of the second output node N2 is discharged via the two n-type transistors Tr5 and Tr7. The n-type transistor Tr6 is an important transistor for Embodiment 1, and a function thereof will be described below.

The third dynamic circuit 1C of NOR type receives a third clock CLK3, the three selection signals S0 to S2, and the scan shift control signal SE, and has two p-type transistors Tr9 and Tr11, an n-type transistor Tr10, and an inverter IN3.

In the third dynamic circuit (non-selected state detection circuit) 1C, during a first period in which the third clock CLK3 is Low, the p-type transistor Tr9 is turned ON and the n-type transistor Tr10 is turned OFF, so that a third output node N3 is precharged to the power source potential Vdd. Thereafter, during a second period in which the third clock CLK3 is High, when all of the three selection signals S0 to S2 and the scan shift control signal SE are Low (i.e., none of the data D0 to D2 is selected), the precharged state of the third output node N3 is held and this state is detected. On the other hand, when any one of the selection signals goes to High, the electric charge of the third output node N3 is discharged via the n-type transistor Tr10, so that the potential thereof becomes Low.

Further, the fourth dynamic circuit 1D of NAND type receives a fourth clock CLK4 and a signal of the third output node N3 of the third dynamic circuit 1C, and has two p-type MOS transistors Tr12 and Tr15 and two n-type MOS transistors Tr13 and Tr14. The gate of the n-type MOS transistor Tr13 receives the signal of the third output node N3 of the third dynamic circuit 1C.

In the fourth dynamic circuit 1D of NAND type, during a first period in which the fourth clock CLK4 is Low, the p-type transistor Tr12 is ON and the n-type MOS transistor Tr14 is OFF, so that a fourth output node N4 is precharged to the power source potential Vdd. On the other hand, during a second period in which the fourth clock CLK4 is High, the p-type transistor Tr12 is OFF, so that the precharge operation is stopped and the n-type MOS transistor Tr14 is ON. Therefore, the potential of the fourth output node N4 is determined, depending on the ON/OFF of the n-type transistor Tr13. In other words, during the second period, the electric charge of the third output node N3 of the third dynamic circuit 1C is held. In other words, in an ordinary operation, when all of the selection signals S0 to S2 are Low and none of the data D0 to D2 is selected, the electric charge of the fourth output node N4 is discharged via the n-type transistors Tr13 and Tr14, so that the potential of the fourth output node N4 becomes Low. On the other hand, when High data is selected from any of the selection signals S0 to S2 and the electric charge of the third output node N3 of the third dynamic circuit 1C is discharged, the n-type MOS transistor Tr13 is turned OFF, so that the precharged state of the fourth output node N4 is held.

The second dynamic circuit 1B of NAND type is provided with the n-type MOS transistor Tr6 which receives via its gate a signal of the fourth output node N4 of the fourth dynamic circuit 1D. The n-type transistor Tr6 is connected in series to the n-type transistor Tr5. When the n-type transistor Tr5 is ON and the n-type transistor Tr6 is OFF, the electric charge of the second output node N2 is not discharged, so that the precharged state thereof is held.

In this embodiment, in the second dynamic circuit 1B of NAND type, when none of the data D0 to D2 is selected and the n-type transistor Tr5 is ON, the n-type transistor Tr6 needs to be already OFF. To achieve this, the third and fourth dynamic circuits 1C and 1D which control the n-type transistor Tr6 have a structure which allows a higher-speed operation than that of the first dynamic circuit 1A. For example, the third dynamic circuit 1C has two stages of transistors connected in series on a pathway from the third output node N3 to the ground, while the first dynamic circuit 1A has three stages of transistors connected in series on a pathway from the first output node N1 to the ground. Therefore, the third dynamic circuit 1C has a higher operating speed than that of the first dynamic circuit 1A. In addition, the third and fourth dynamic circuits 1C and 1D are disposed nearer the second dynamic circuit 1B than the first dynamic circuit 1A. As a result, a delay time required for a change in the potentials of the third and fourth output nodes N3 and N4 of the third and fourth dynamic circuits 1C and 1D to be propagated to the n-type transistor Tr6 of the second dynamic circuit 1B is reduced to be shorter than a delay time required for a potential change of the first output node N1 of the first dynamic circuit 1A to be propagated to the n-type transistor Tr5 of the second dynamic circuit 1B.

Figure 2:
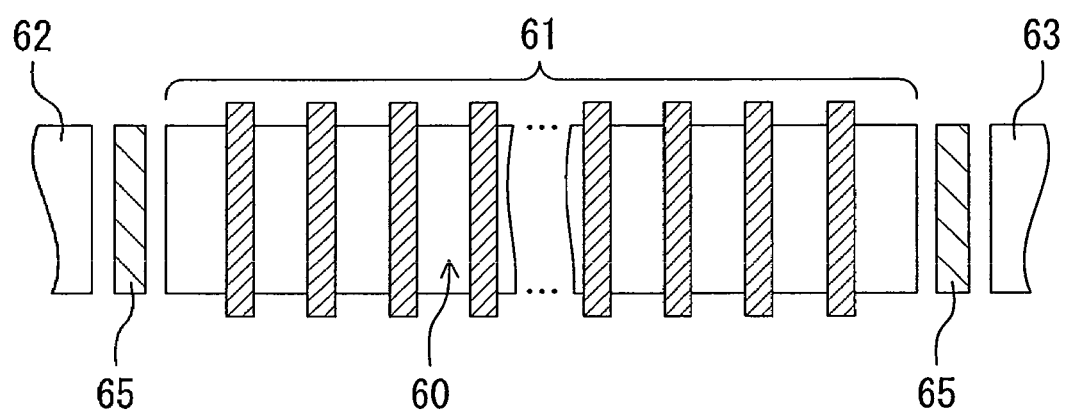
FIG. 2 is a diagram illustrating an outline of a layout structure of a major portion of the semiconductor integrated circuit.

Further, in order to cause the third and fourth dynamic circuits 1C and 1D to operate with higher speed than that of the first dynamic circuit 1A, a voltage supplied to the third and fourth dynamic circuits 1C and 1D may be set to be higher than that of the first dynamic circuit 1A; the threshold voltage of an MOS transistor included in the third and fourth dynamic circuits 1C and 1D may be set to be lower than the threshold voltage of an MOS transistor included in the first dynamic circuit 1A; or a size of the MOS transistor included in the third and fourth dynamic circuits 1C and 1D may be set to be larger than a size of the MOS transistor included in the first dynamic circuit 1A. Further, when an STI (Shallow Trench Isolation region) is formed on the semiconductor substrate, it is expected that the performance of the transistor is deteriorated due to an influence of the STI, and therefore, the arrangement or configuration may be adapted in consideration of the influence of the STI. For example, as shown in FIG. 2, when a transistor series 61 is formed on an N-type substrate 60, a plurality of transistors of the transistor series 61 which are positioned at an edge thereof, are used to constitute an n-type transistor of the first dynamic circuit 1A, while a plurality of transistors of the transistor series 61 which are positioned in an inside thereof, are used to constitute an n-type transistor in the third and fourth dynamic circuits 1C and 1D. With this structure, an isolation region (STI) 65 is provided between the transistor series 61 and other transistor series 62 and 63 on the N-type substrate 60. Therefore, a transistor located at the edge of the transistor series 61 is significantly deteriorated due to the influence of the STI. However, this transistor is the n-type transistor of the first dynamic circuit 1A for which a high operating speed is not required, and therefore, the deterioration has a less influence. On the other hand, the n-type transistors of the third and fourth dynamic circuits 1C and 10 for which a high operating speed is required, are comprised of transistors which are located inside the transistor series 61 so that they are not significantly influenced by the STI. Therefore, the high operating speed can be satisfactorily secured.

Although, in this embodiment, the third and fourth dynamic circuits 1C and 10 are constructed to have a higher operating speed than that of the first dynamic circuit 1A, the present invention is not limited to this, i.e., this structure is not necessarily adopted. For example, although the second clock CLK2 is input to the gate of the n-type transistor Tr7 of the second dynamic circuit 1B in the semiconductor integrated circuit of FIG. 1, an inverted signal of the third output node N3 of the third dynamic circuit 1C may be input instead of the second clock CLK2. In the case of this structure, when none of the data is selected (i.e., all of the selection signals S0 to S2 are Low) before rising of the fourth clock CLK4, the third output node N3 becomes High, so that the n-type transistor Tr7 is turned OFF. Thereafter, when the fourth clock CLK4 rises, the fourth output node N4 becomes Low, so that the n-type transistor Tr6 is turned OFF. Therefore, the third and fourth dynamic circuits 1C and 1D do not have to be constructed so that their operating speed is higher than that of the first dynamic circuit 1A.

Next, the output circuit 1E and the holding circuit 1F which are the remaining portion of the dynamic flip-flop circuit will be described. The output circuit 1E receives a signal of the first output node N1 of the first dynamic circuit 1A and a signal of the second output node N2 of the second dynamic circuit 1B, and comprises an inverter IN4, a NOR circuit NOR1, a first p-type MOS transistor Tr20, and three n-type MOS transistor Tr21, Tr22 and Tr23. The drain of the p-type MOS transistor Tr20 and the drain of the first the n-type transistor Tr21 are connected to each other to form a seventh output node N7. A signal of the second output node N2 of the second dynamic circuit 1B is input to the gate of the p-type MOS transistor Tr20. The NOR circuit NOR1 comprises two p-type transistors Tr24 and Tr25 and an n-type transistor Tr26, and receives a signal of the first output node N1 of the first dynamic circuit 1A and a signal obtained by inverting a signal of the second output node N2 of the second dynamic circuit 1B using the inverter IN4, and outputs a signal as a sixth output node N6 to the gate of first the n-type transistor Tr21.

Therefore, in the output circuit 1E, when the second output node N2 of the second dynamic circuit 1B is Low and the first output node N1 of the first dynamic circuit 1A is High, the p-type transistor Tr20 is turned ON and the n-type transistor Tr21 is turned OFF, so that the seventh output node N7 is precharged to the power source potential Vdd, i.e., the potential thereof becomes High. On the other hand, when the second output node N2 is High and the first output node N1 is Low, the p-type transistor Tr20 is turned OFF and the n-type transistor Tr21 is turned ON, so that the electric charge of the seventh output node N7 is discharged, i.e., the potential thereof becomes Low.

In the output circuit 1E, the gate of the second n-type transistor Tr22 receives a signal of the fourth output node N4 of the fourth dynamic circuit 1D, the source of the second n-type transistor Tr22 is grounded, and the drain of the second n-type transistor Tr22 is connected to the source of the n-type transistor Tr21. In the n-type transistor Tr22, when the potential of the seventh output node N7 is High, the output of the NOR circuit NOR1 (sixth output node N6) becomes High due to a reduction in the potential of the first output node N1 of the first dynamic circuit 1A. In this case, even if the n-type transistor Tr21 is turned ON, since the n-type transistor Tr22 is held in the OFF state, the potential of the seventh output node N7 is prevented from erroneously becoming Low and a through current is prevented.

Next, the holding circuit 1F will be described. The holding circuit 1F functions as a feedback buffer, and comprises a first inverter IN5 and a second inverter IN6. The seventh output node N7 of the holding circuit 1E is connected to the input side of the first inverter IN5. The inverter IN5 is connected to the input side of the second inverter IN6. The output side of the second inverter IN6 is connected to the seventh output node N7. Further, the holding circuit 1F comprises a second n-type MOS transistor Tr29 connected in series between a first p-type MOS transistor Tr27 and a first n-type MOS transistor Tr28 which constitute the second inverter IN6, and a delay cell 59. The inverters IN5 and IN6 each hold the potential of the seventh output node N7 of the holding circuit IE. The held potential is inverted by the inverter IN7 before being output through the output terminal Q. An output of the first inverter IN5 is delayed by a predetermined time in the delay cell 59 before being output through the output terminal SO.

In the holding circuit 1F, the gate of the n-type MOS transistor Tr29 receives a signal of the second output node N2 of the second dynamic circuit 1B, the drain of the n-type MOS transistor Tr29 is connected to the drain of the p-type transistor Tr27, and the source of the n-type MOS transistor Tr29 is connected to the drain of the n-type transistor Tr28. The n-type transistor Tr29 has the following function. Specifically, when the seventh output node N7 of the output circuit 1E is Low, the output node N7 is grounded via the n-type transistor Tr28 of the second inverter IN6. When the second output node N2 of the second dynamic circuit 1B starts going from High to Low, the p-type transistor Tr20 of the output circuit 1E is turned ON, so that the seventh output node N7 starts being precharged to the power source potential Vdd. In this case, the n-type transistor Tr29 is turned OFF by causing the second output node N2 to be Low, so that a pathway from the seventh output node N7 via the n-type transistor Tr28 to the ground is cut off, thereby promoting the precharge operation of the seventh output node N7.

Next, an operation of the semiconductor integrated circuit of Embodiment 1 will be described with reference to a timing chart illustrated in FIG. 4. For the sake of simplicity, it is assumed that first to fourth clocks CLK1 to CLK4 are the same clock CLK.

During a first period of the clock CLK, the data D0 is High in a data valid period (a time satisfying setup and hold times) before and after rising of the clock, and after the data valid period has passed, the data D0 becomes Low. The other data D1 and D2 are High. The selection signal S0 is Low during the data valid period and becomes High after the data valid period has passed. The other selection signals S1 and S2 are Low. Therefore, during the first period, none of the data D0 to D2 is selected.

In this state, during the data valid period, the first output node N1 of the first dynamic circuit 1A is High, and therefore, the n-type transistor Tr5 is turned ON in the second dynamic circuit 1B. As a result, in the conventional example of FIG. 3(a), when the second output node N2 is High, the second output node N2 erroneously goes to Low, so that the flip-flop circuit erroneously outputs an "L" signal instead of a true "H" signal.

However, in this embodiment, the third output node N3 of the third dynamic circuit 1C is High, and the fourth output node N4 of the fourth dynamic circuit 1D becomes Low after rising of the clock. Therefore, in the second dynamic circuit 1B, the n-type transistor Tr6 is turned OFF before the n-type transistor Tr5 is turned ON, so that the second output node N2 is prevented from erroneously becoming Low, i.e., the second output node N2 is held High. Therefore, in the output circuit 1E, the seventh output node N7 is held Low, so that the holding circuit 1F outputs the true "H" signal.

On the other hand, it is now assumed that the seventh output node N7 of the output circuit 1E is held High. For example, even if the selection signal S2 becomes High after rising of the clock CLK and the first output node N1 of the first dynamic circuit 1A becomes Low (not shown), the sixth output node N6 becomes High in the output circuit 1E, so that the n-type transistor Tr21 is turned ON. In this case, however, the n-type transistor Tr22 is turned OFF, so that the seventh output node N7 is not grounded, so that the seventh output node N7 is held High. This is because, in the OFF operation of the n-type transistor Tr22, even when the third output node N3 of the third dynamic circuit 1C becomes Low as the selection signal S2 goes to High, the fourth output node N4 of the fourth dynamic circuit 1D is held Low.

Figure 4:
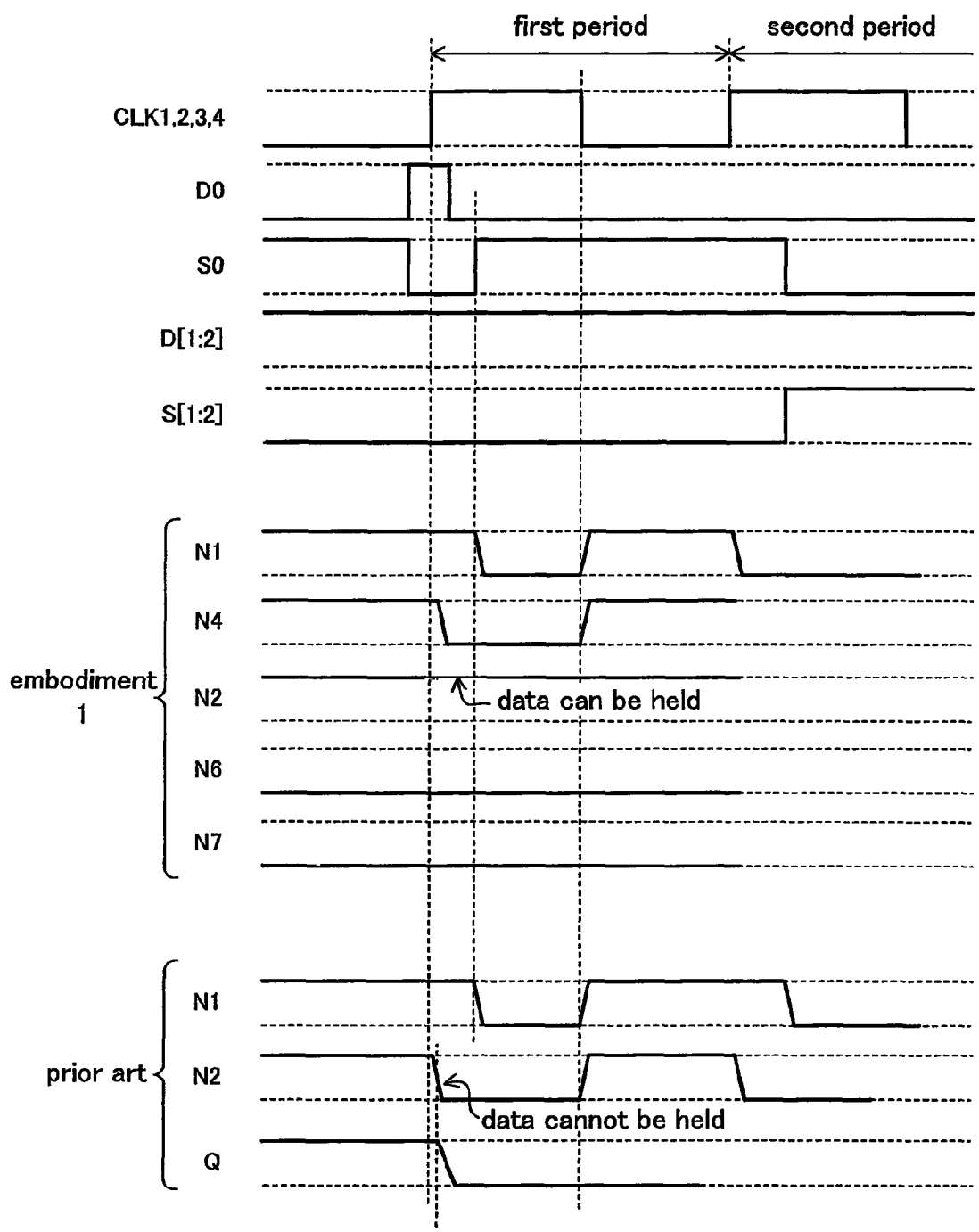
FIG. 4 is a diagram illustrating an operation timing chart of the semiconductor integrated circuit of Embodiment 1 of the present invention.

Note that FIG. 4 illustrates that the data D0 is Low, the data D1 and D2 are High, the selection signal S0 is High, and the other selection signals S1 and S2 are Low, i.e., the data D0 is selected, during the second period of the clock CLK.

In this embodiment, an OR circuit or a latch circuit is not provided before the clock as illustrated in FIG. 3(b), and therefore, it is not necessary to set up a selection signal, thereby making it possible to provide a dynamic flip-flop circuit capable of operating with high speed.

Although, in the above description about the operation, the first to fourth clocks CLK1 to CLK4 are the same clock which provides the same time, the clocks may have a difference in phase to some extent. In this case, it is preferable that the first clock CLK1 lead the second clock CLK2. Also, the third and fourth clocks CLK3 and CLK4 preferably lead the first and second clocks CLK1 and CLK2.

Figure 9:
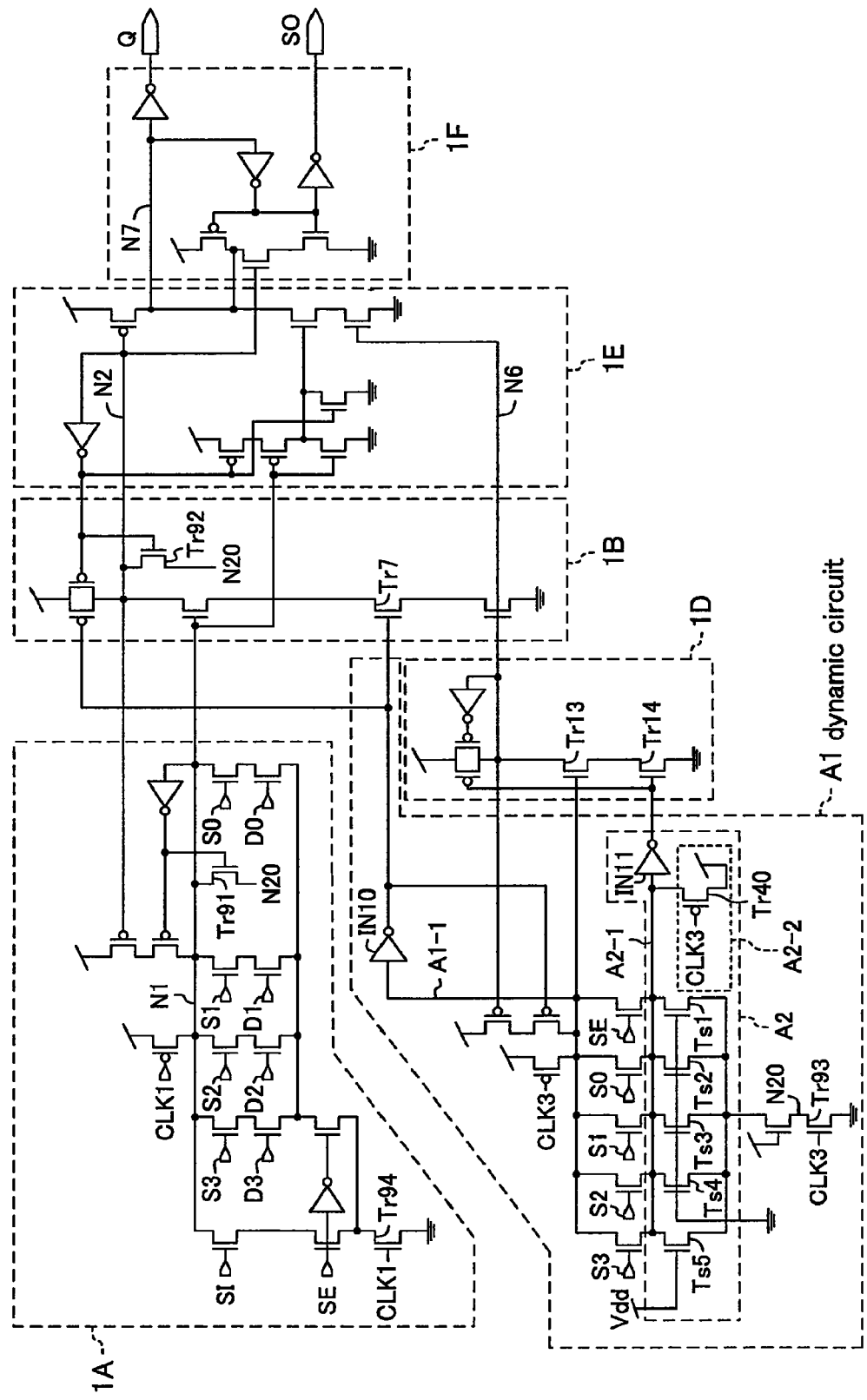
FIG. 9 is a diagram illustrating a variation of the semiconductor integrated circuit of FIG. 1.

Note that a delay value of the clock CLK2 to be input to the second dynamic circuit 1B may not be set to be a predetermined value, and the clock CLK2 may be generated based on the clock CLK3 of the third dynamic circuit 1C. A circuit structure of this case is illustrated in FIG. 9. In FIG. 9, a dynamic circuit A1 is additionally provided. The dynamic circuit A1 has a series circuit of the same number of stages of n-type MOS transistors as the number of stages of n-type MOS transistors connected in series in the first dynamic circuit 1A of FIG. 1. A plurality of the series circuits are connected in parallel to construct a parallel circuit portion, which is the same as that of the first dynamic circuit 1A, except for a structure of inputting a scan signal SE. An output A1-1 of the dynamic circuit A1 thus additionally provided is inverted in an inverter IN10, and is then input to the n-type transistor Tr7 of the second dynamic circuit 1B.

The dynamic circuit A1 additionally provided in FIG. 9 further includes a clock generation circuit A2 which generates a clock CLK4 which is input to the fourth dynamic circuit 1D, based on the clock CLK3 input from the third dynamic circuit 1C of FIG. 1. In the clock generation circuit A2, a junction capacitance portion of multi-input gates of data or the like is constructed to be apparently equivalent to the output point A1-1 of the dynamic circuit A1, and an output A2-1 is inverted in an inverter IN11 and is then input to the n-type transistor Tr14 of the fourth dynamic circuit 1D. The clock generation circuit A2 is further provided with a precharge circuit A2-2 comprised of a p-type MOS transistor Tr40. The precharge circuit A2-2 has a function of precharging the output point A2-1 of the clock generation circuit A2. A clock input to the gate of the p-type transistor Tr40 is the clock CLK3 which is input to the third dynamic circuit 1C. A delay difference during discharge between the output A1-1 of the dynamic circuit A1 and the output A2-1 of the clock generation circuit A2 depends on a current difference between n-type MOS transistors to which the selection signals S0 to S3 are input. By compensating for the delay difference using the inverter IN11, a reliable operation can be achieved.

Note that, in the circuit of FIG. 1, when any one of the selection signals S0 to S3 is output in addition to the selection signal SE, the output may become indeterminate if the dynamic circuit A1 is transitioned earlier than the dynamic circuit 1A. However, in FIG. 9, the gates of five NMOS transistors Ts1 to Ts4 which are connected in series to transistors to which the selection signals SE and S0 to S3 are input, respectively, are grounded so as not to be conductive. Therefore, since a current path through which the electric charge is discharged from the node A2-1 to the ground is a single path via an NMOS transistor Ts5 whose gate is fixed to the power source voltage Vdd, the dynamic circuit A1 is transitioned later than the dynamic circuit 1A. As a result, data which is output to the output terminal Q is an OR output of data selected from the data D0 to D3. This structure is effective since an expected value does not become indeterminate when a scan test is performed.

Figure 10:
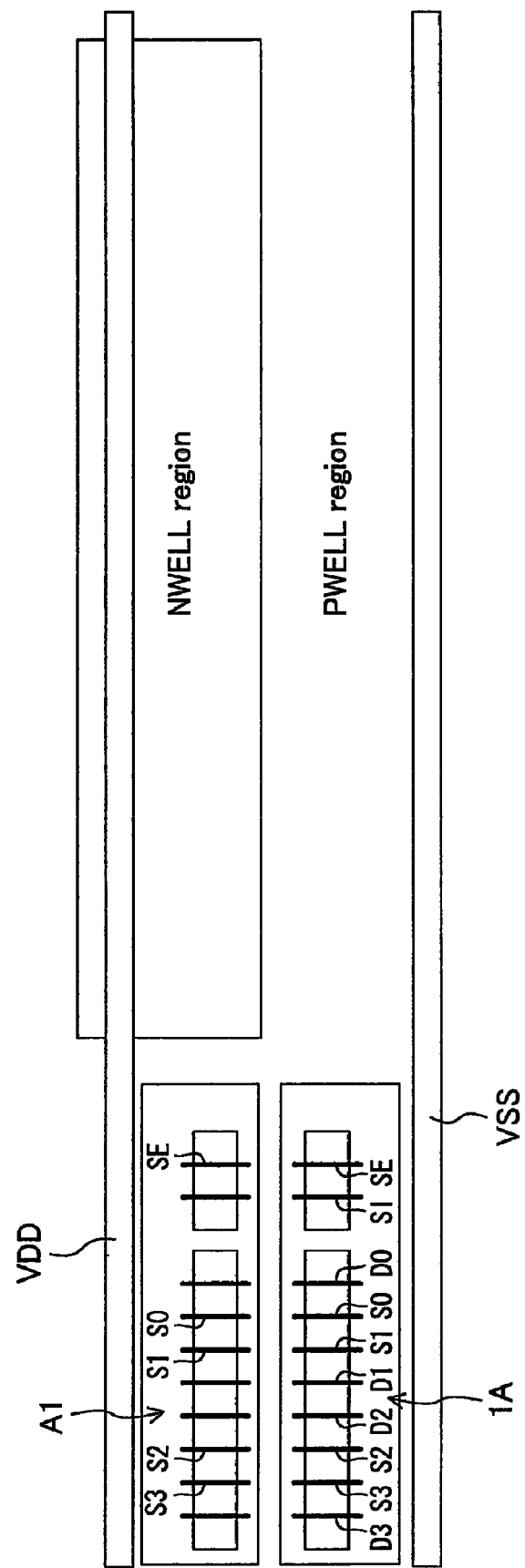
FIG. 10 is a diagram illustrating a layout structure of a major portion of the semiconductor integrated circuit of FIG. 9.

An exemplary layout structure of the semiconductor integrated circuit of FIG. 9 is illustrated in FIG. 10. In FIG. 10, a circuit portion of n-type transistors for receiving the selection signals S0 to S3 of the first dynamic circuit 1A and n-type transistors for receiving the data D0 to D3, and a circuit portion of n-type transistors for receiving the selection signals S0 to S3 of the dynamic circuit A1 of FIG. 9 are vertically arranged. As a result, the wiring capacitance of input pins is reduced. In addition, since both the circuit portions are close to each other, a variation component between the dynamic circuits 1A and A1 during the production process is reduced, and a voltage variation and a temperature variation are also advantageously reduced. Also, in an input circuit portion which is typically comprised of a plurality of n-type transistors and receives selection signals and data, when a layout having a different number of selection signals or pieces of data is produced, by preparing a layout having a maximum number of inputs, a layout having a smaller number of inputs can be obtained only by reducing the number of n-type MOS transistors on the left side of FIG. 10. Therefore, the number of steps for layout can be reduced.

Note that the transistor Tr91 of the dynamic circuit 1A has a function as a keeper to hold the electric charge of the node N1. In this case, it is desirable that the source of the transistor Tr91 is connected to the drain (node N20) of the transistor Tr93 of the dynamic circuit A1. Thereby, for example, the signal transition speed of the node N1 becomes higher than when the source of the transistor Tr91 is connected to the drain of the transistor Tr94 of the dynamic circuit 1A. This is because the drain capacitance of the transistor Tr93 of the dynamic circuit A1 does not have an influence on the node N1. The same is true of the transistor Tr92 of the dynamic circuit 1B.

In addition, when the number of pieces of data to be input is considerably large, the pieces of data may be divided into two groups. For example, in a semiconductor integrated circuit of FIG. 11, a group of the first to fourth dynamic circuits 1A to 1D and A1 of FIG. 9 and another group of first to fourth dynamic circuits 1A' to 1D' and A1' having the same structure as that of the former group are provided. When the number of pieces of data is 2N, data D1 to SN are input to one group, while data SDN+1 to D2N are input to the other group. The two groups are input in parallel to the gates of the n-type transistors Tr20 and Tr21 of the output circuit 1E of FIG. 1. Further, a selection signal matching detection circuit 1J which detects a match between the outputs A1-1 and A1-1' of the dynamic circuit A1 or a match between the outputs A2-1 and A2-1' of the clock generation circuit A2 is further provided. An output 1J-1 of the output circuit 1E of FIG. 1 is connected to the gate of the n-type transistor Tr22. With this structure, the capacitances of the first nodes N1 and N1' of the first dynamic circuits 1A and 1A' are half of a value which is obtained when only one group is provided, thereby making it possible to increase the operating speed.

Embodiment 2

Next, Embodiment 2 of the present invention will be described. In Embodiment 2, the output circuit 1E of FIG. 1 is modified as shown in FIG. 5.

Figure 5:
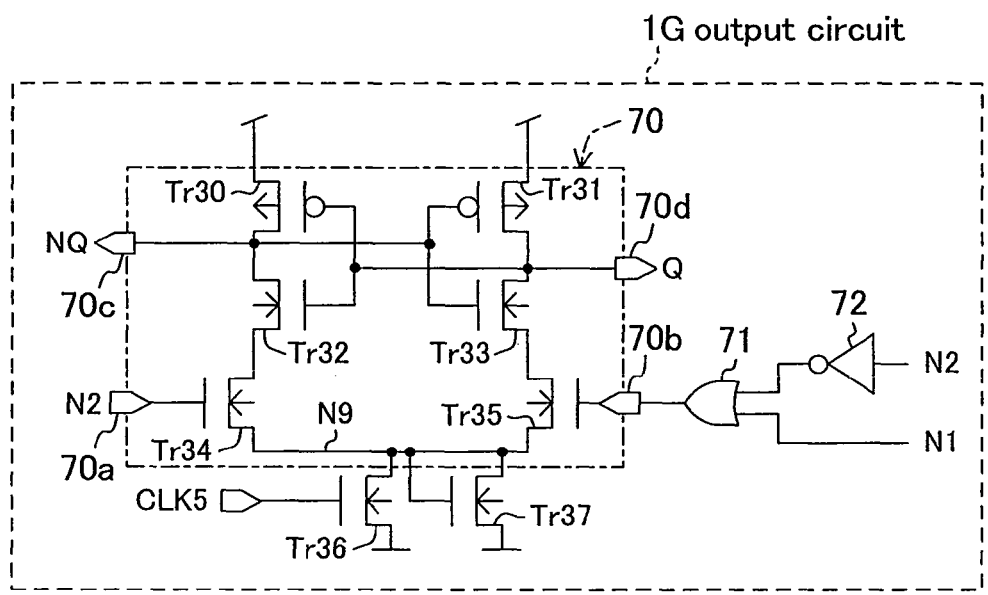
FIG. 5 is a diagram illustrating an internal structure of an output circuit included in a semiconductor integrated circuit according to Embodiment 2 of the present invention.

Specifically, an output circuit 1G of FIG. 5 is comprised of a differential circuit 70. More specifically, the differential circuit 70 has a pair of differential input terminals 70a and 70b, a pair of differential output terminals 70c and 70d, two p-type MOS transistors Tr30 and Tr31 and two n-type MOS transistors Tr32 and Tr33 which are cross-linked, and two n-type MOS transistors Tr34 and Tr35 for receiving a differential signal, to whose gates the pair of differential input terminals 70a and 70b are connected. The differential output terminals 70c and 70d are connected to a connection point of the p-type transistor Tr30 and the n-type transistor Tr32 and a connection point of the p-type transistor Tr31 and the n-type transistor Tr33, respectively. The differential output terminals 70d and 70c are the output terminal Q and its inverted output terminal NQ of the semiconductor integrated circuit of FIG. 1, respectively.

A signal of the second output node N2 of the second dynamic circuit 1B of FIG. 1 is input to the differential input terminal 70a. An OR circuit 71 is connected to the differential input terminal 70b. A signal obtained by inverting the signal of the second output node N2 of the second dynamic circuit 1B using an inverter 72, and a signal of the first output node N1 of the first dynamic circuit 1A are input to the OR circuit 71.

Further, a control transistor Tr36 including an n-type MOS transistor is connected to a ninth node N9 which is the source of the two n-type MOS transistors Tr34 and Tr35 for receiving the differential signal. The source of the control transistor Tr36 is grounded, the drain thereof is connected to the ninth node N9, and the gate thereof receives, as a control signal, a fifth clock signal CLK5 which is generated by a clock generation circuit 1H of FIG. 6.

Figure 6:
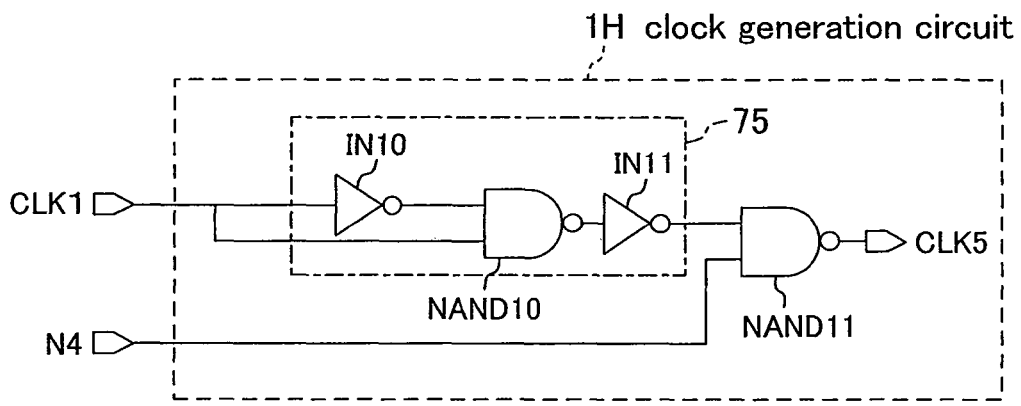
FIG. 6 is a diagram illustrating an internal structure of a circuit of generating a clock to be supplied to the output circuit.

An internal structure of the clock generation circuit 1H will be described. In FIG. 6, the clock generation circuit (signal generation circuit) 1H comprises a short pulse generation circuit 75 which generates a short pulse at the same cycle as that of the first clock CLK1, and a NAND circuit NAND11. The short pulse generation circuit 75 has an inverter IN10 which inverts a first clock CLK1, a NAND circuit NAND10 which receives outputs of the first clock CLK1 and the inverter IN10, and an inverter IN11 which inverts an output of the NAND circuit NAND10. The NAND circuit NAND11 receives an output of the inverter IN11 and a signal of the fourth output node N4 of the fourth dynamic circuit 1D of FIG. 1. An output of the NAND circuit NAND11 is a fifth clock CLK5. The clock CLK5 is input as a control signal to an n-type transistor Tr36 which is provided in the differential circuit 70 of FIG. 5 to receive a differential signal.

Figure 7:
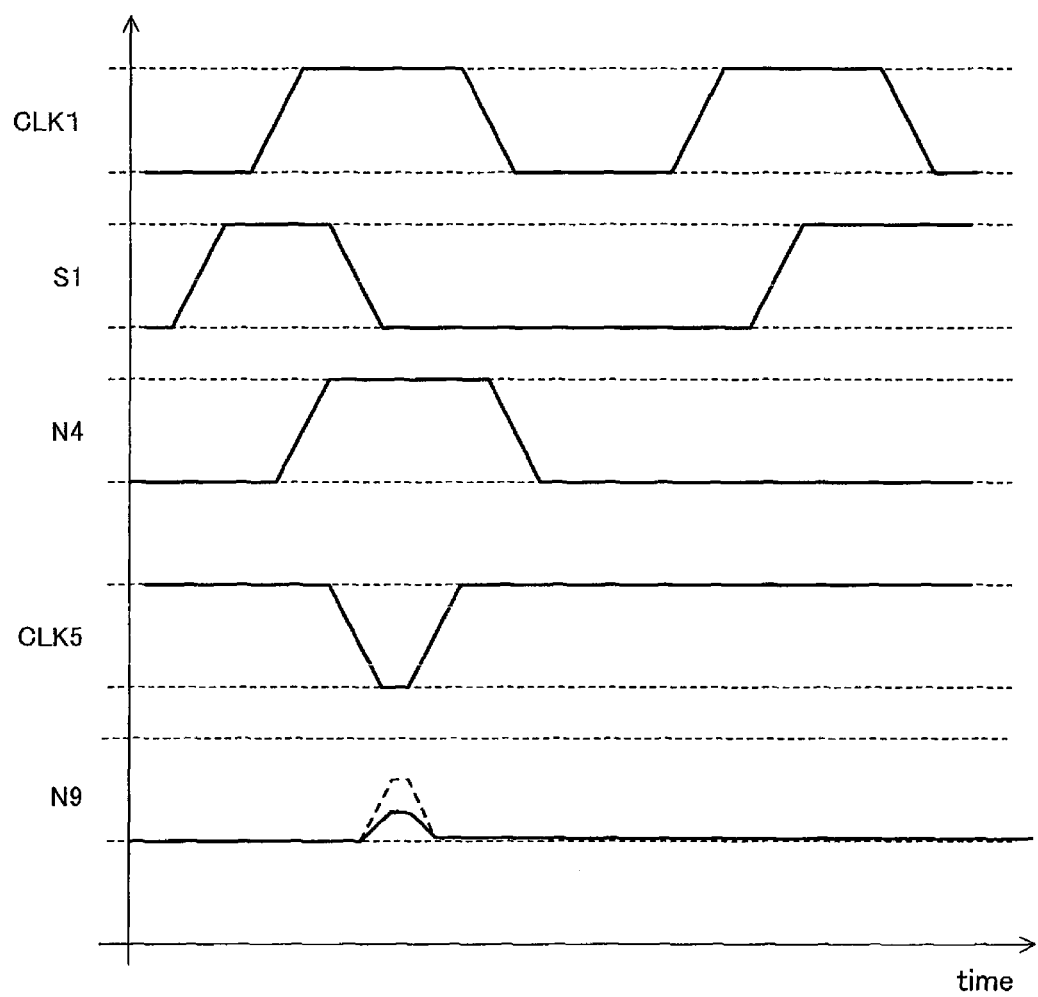
FIG. 7 is a diagram illustrating an operation timing chart of the output circuit and the clock generation circuit.

In the clock generation circuit 1H of FIG. 6, as illustrated in FIG. 7, for example, it is assumed that the selection signal S1 is High so that the data D1 is selected during the first period of the first clock CLK1. Since a signal of the fourth output node N4 of the fourth dynamic circuit 1D is High at the beginning of the first period, when a short pulse is subsequently generated by the short pulse generation circuit 75, the fifth clock CLK5 then goes from High to Low. Thereafter, when the short pulse is ended, the fifth clock CLK5 goes from Low to High. In this case, by turning ON the control transistor Tr36 partway through transition of the fifth clock CLK5 from Low to High, a differential input signal is amplified and output. In the other situations, the control transistor Tr36 is held OFF. Therefore, when the fifth clock CLK5 is High, the output circuit 70 functions as a latch which holds output data. With this structure, when the output circuit 1G of FIG. 5 is provided, the holding circuit 1F of FIG. 1 is not required after the output circuit 1G.

In FIG. 5, an n-type MOS transistor Tr37 is disposed in parallel with the control transistor Tr36 in the output circuit 1G. The source of the n-type transistor (resistance element) Tr37 is grounded, and the gate and drain thereof are connected to the ninth node N9 of the differential circuit 70. There is a possibility that the potential of the ninth node N9 is increased due to leakage current when the fifth clock CLK5 is Low. In fact, the n-type transistor Tr37 functions as a resistance element, thereby suppressing and preventing the increase of the potential to hold an optimum potential of the ninth node N9. As a result, the potential difference between the source and drain of the n-type transistors Tr34 and Tr35 for receiving a differential input is held to be an optimum which provides an appropriate gain, whereby a predetermined high-speed operation of the output circuit 1G is satisfactorily maintained.

In this embodiment, the differential circuit 70 rapidly amplifies and outputs a small potential difference between input differential signals, thereby operating with higher speed than when data is held by the output circuit 1E in Embodiment 1. Note that the differential circuit 70 may be replaced with a differential amplification circuit 28A of FIG. 28. In this case, the gates of P-type transistors 28L and 28M of the differential amplification circuit 28A are connected to a clock CLK5.

Embodiment 3

Figure 8:
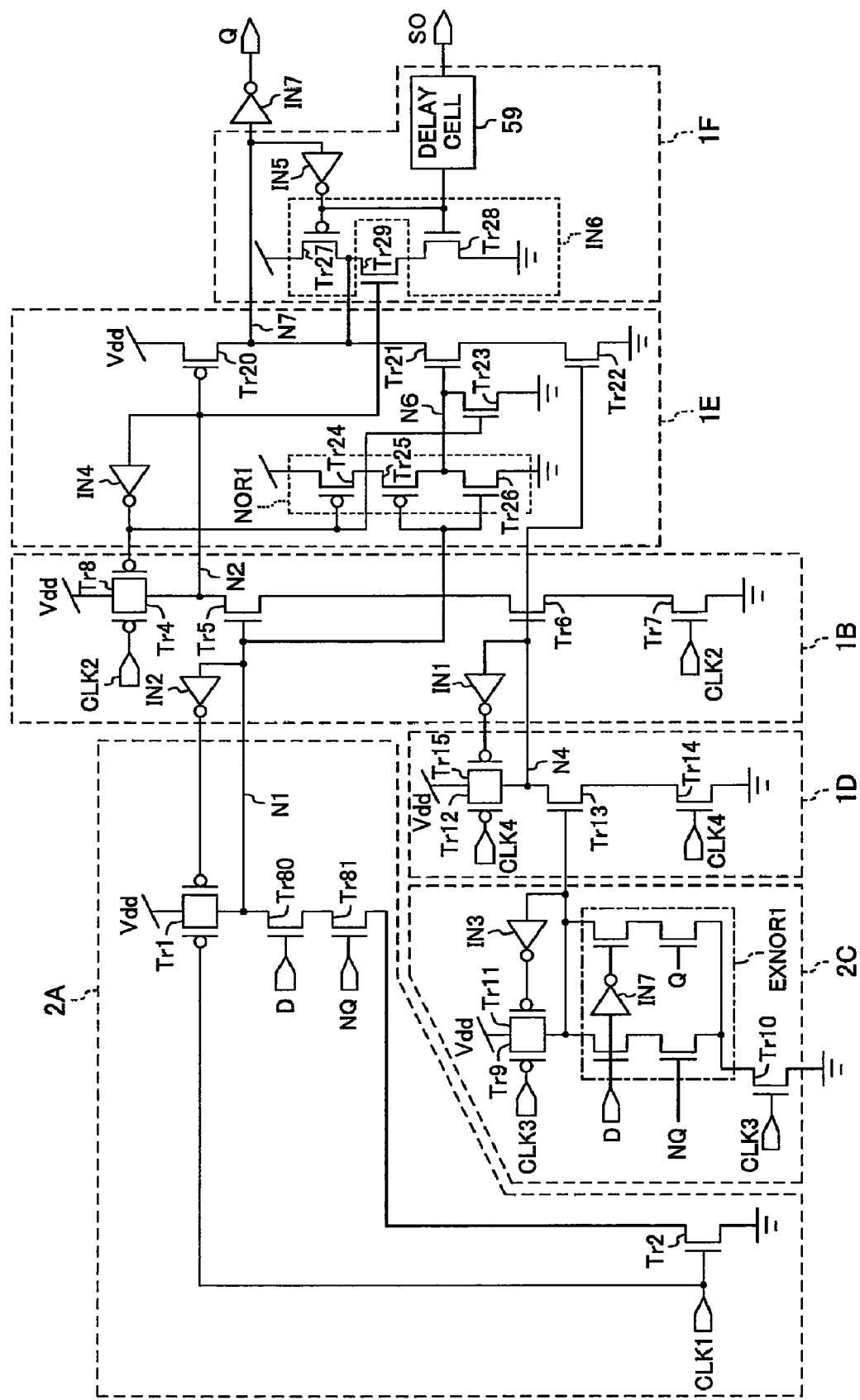
FIG. 8 is a diagram illustrating a structure of a semiconductor integrated circuit according to Embodiment 3 of the present invention.

FIG. 8 illustrates a semiconductor integrated circuit according to Embodiment 3 of the present invention.

The semiconductor integrated circuit of Embodiment 3 is different from the semiconductor integrated circuit of FIG. 1 in a first dynamic circuit 2A of NOR type and a third dynamic circuit 2C of NOR type, and both the circuits have the same second and fourth dynamic circuits 1B and 1D, output circuit 1E and holding circuit 1F.

In the first dynamic circuit 2A, the p-type transistor Tr1 and the n-type transistor Tr2 are connected in series. To this series circuit, an n-type MOS transistor Tr80 which receives data D through the gate thereof, and another n-type MOS transistor Tr81 which receives an inverted signal NQ of the output signal Q through the gate thereof are connected in series. Therefore, in the first dynamic circuit 2A, the potential of the first output node N1 is basically determined, depending on the value of the data D. When the data D is output through the output terminal Q, the inverted output NQ of the data D is used to handle a change in the next data D.

The third dynamic circuit (matching detection circuit) 2C includes an EXNOR circuit EXNOR1. The EXNOR circuit receives the data D, the output signal Q, and inverted signals ND and NQ thereof. After rising of the third clock CLK3, only when there is a match between the data D and the output signal Q, the third output node N3 is set to be the power source potential Vdd. Therefore, in the fourth dynamic circuit 2D, when there is a match between the data D and the output signal Q, the n-type transistor Tr13 is turned ON, so that the electric charge of the fourth output node N4 is discharged. As a result, the n-type transistor Tr6 is turned OFF in the second dynamic circuit 2B.

With the structure, in the dynamic NAND circuit 2D, when the value of the data D is the same as that of the output signal Q, the output node N4 goes to Low, so that the n-type transistor Tr6 of the second dynamic circuit 2B is forcedly turned OFF. Therefore, subsequently, it is possible to stop operations of the following second dynamic circuit 2B, output circuit 1E and holding circuit 1F. Therefore, unnecessary operations of the circuits 2B, 1E and 1F are prevented, thereby making it possible to reduce the power of the semiconductor integrated circuit.

Note that the physical arrangement of the dynamic circuits, the size and threshold voltage characteristics of each transistor, voltages supplied to the circuits, and the like in Embodiment 3 can be similar to those in Embodiment 1. Further, the output circuit 1E can be replaced with the differential output circuit 1G of Embodiment 2. In this case, a still higher speed can be achieved.

Although this embodiment illustrates an exemplary flip-flop, a latch circuit may be implemented by, for example, causing the potential of the node N2 to be an output signal. In this case, the holding circuit 1F does not have to output a signal or does not have to be provided.

Embodiment 4

Figure 12:
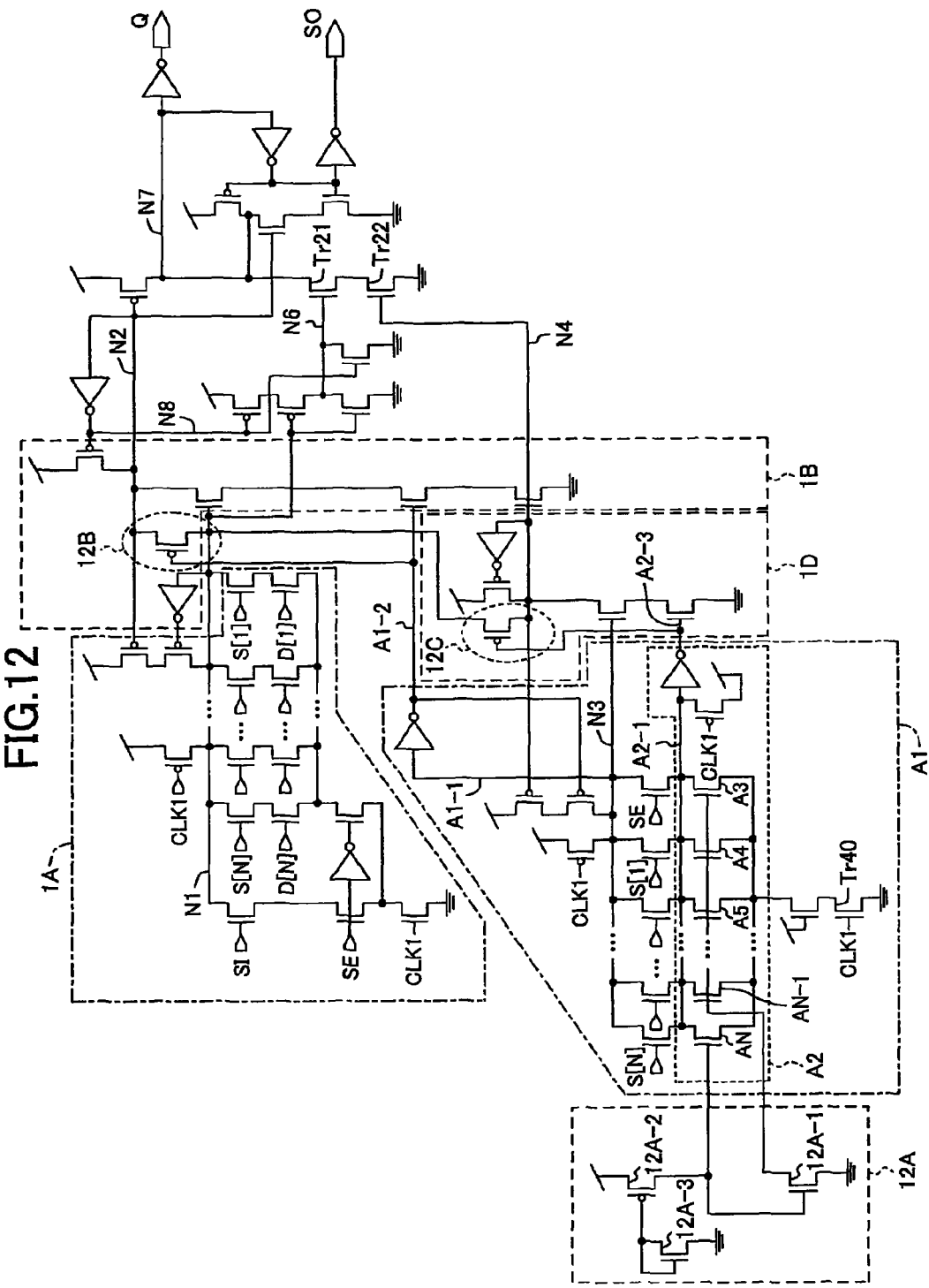
FIG. 12 is a diagram illustrating a structure of a semiconductor integrated circuit according to Embodiment 4 of the present invention.

FIG. 12 is a circuit diagram illustrating another multi-input flip-flop according to the present invention. The multi-input flip-flop of FIG. 12 is different from those of FIGS. 1 and 9 in that the flip-flop of FIG. 12 is operated with a single clock signal CLK1, and further, in that the flip-flop of FIG. 12 comprises a p-type MOS transistor 12B and a p-type MOS transistor 12C.

In FIGS. 1 and 9, p-type MOS transistors (transistors Tr4, Tr12 in FIG. 1) are provided whose sources are connected to a power source and which are used to charge the nodes N2 and N4. In the circuit of FIG. 12, a p-type MOS transistor 12B is provided whose source and drain are connected to nodes N1 and N2, respectively, and a p-type MOS transistor 12C is provided whose source and drain are connected to nodes N1 and N4, respectively. The gate of the p-type MOS transistor 12B is connected to a node A1-2. The gate of the p-type MOS transistor 12C is connected to a node A2-3. This circuit employs only one clock signal, thereby making it possible to reduce power consumption, and avoid an erroneous operation despite use of only one clock signal.

Figure 13:
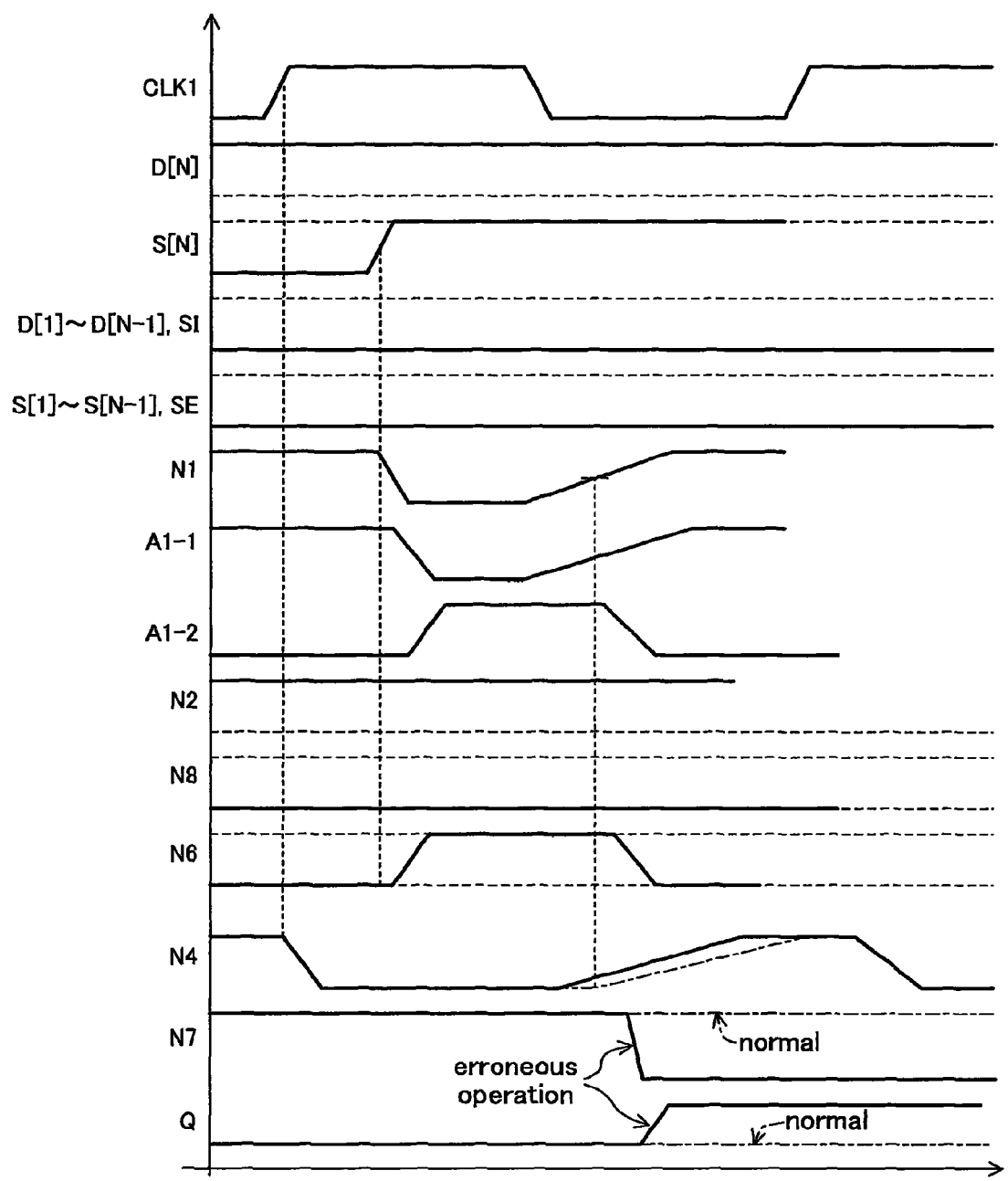
FIG. 13 is a timing chart of each node with respect to a signal input pattern in the semiconductor integrated circuit of Embodiment 4.
Figure 14:
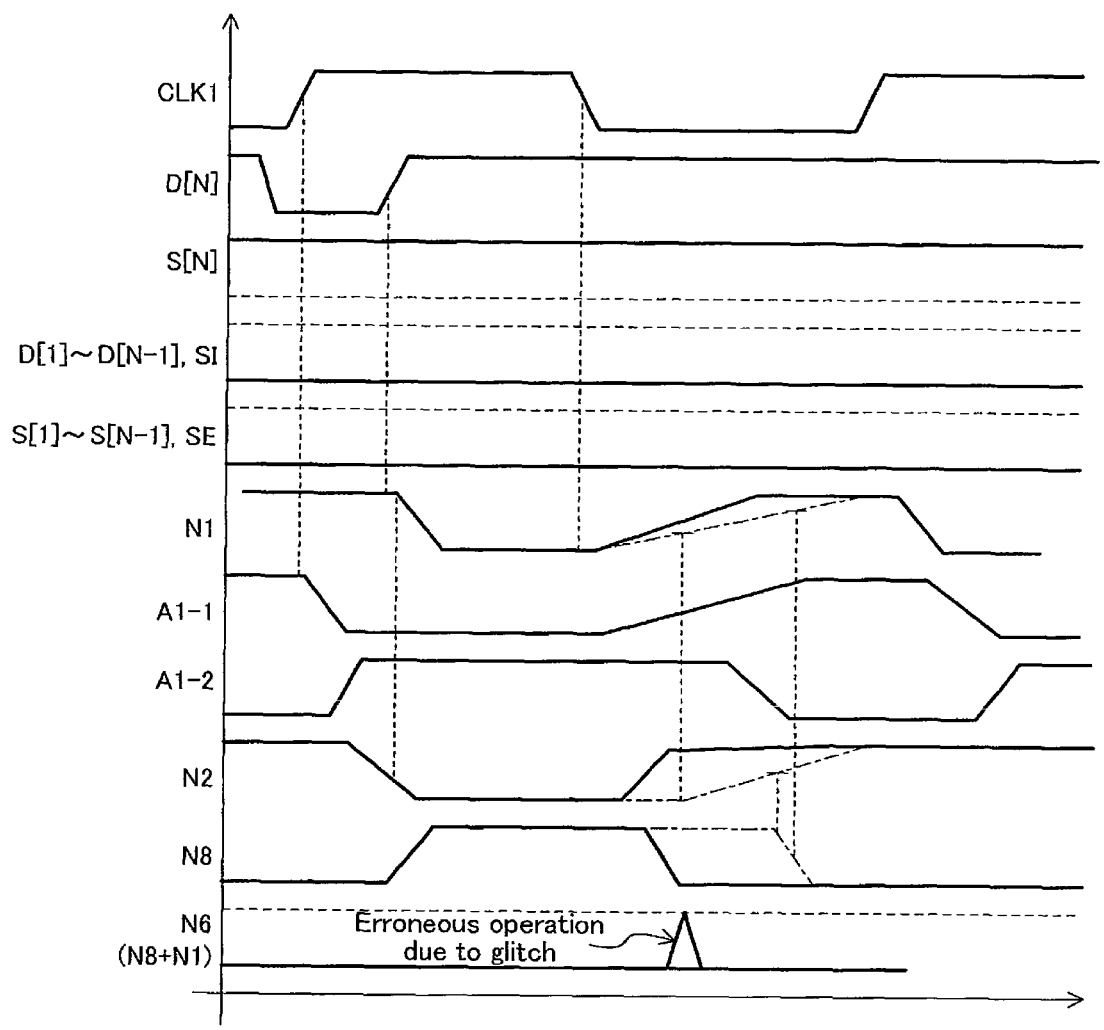
FIG. 14 is a timing chart of each node with respect to another signal input pattern in the semiconductor integrated circuit of Embodiment 4.

FIGS. 13 and 14 illustrate a relationship between voltage and time of each node where, in the circuit of FIG. 12, a signal input pattern differs between terminals SI, D[1] to D[N−1] and a terminal D[N] or between terminals SE, S[1] to S[N−1] and a terminal S[N]. In addition, FIGS. 13 and 14 illustrate waveforms occurring in the circuits of FIGS. 1 and 9 when the transistor balance is poor and the circuit is driven with a single clock signal, resulting in an erroneous operation. Dash dot lines indicate waveforms when the circuit of FIG. 12 is used, and solid lines indicate waveforms when the circuits of FIGS. 1 and 9 are used.

A description will be provided in comparison with FIG. 12. In FIG. 13, all input signals of the terminals D[1] to D[N−1], SI, S[1] to S[N], and SE satisfy desired setup and hold times at the timing of transition of the clock signal CLK1 to High and are Low. Only the terminal D[N] satisfies desired setup and hold times and is High. Thereafter, during a period when the clock signal CLK1 is High, only the terminal S[N] goes from Low to High. As a result, nodes A1-1 and N1 go to Low, and a node N6 goes to High. When the p-type MOS transistor 12C has a structure similar to that of FIGS. 1 and 9, a power source voltage Vdd is supplied via the p-type MOS transistor 12C to the node N4 during subsequent transition of the clock signal CLK1 from High to Low, so that the node N4 goes to High. As a result, the High periods of the node N4 and the node N6 may overlap. When the High periods of the node N4 and the node N6 overlap, both transistors Tr21 and Tr22 are caused to be conductive, so that electric charge is discharged from a node N7. In this case, although the node N7 is normally supposed to be held High, the node N7 may conversely go to Low, so that an output terminal Q operates erroneously. This is particularly because measures are not particularly taken in a circuit which controls charge of the node N4 and charge of the node N1, so that the node N4 is charged earlier than the node N1, depending on variations in p-type MOS transistor devices which charge the nodes N4 and N1, leading to an erroneous operation.

In the circuit of FIG. 12, however, current-voltage characteristics of a voltage difference between the drain and source of the p-type MOS transistor 12C exhibit linearity up to near a voltage threshold voltage Vtp. Since a substrate voltage of the p-type MOS transistor 12C is higher than a source voltage thereof, the p-type MOS transistor 12C behaves as if it were a considerably high resistance element. Therefore, it is likely that the node N1 is charged before the node N4 is charged. In this case, the timing of transition of the node N4 to High is delayed, so that the possibility that the nodes N4 and N6 simultaneously go to High is reduced.

A further description will be provided in comparison with FIG. 12. In FIG. 14, at the timing of transition of the clock signal CLK1 to High, the terminal S[N] satisfies desired setup and hold times and is High, while input signals of the terminals S[1] to S[N−1], SE, D[1] to D[N], and SI satisfy desired setup and hold times and are Low. Thereafter, during a period when the clock signal CLK1 is High, only the terminal D[N] goes from Low to High. Therefore, the node N1 goes from High to Low. When the p-type MOS transistor 12B has a structure similar to that of FIGS. 1 and 9, the nodes N1 and N2 are charged during subsequent transition of the clock signal CLK1 from High to Low. In this case, if the node N1 is charged later than the node N2, the node N2 goes to High while the node N1 goes to Low, so that the node N6 goes to High, resulting in a glitch in the node N7. If the glitch is propagated to the output terminal Q, an erroneous operation may occur.

In the circuit of FIG. 12, however, current-voltage characteristics of a voltage difference between the drain and source of the p-type MOS transistor 12B exhibit linearity up to near a voltage threshold voltage Vtp. Since a substrate voltage of the p-type MOS transistor 12B is higher than a source voltage thereof, the p-type MOS transistor 12B behaves as if it were a considerably high resistor. Therefore, the node N2 goes to High only after the node N1 goes to High. Therefore, the node N6 does not go to High, thereby preventing an erroneous operation.

As described above, when the source and drain of the p-type MOS transistor 12B are connected to the nodes N1 and N2, respectively, and the source and drain of the p-type MOS transistor 12C are connected to the nodes N1 and N4, respectively, the charging order of the nodes N1 and N2 and the charging order of the nodes N1 and N4 are uniquely determined without depending on manufacturing variations in device size of the p-type MOS transistor, thereby making it possible to obtain a more robust circuit structure.

The circuit of FIG. 12 is further characterized in that, in a dynamic circuit A1, the gates of MOS transistors AN and A3 to AN-1, which are connected directly to the power source and the ground in FIG. 9, are connected to two outputs of a circuit 12A.

In the circuit 12A, an n-type MOS transistor 12A-1, a p-type MOS transistor 12A-2, and another n-type MOS transistor 12A-3 are provided. The drain of the p-type MOS transistor (potential setting transistor) 12A-2 is connected to the gate of an n-type transistor AN of a second group of n-type transistors A3 to AN to set the gate potential of the n-type transistor AN to have a power source potential. Also, the source of the n-type MOS transistor 12A-3 is grounded, and the gate and drain thereof are connected to the gate of the potential setting transistor 12A-2.

In a miniaturization process, a thickness of a gate oxide film becomes thin, so that the ESD robustness of the gate is reduced. Therefore, in the circuit of FIG. 9, when an overvoltage is applied to the power source or the ground, the low impedance is highly likely to cause punchthrough in the gate electrode, likely leading to destruction of the MOS transistor. However, by providing the circuit 12A as illustrated in FIG. 12, the gate of the MOS transistor is connected via a resistance between the source and the drain to the power source and the ground. Therefore, there is a high impedance between the gate and the power source or the ground, whereby the MOS transistor is unlikely to be destroyed.

It is also preferable that the circuit 12A be provided as a part of the multi-input flip-flop in the same standard cell in which the output of the circuit 12A is input to the gates of the second group of n-type transistors A3 to AN which in turn operate. This is because such a multi-input flip-flop has a number of input terminals, so that wiring between standard cells is complicated. Unless the circuit 12A is provided in the cell, a cell, such as the circuit 12A, needs to be provided elsewhere, and the cell and the multi-input flip-flop need to be connected via wiring, so that the degree of Wiring congestion between standard cells is increased. Wiring between standard cells is typically automatically installed. Therefore, wiring may be accidentally arranged such that an output of the circuit 12A is influenced with a crosstalk. When the output of the circuit 12A is contaminated with crosstalk noise, the flip-flop circuit having a multi-input selection function may perform an erroneous operation. Therefore, in consideration of an influence of the crosstalk, it is preferable that the circuit 12A be provided in the standard cell as long as it is permitted.

In the circuit 12A, the drain of a p-type MOS transistor 12A-2 is assumed to be a node which is connected to the gate of an n-type MOS transistor 12A-1 for the purpose of reduction of the number of devices. Alternatively, similar to the structure of the MOS transistors 12A-2 and 12A-3, another p-type MOS transistor is provided, and the drain and gate of the p-type MOS transistor are connected in common to the gate of the n-type MOS transistor 12A-1.

When the circuit 12A is provided further below the right and left n-type MOS transistors in a lower portion of FIG. 10, the circuit 12A can be connected to the following stage without long wiring of a circuit A1 and the node N1 of FIG. 12. If the circuit of FIG. 12 is a standard cell, NWELL and PWELL are provided at a lower end thereof again. Therefore, cells can be arranged without considering a distance constraint of an interface between different wells at an interface between lower cells.

Embodiment 5

Figure 15:
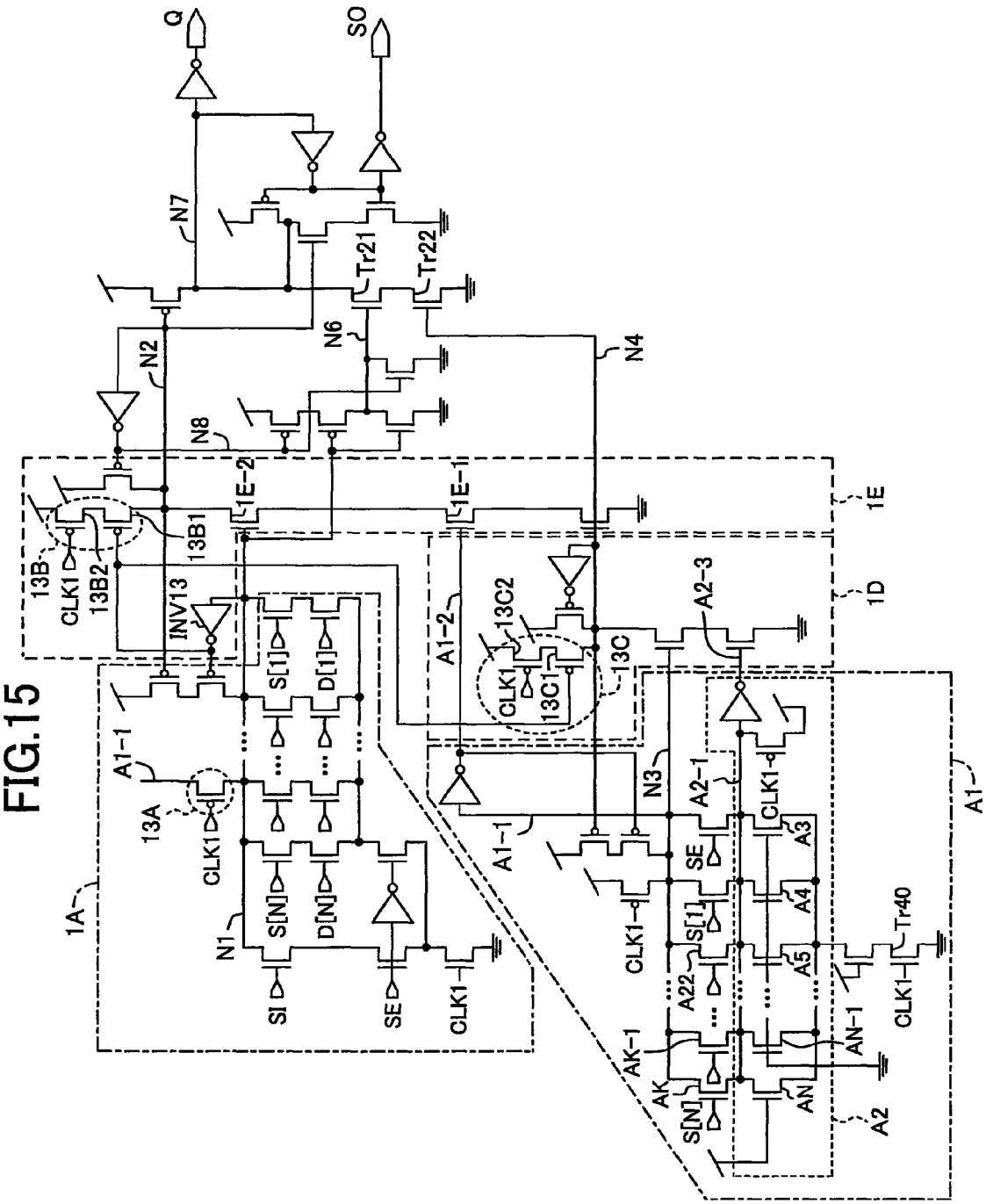
FIG. 15 is a diagram illustrating a structure of a semiconductor integrated circuit according to Embodiment 5 of the present invention.

FIG. 15 is a circuit diagram illustrating another multi-input flip-flop according to the present invention.

The multi-input flip-flop of FIG. 15 is different from those of FIGS. 1 and 9 in the flip-flop of FIG. 15 is operated with a single clock signal CLK1, and further, in a circuit portions 13B of the first dynamic circuit 1E, a circuit portion 13C of the dynamic circuit 1D, and a circuit portion 13A of the dynamic circuit 1A. In FIG. 1, p-type MOS transistors (transistors Tr4, Tr12 in FIG. 1) are provided whose sources are connected to a power source and which are used to charge the dynamic node portions N2 and N4. In the circuit of FIG. 15, further, other p-type MOS transistors (p-type MOS transistor 13B1, p-type MOS transistor 13C1) are connected to the drain of a p-type MOS transistor for charging, and are connected via the source and drain to nodes N2 and N4, respectively. The gate of the p-type MOS transistor 13B1 and the gate of the p-type MOS transistor 13C1 are connected to an output of an inverter circuit INV13 of the node N1. Further, although the source of the p-type MOS transistor 13A is connected to the power source in FIG. 11, it is connected to a node A1-1 of FIG. 15. Thus, this circuit employs only one clock signal, thereby making it possible to reduce power consumption and avoid an erroneous operation despite use of only one clock signal.

Also, in FIG. 15, an n-type transistor (first n-type transistor) Tr40 is provided in the third dynamic circuit A1. A clock signal CLK1 is input to the gate of the n-type transistor Tr40, and the sources of the n-type transistors (the second group of n-type transistors) A3 to AN are connected in common to the drain thereof. Further, the common source of a plurality of n-type transistors (third group of n-type transistors) A20 to AK is connected to the common drain of the second group of n-type transistors A3 to AN. On the second group of n-type transistors A3 to AN, a predetermined power source is connected to the gate of the n-type transistor AN so that the gate potential is set to be a power source potential. Also, the gates of the other n-type transistors A3 to A5 are all grounded so that the gate potentials are set to be a ground potential. The selection signals S[1] to S[N] are input to the gates of the third group of n-type transistors A20 to AK, respectively, and a third output node N3 is connected in common to the drains of the third group of n-type transistors A20 to AK.

An inverted node A1-2 of the third output node N3 (=A1-1) of the third dynamic circuit A1 is connected to the second dynamic circuit 1E. An inverted node A2-2 of the node A2-1 of the common drain of the second group of n-type transistors A3 to AN as well as the third output node N3 are connected to the fourth dynamic circuit 1D.

Figure 16:
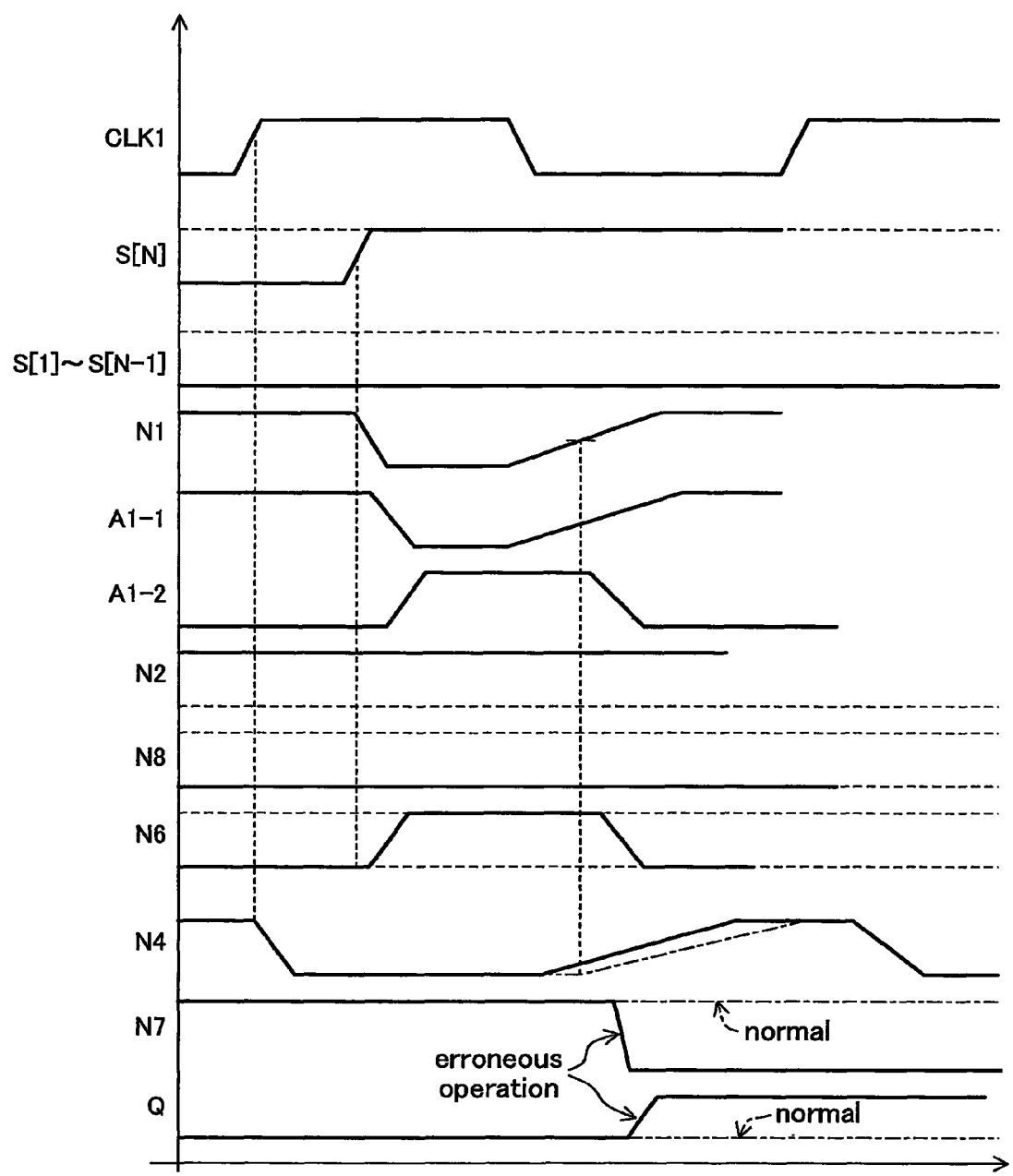
FIG. 16 is a timing chart of each node with respect to a signal input pattern in the semiconductor integrated circuit of Embodiment 5.
Figure 17:
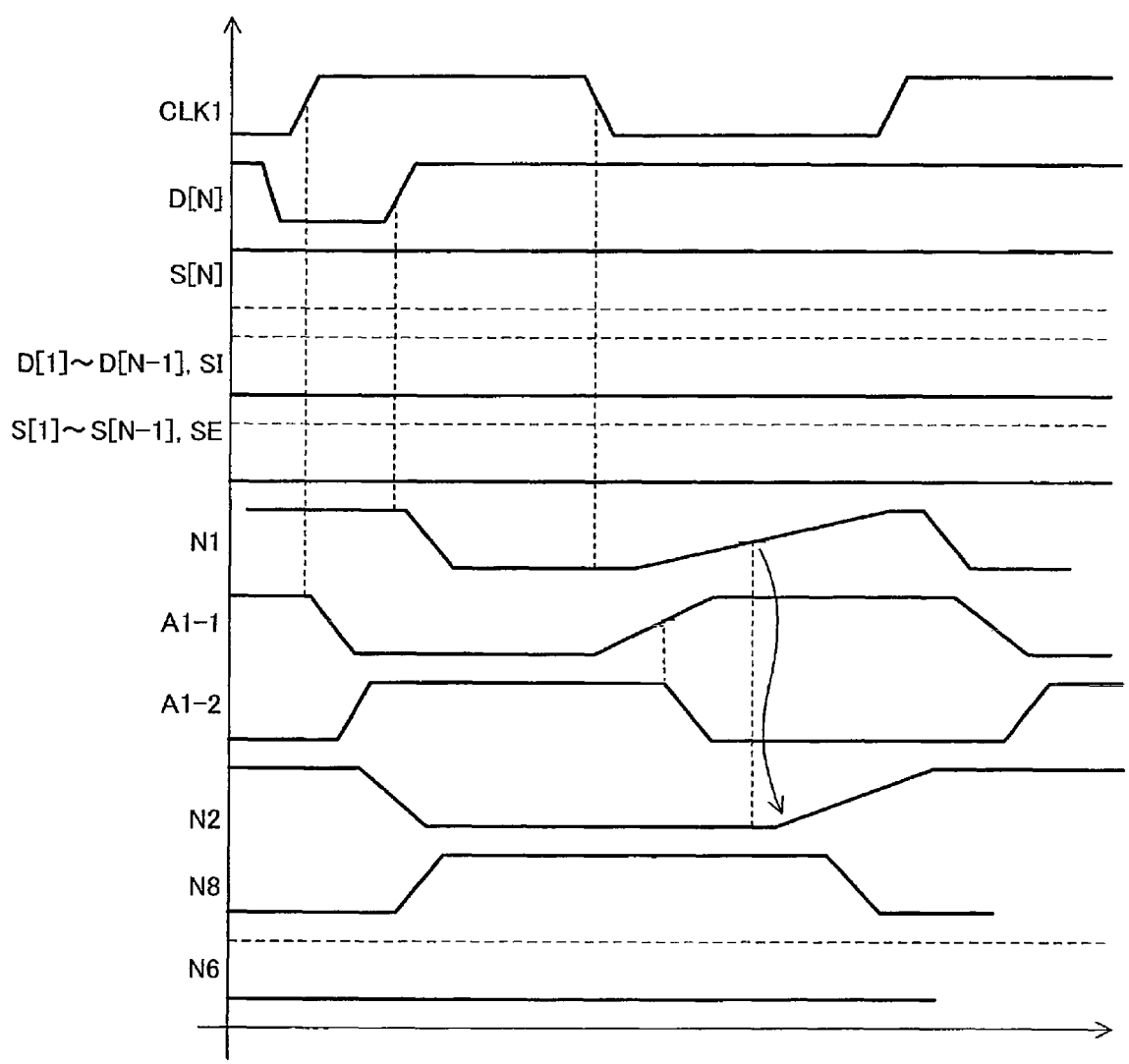
FIG. 17 is a timing chart of each node with respect to another signal input pattern in the semiconductor integrated circuit of Embodiment 5.

FIGS. 16 and 17 illustrate a relationship between voltage and time of each node where, in the circuit of FIG. 15, a signal input pattern differs between terminals D[1] to D[N−1] and a terminal D[N] and between terminals S[1] to S[N−1] and a terminal S[N]. In addition, FIGS. 16 and 17 illustrate waveforms occurring in the circuits of FIG. 9 when the transistor balance is poor and the circuit is driven with a single clock signal, resulting in an erroneous operation. Dash dot lines indicate waveforms when the circuit of FIG. 15 is used, and solid lines indicate waveforms when the circuit of FIG. 9 is used.

A description will be provided in comparison with FIG. 15. In FIG. 16, all input signals of the terminals S[1] to S[N] satisfy desired setup and hold times at the timing of transition of the clock signal CLK1 to High and are Low. Thereafter, during a period when the clock signal CLK1 is High, only the terminal S[N] goes from Low to High. As a result, nodes A1-1 and N1 go to Low, and a node N6 goes to High. When the circuit 13C has a structure similar to that of FIGS. 1 and 9, a power source voltage Vdd is supplied via two p-type MOS transistors 13C1 and 13C2 to the node N4 during subsequent transition of the clock signal CLK1 from High to Low, so that the node N4 goes to High. As a result, the High periods of the node N4 and the node N6 may overlap. When the High periods of the node N4 and the node N6 overlap, both transistors Tr21 and Tr22 are made conductive, so that electric charge is discharged from a node N7. In this case, although the node N7 is normally supposed to be held High, the node N7 may conversely go to Low, so that an output terminal Q operates erroneously. This is because measures are not particularly taken in a circuit which controls charge of the node N4 and charge of the node N1, so that the node N4 is charged earlier than the node N1, depending on variations in p-type MOS transistor devices which charge the nodes N4 and N1, leading to an erroneous operation.

In the circuit of FIG. 15, however, the circuit 13C is not turned ON unless a potential of an output of the inverter circuit INV13 of the node N1 is smaller than or equal to a difference between a threshold voltage of a p-type MOS transistor in the circuit 13C and a power source voltage Vdd. Therefore, it is likely that the node N1 is charged earlier and the node N4 is charged later. Therefore, the possibility that the nodes N4 and N6 are simultaneously High is reduced.

A further description will be provided in comparison with FIG. 15. In FIG. 17, at the timing of transition of the clock signal CLK1 to High, the terminal S[N] satisfies desired setup and hold times and is High, while input signals of the terminals S[1] to S[N−1], SE, D[1] to D[N], and SI satisfy desired setup and hold times and are Low. Thereafter, during a period when the clock signal CLK1 is High, only the terminal D[N] goes from Low to High. Therefore, the node N1 goes from High to Low. Thereafter, in the circuit of FIG. 1, the nodes N1 and N2 are charged during subsequent transition of the clock signal CLK1 from High to Low. In this case, if the node N1 is charged later than the node N2, the node N2 goes to High while the node N1 goes to Low, so that the node N6 goes to High, resulting in a glitch in the node N7. If the glitch is propagated to the output terminal Q, an erroneous operation may occur.

In the circuit of FIG. 15, however, the node N2 is not charged unless a potential of an output of the inverter circuit INV13 of the node N1 is smaller than or equal to a difference between a threshold voltage of a p-type MOS transistor 13B1 in the circuit 13B and the power source voltage Vdd. Therefore, the node N2 goes to High only after the node N1 goes to High. Therefore, the node N6 does not go to High, thereby preventing an erroneous operation.

Figure 18:
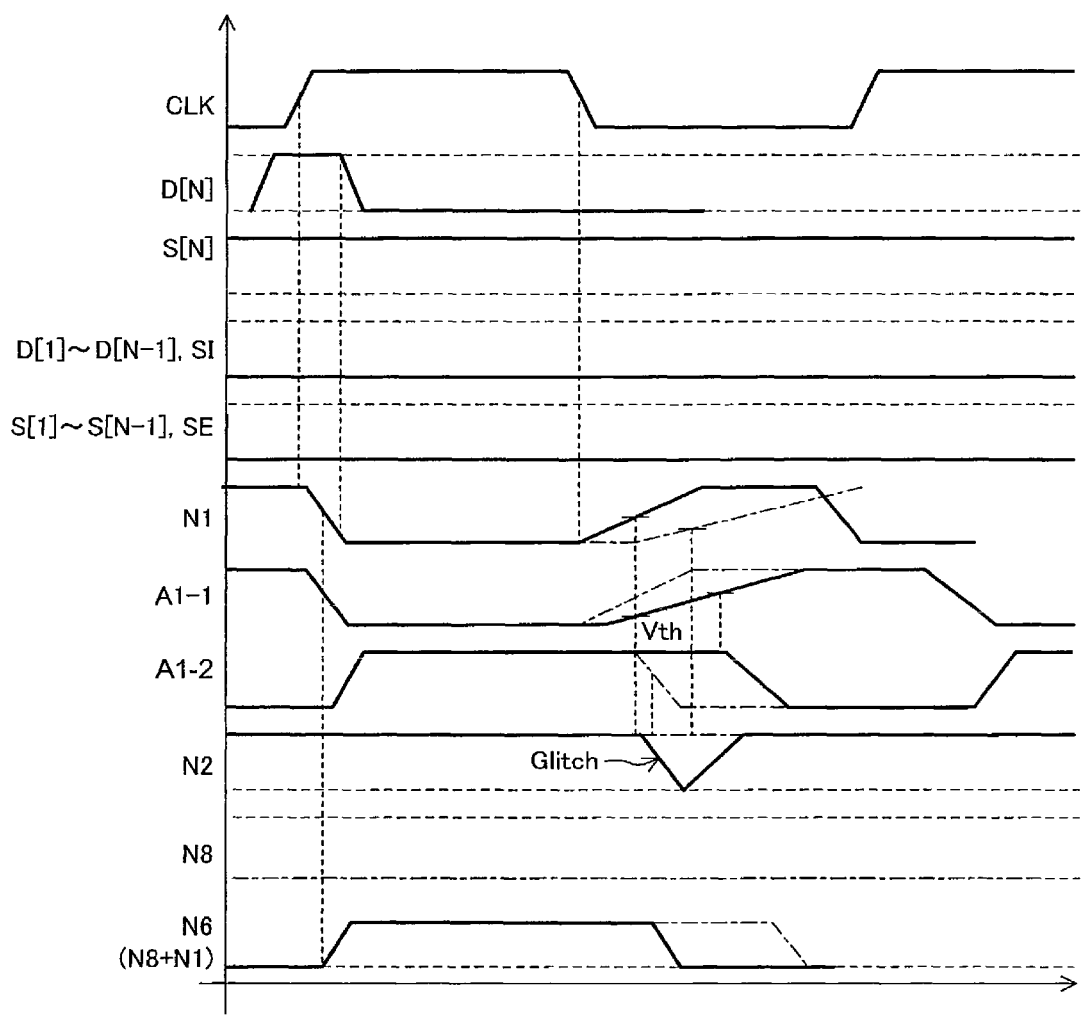
FIG. 18 is a timing chart of each node with respect to still another signal input pattern in the semiconductor integrated circuit of Embodiment 5.

Further, in FIG. 18, when the clock signal CLK1 goes to High, the terminals D[N] and S[N] satisfy desired setup and hold times and are High, while input signals of the terminals S[1] to S[N−1], SE, D[1] to D[N−1], and SI satisfy desired setup and hold times and are Low. Thereafter, during a period when the clock signal CLK1 is High, the terminal D[N] goes from High to Low. Thereafter, the clock signal CLK1 goes from High to Low. In this case, the node A1-1 and the node N1 are charged. The node N1 reaches a threshold voltage Vtn of the n-type MOS transistor earlier than the node A1-1, depending on transistor variations in the p-type MOS transistor. In this case, a through current flows through the node N25, resulting in a glitch in the node N2. The glitch is propagated to the node N7, so that an erroneous operation occurs in the output terminal Q.

In the circuit of FIG. 15, however, since the source of the p-type MOS transistor 13A is connected to the node A1-1, current-voltage characteristics of a voltage difference between the drain and source of the p-type MOS transistor 13A exhibit linearity up to near a voltage threshold voltage Vtp. Since a substrate voltage of the p-type MOS transistor 13A is higher than a source voltage thereof, the p-type MOS transistor 13A behaves as if it were a considerably high resistor. Therefore, the node A1-1 is charged first before start of charging of the node N1. Therefore, after a gate voltage of an n-type MOS transistor 1E-1 becomes smaller than or equal to a threshold voltage of the n-type MOS transistor, a gate voltage of an n-type MOS transistor 1E-2 becomes easier to be larger than or equal to a threshold voltage, so that the through current of the node N2 becomes difficult to flow, and therefore, a glitch does not occur in the node N7. Further, in FIG. 15, the gate of a p-type MOS transistor 13B2 and the gate of a p-type MOS transistor 13C2 are connected to the clock signal CLK1.

In the circuit of FIG. 12, discharging of the node N2 starts only after a voltage of a node A1-2 reaches (Vdd-Vtp) or more. In FIG. 15, when the clock signal CLK1 has a voltage of (Vdd-Vtp) or more, the node N2 is ready for discharging. Therefore, advantageously, the node N2 can operate faster than that of FIG. 12.

As described above, the source of the p-type MOS transistor 13B2 is connected to the power source. The drain of the p-type MOS transistor 13B2 is connected to the source of the first p-type MOS transistor 13B1. The drain of the p-type MOS transistor 13B1 is connected to the node N2. The gate of the second p-type MOS transistor 13B2 is connected to the clock signal CLK1. The gate of the p-type MOS transistor 13B1 is connected to the output of the inverter circuit INV13 of the node N1. The source of the p-type MOS transistor 13C1 is connected to the power source. The drain of the p-type MOS transistor 13C1 is connected to the source of the p-type MOS transistor 13C1. The drain of the p-type MOS transistor 13C2 is connected to the node N4. The gate of the p-type MOS transistor 13C2 is connected to the clock signal CLK1. The gate of the p-type MOS transistor 13C1 is connected to the output of the inverter circuit INV13 of the node N1. The source of the p-type MOS transistor 13A is connected to the node A1-1. As a result, the charging order of the node A1-1 and the node N1, the charging order of the node N1 and the node N2, and the charging order of the node N1 and the node N4 are each uniquely determined without depending on manufacturing variations in device size of the p-type MOS transistor, thereby making it possible to obtain a more robust circuit structure.

The structure in which the source of the p-type MOS transistor 13A is connected to the node A1-1 is described above. Alternatively, the source of the p-type MOS transistor 13A may be connected to the drain of another p-type MOS transistor, whose source may be in turn connected to the power source and whose gate may be in turn connected to the output of the inverter circuit of the node A1-1. In this case, a similar effect can be obtained. In other words, the present invention may be implemented with any circuit structure in which the charging order of the node A1-1 and the node N1, the charging order of the node N1 and the node N2, and the charging order of the node N1 and the node N4 can each be uniquely determined without depending on manufacturing variations in device size of the p-type MOS transistor. Such a circuit structure can be achieved with a combination of various circuits, and does not depart from the scope of the present invention.

Embodiment 6

Figure 19:
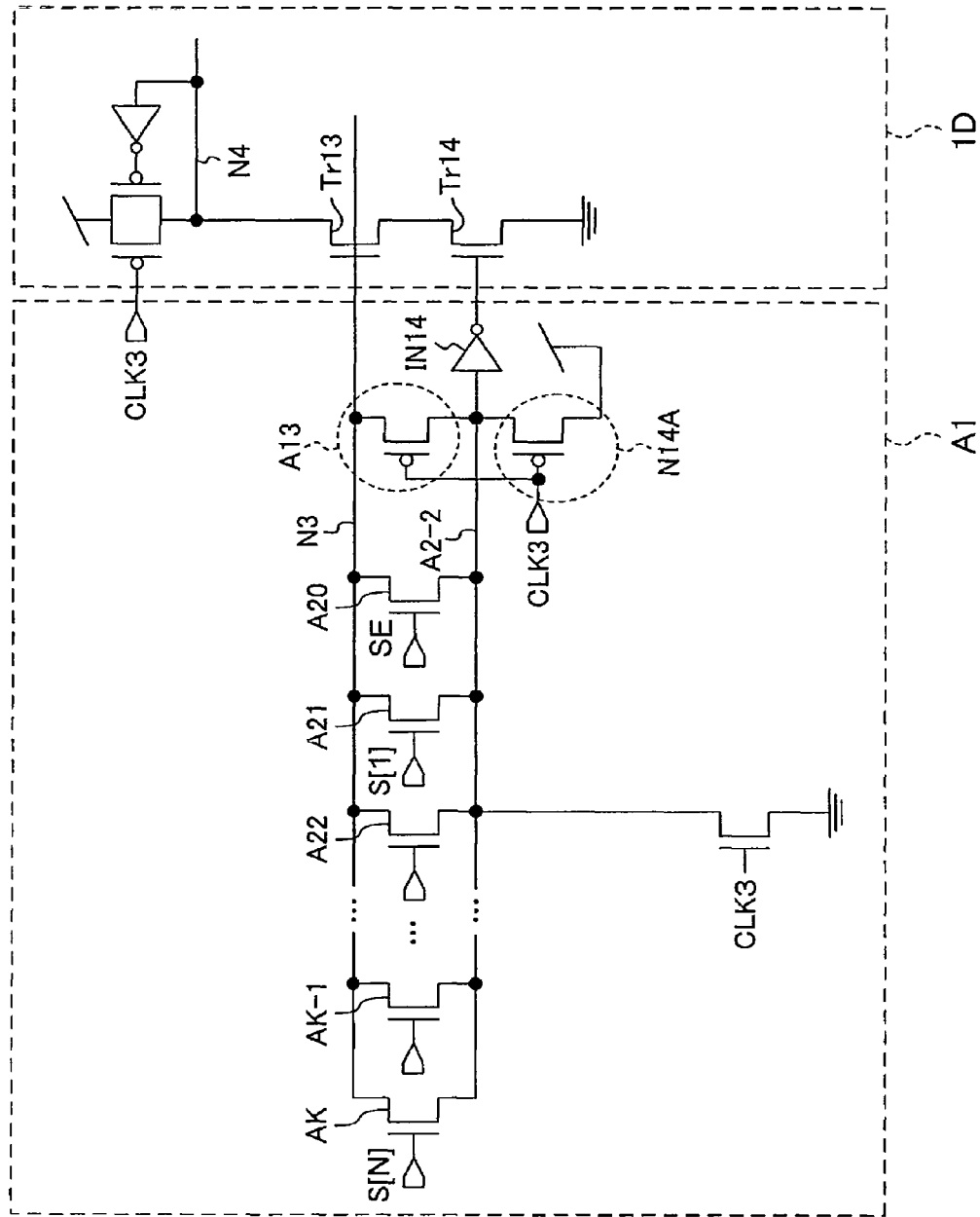
FIG. 19 is a diagram illustrating a structure of a semiconductor integrated circuit according to Embodiment 6 of the present invention.

FIG. 19 is another circuit diagram illustrating the dynamic circuits 1C and 1D of the multi-input flip-flop of FIG. 1.

The dynamic circuits 1C and 1D of FIG. 19 are different from those of FIG. 1 in that first and second p-type MOS transistors A13 and N14A are provided in place of the p-type MOS transistor Tr9 for charging the node N3; the clock signal CLK3 is input to the gate of the p-type MOS transistor N14A, the source of the p-type MOS transistor N14A is connected to a power source, and the drain of the p-type MOS transistor N14A is connected to the node A2-2 (i.e., the common source of the third n-type transistors A20 to AK); and the source and drain of the other p-type MOS transistor A13 are connected to the nodes N3 and the node A2-2 (i.e., the common drain and the common source of the third n-type transistors A20 to AK), respectively. Further, although the clock signal CLK4 is connected to the gate terminal of the transistor Tr14 of the dynamic circuit 1D in FIG. 1, an output of an inverter circuit IN14 is connected to the gate terminal of the transistor Tr14 in FIG. 19.

Such a circuit structure has an advantage such that, when a signal having the same phase as that of the clock signal CLK3 is input to the clock signal CLK4, i.e., the circuit is driven only based on the clock signal CLK3 as in FIG. 19, the circuit can be operated with an even lower power source voltage. The reason will be described as follows. In the circuit structure of FIG. 1, it is assumed that the clock signal CLK4 and the clock signal CLK3 having the same phase are input. When the clock signal CLK3 goes from Low to High with a low power source voltage which is in the vicinity of a threshold voltage of the n-type MOS transistor (e.g., the threshold voltage of the n-type MOS transistor is 0.3 V and the power source voltage is 0.5 V), it takes an overwhelmingly longer time for the node N3 to discharge than for the gate terminal of the transistor Tr14. In this case, the node N4 goes to Low, but not High, though the transistor Tr13 is normally supposed to be cut off and the node N4 is normally supposed to go to High (i.e., any of the terminals S[1] to S[N] and the terminal SE goes to High).

In the structure of FIG. 19, however, when the clock signal CLK3 goes from Low to High, the nodes N3 and A2-2 simultaneously start discharging. When the node N14A goes to no more than a switching level of the inverter circuit IN14, the voltage of the gate of the transistor Tr14 is increased. Therefore, the node N3 goes to no more than the threshold voltage of the n-type MOS transistor Tr13 before the gate of the transistor Tr14 goes to High. In this case, it is unlikely that a through current flows through the node N4 via the transistors Tr13 and Tr14. As a result, a low-voltage operation is stabler than that of the circuit structure of FIG. 1.

Further, when the clock signal CLK3 goes from High to Low, current-voltage characteristics of a voltage difference between the drain and source of the p-type MOS transistor A13 exhibit linearity up to near a voltage threshold voltage Vtp. Since a substrate voltage of the p-type MOS transistor A13 is higher than a source voltage thereof, the p-type MOS transistor A13 behaves as if it were a considerably high resistor. The node N3 is charged only after the potential of the node A2-2 becomes higher than or equal to the threshold voltage of the p-type MOS transistor A13. In other word, the transistor Tr13 is turned ON only after the gate of the transistor Tr14 is lowered to some extent. Since the node N4 is charged in accordance with the clock signal CLK3, a glitch is suppressed from occurring in the potential of the node N4 when the transistor Tr13 is turned ON. As a result, an erroneous operation which is involved with the dynamic the circuits A1 and 1D is suppressed.

Embodiment 7

Figure 11:
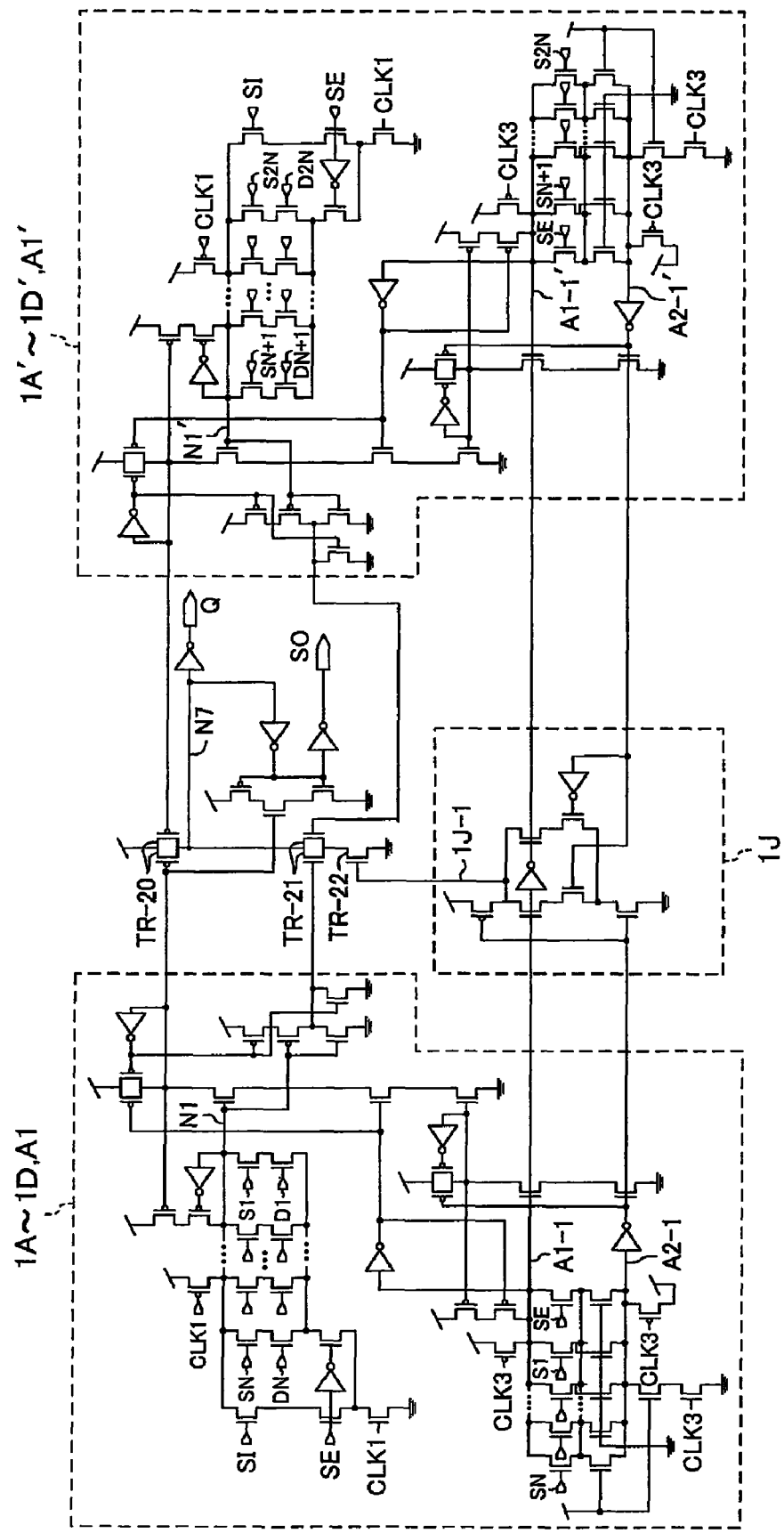
FIG. 11 is a diagram illustrating another variation of the semiconductor integrated circuit of FIG. 9.
Figure 20:
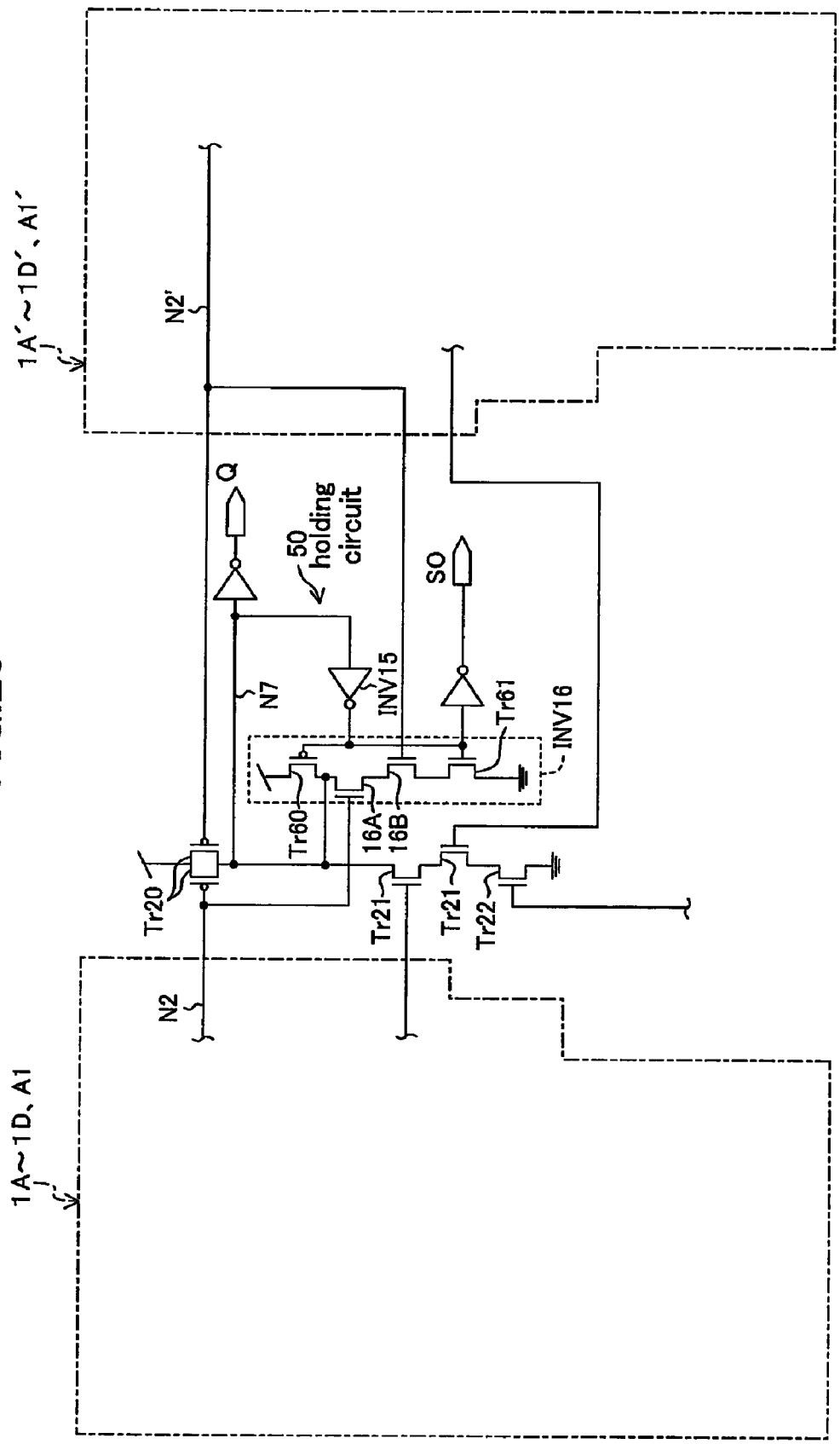
FIG. 20 is a diagram illustrating a structure of a semiconductor integrated circuit according to Embodiment 7 of the present invention.

FIG. 20 illustrates an exemplary application of FIG. 11.

In FIG. 11, a flip-flop is provided which has a multi-input selection function in which input data is divided into two groups. In FIG. 20, transistors of the output circuits 1E are combined to construct a NAND logic circuit with respect to outputs of a multi-input selection function comprised of dynamic circuits 1A to 1D, and A1 and a multi-input selection function comprised of dynamic circuits 1A' to 1D', and A1'.

Specifically, two p-type MOS transistors Tr20 are provided which have a common source and drain. Two p-type MOS transistors Tr21 are connected in series to each other. Further, in a holding circuit 50 which is comprised of a first inverter INV15 connected to the drain of the p-type MOS transistor Tr20 and a second inverter INV16 which receives an output of the inverter INV15, one stage of n-type MOS transistor 16A to the gate of which the second output nodes N2 of the dynamic circuits 1A to 1D and A1 are connected is provided between a P-type MOS transistor Tr60 and a N-type MOS transistor Tr61 constituting the second inverter INV16 (this structure is similar to that of FIG. 11). In FIG. 20, one stage of n-type MOS transistor 16B to the gate of which the second output nodes N2' of the dynamic circuits 1A' to 1D' and A1' are connected is provided, thereby maintaining the high speed of the holding circuit 50. Note that the two stages of n-type MOS transistors may be provided between the ground and the n-type MOS transistor Tr61 constituting the second inverter INV16.

In this embodiment, an exemplary NAND logic has been described. The present invention is not limited to this. Various combined logic circuits can be produced. In addition, by replacing a dynamic logic portion involved in the dynamic circuit 1A or 1A' with various logics, a flip-flop circuit having more various combined logic functions can be constructed. Further, by connecting an N-type transistor between Tr5 and the node N2 of FIG. 1 and connecting the output of the dynamic circuit 1A having another logic to the gate of the N-type transistor, more various functional logics can be constructed. Furthermore, a MOS transistor may be added to the transistor Tr20 or the transistor Tr21, and the gate terminal thereof may be connected to an output of another multi-input dynamic circuit. The resultant circuit does not depart from the scope of the present invention.

Figure 21:
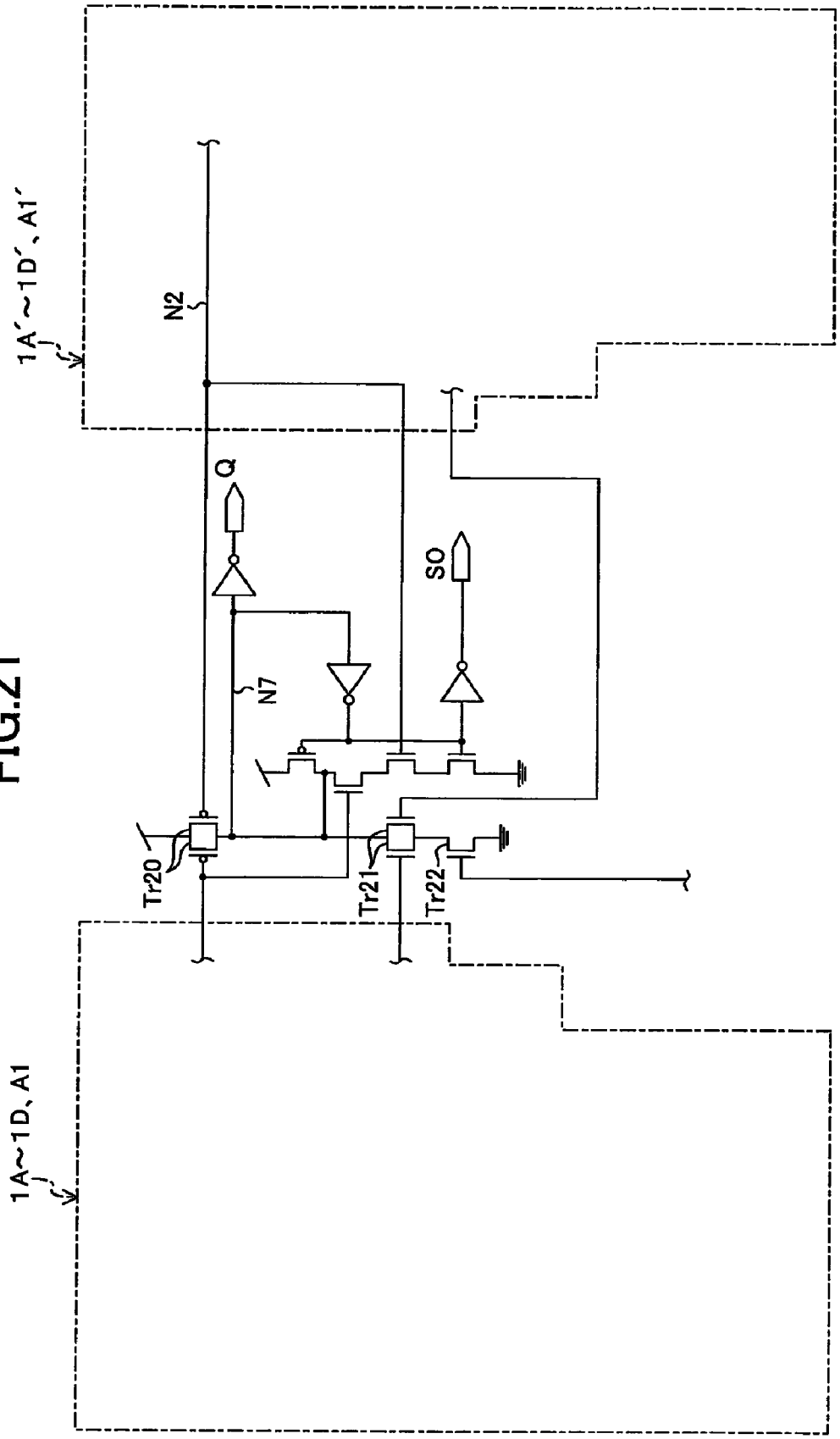
FIG. 21 is a diagram illustrating a structure of a variation of a semiconductor integrated circuit according to Embodiment 7 of the present invention.

FIG. 21 illustrates another exemplary application of FIG. 11, in which the source and drain of a transistor Tr21 in each output circuit are connected in common.

Embodiment 8

Figure 22:
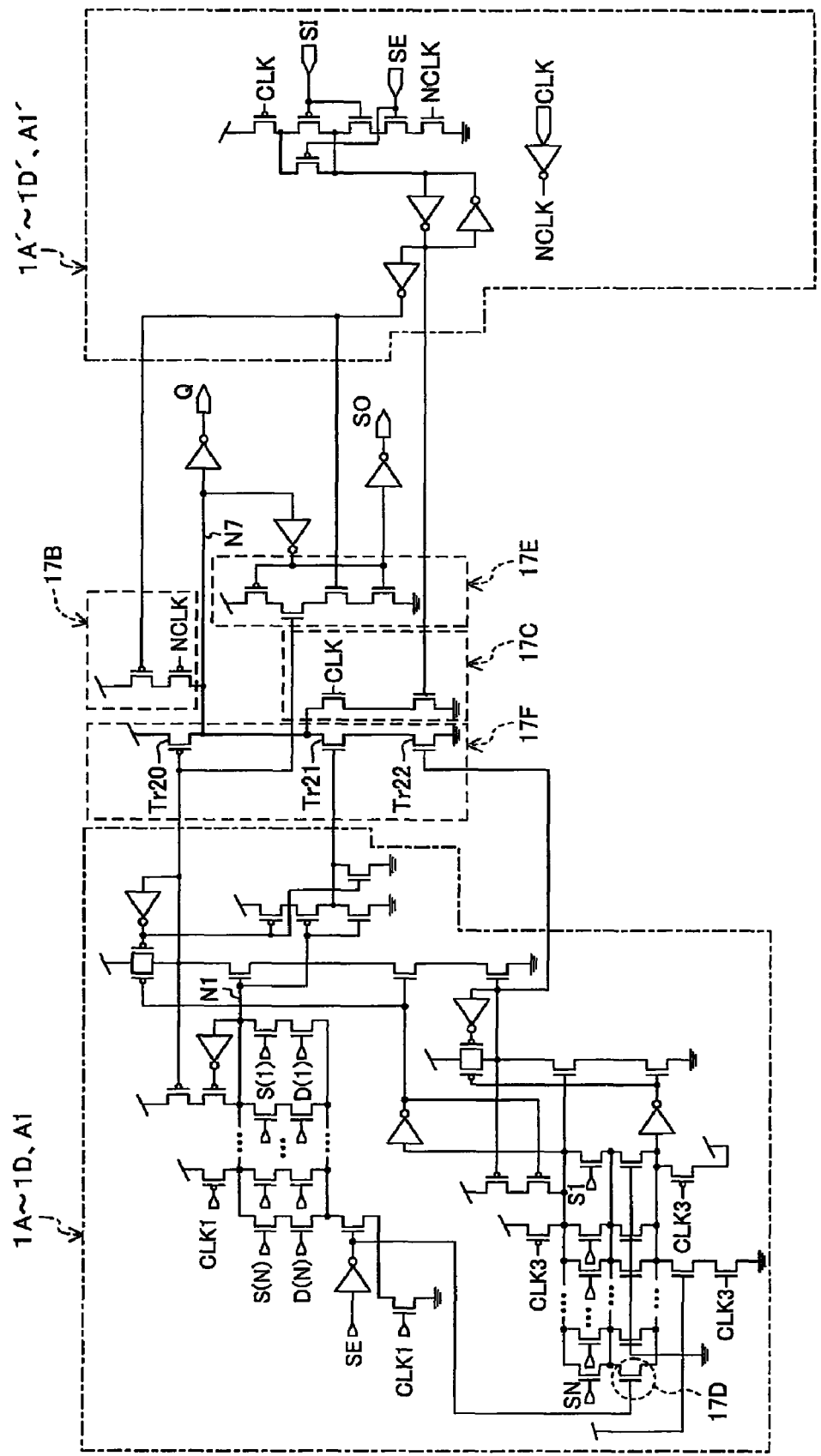
FIG. 22 is a diagram illustrating a structure of a semiconductor integrated circuit according to Embodiment 8 of the present invention.

FIG. 22 illustrates another exemplary application of FIG. 11, in which only a scan input circuit is provided in dynamic circuits 1A' to 1D' and A1'.

Figure 23:
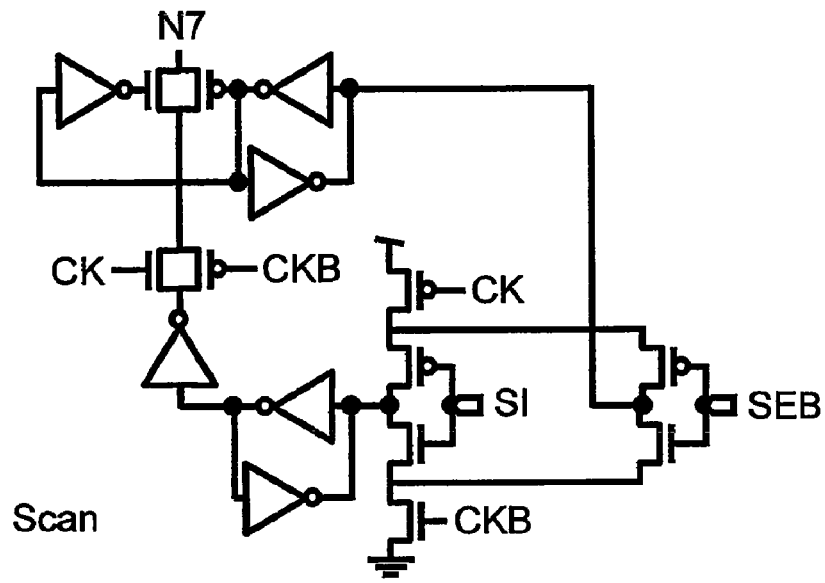
FIG. 23 is a diagram illustrating another static flip-flop according to Embodiment 8.
Figure 24:
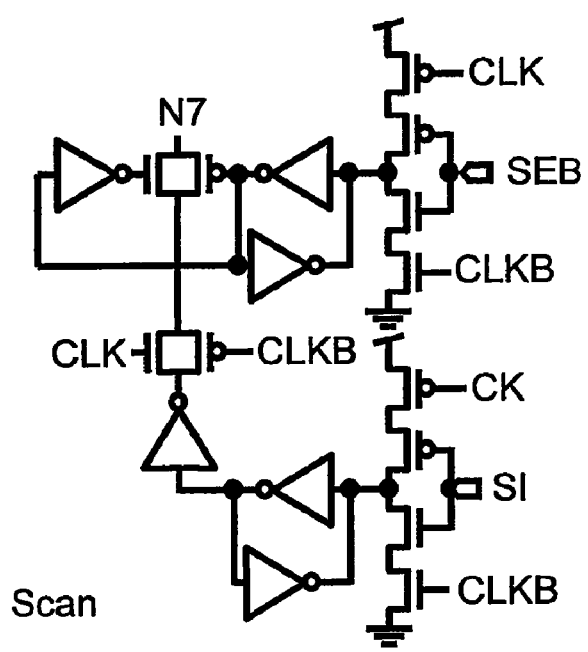
FIG. 24 is a diagram illustrating still another static flip-flop according to Embodiment 8.

The dynamic circuits 1A' to 1D', A1', 17B and 17C are static flip-flops which share a holding circuit portion 17E and an output portion of an output terminal Q with a multi-input selection function flip-flop comprised of dynamic circuits 1A to 1D and A1. Further, the circuit of FIG. 22 is different from that of FIG. 11 in that the gate of an n-type MOS transistor 17D is connected to an inverted output of a scan enable signal SE. The static flip-flop may be circuits as illustrated in FIGS. 23 and 24.

With this circuit structure, when the scan enable signal is activated, the transistors Tr22 and Tr20 are cut off, while only the circuit elements 17B and 17C are operated. The circuit has an advantage such that the capacitance of the node N1 can be reduced, and in an ordinary path, high speed can be achieved by using a dynamic flip-flop. For a scan path, a hold time during scan input is shortened by using a static flip-flop, thereby effectively securing a margin for a scan shift operation.

Note that, by combining an output circuit portion of the dynamic circuit and an output portion of the static circuit with an output circuit portion 17F, a flip-flop circuit having more various logic functions can be obtained. As described above, in the present invention, the advantages of the dynamic circuit and the static circuit can be selectively utilized, depending on the function of an input signal or a desired specification.

The eight embodiments have been heretofore described. It is easy for those skilled in the art to exchange a portion of the circuit structure of a semiconductor integrated circuit of any one of the eight embodiments with a portion of the circuit structure of any one of the other seven embodiments. For example, the dynamic circuit 1B of FIG. 8 may be exchanged with the dynamic circuit 1B of FIG. 9.

Hereinafter, specific examples in which the above-described semiconductor integrated circuit is applied to predetermined circuits will be described in Embodiments 9 to 11 below.

Embodiment 9

Figure 25:
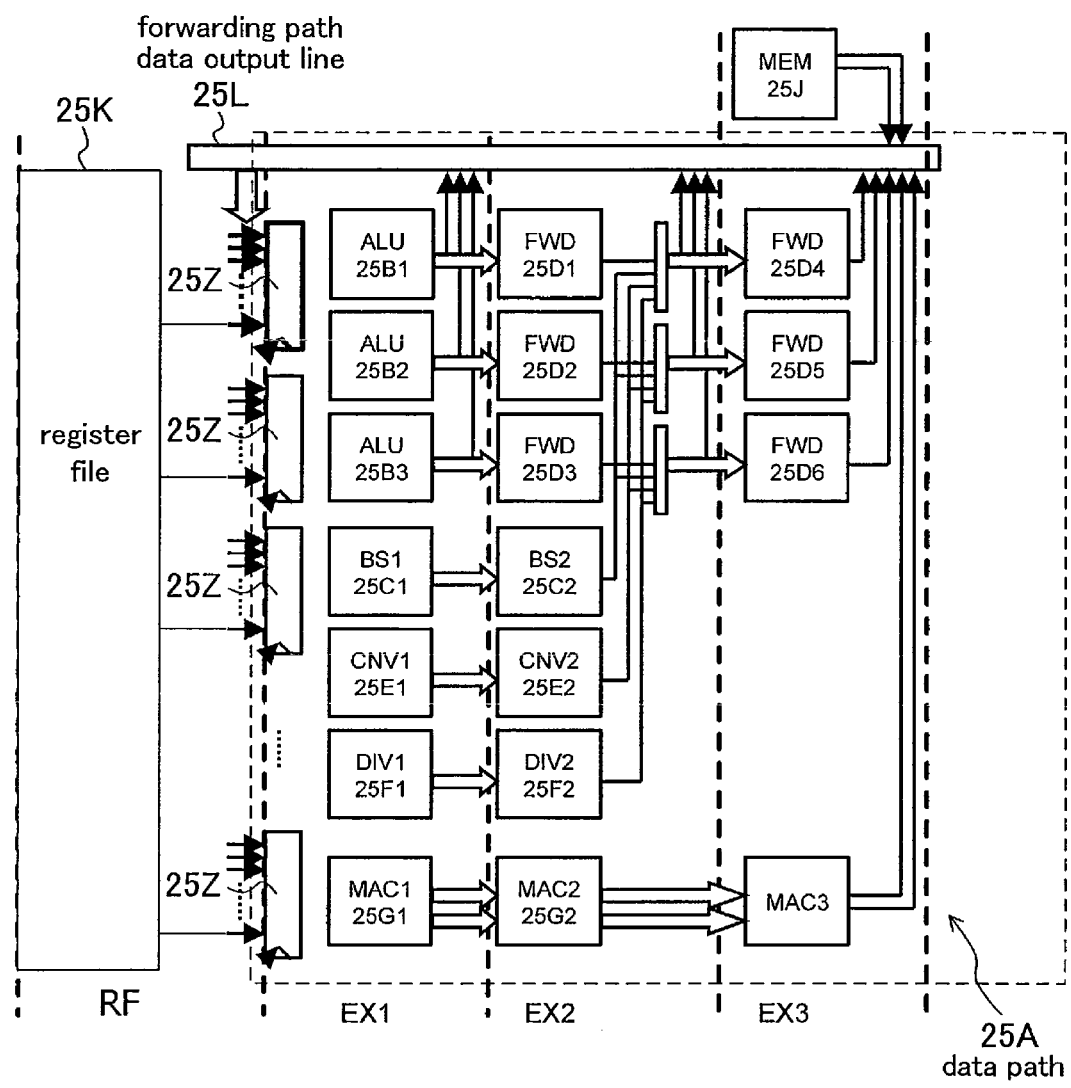
FIG. 25 is a diagram illustrating a data path according to Embodiment 9.

FIG. 25 illustrates an embodiment in which the flip-flop of Embodiment 1 or Embodiment 8 is applied to a data path of a processing unit as a predetermined circuit.

FIG. 25 illustrates a data path 25A, a memory 25J, and a register file 25K. The data path 25A has a three-stage pipeline structure. The first stage includes 10 multi-input flip-flops 25Z of the embodiment above, each of which has 14 data input per bit of data. Outputs of the multi-input flip-flops 25Z are input to ALUs 25B1 to 25B3, a bypass unit 25C1, a convolution 25E1, a divider 25F1, and a multiplier 25G1. The second stages includes forwardings 25D1 to 25D3, a bypass unit 25C2, a convolution 25E2, a divider 25F2, and a multiplier 25G2. The third stages includes forwardings 25D4 to 25D6, and a multiplier 25G3. Normally, data output from the register file 25K is selected by the flip-flop 25Z. When a data hazard occurs in a pipeline process, a forwarding path is used to avoid the pipeline process from being disturbed. The number of pieces of data per bit of the forwarding path is 13 which is the sum of the number of pieces of output data from the pipeline stages and the number of data output lines 25L from a memory. Data which has been subjected to arithmetic processing in the ALU or the like needs to be input to the flip-flop. Therefore, in order to achieve high-speed pipeline processing, a time required to set up data input from the forwarding path of the flip-flop is caused to be as small as possible. In the flip-flop described in the embodiment above, the data signal setup time is substantially zero (when the delay of an inverter is, for example, 45 psec where the fan-out is 4, a setup time of, for example, 300 psec is required in a flip-flop with a static logic selector control circuit illustrated in the conventional example. In the flip-flop described in the embodiment above, the data setup time is, for example, 10 psec, and the control signal setup time is, for example, 30 psec), and therefore, a higher speed is achieved than that of conventional static logic structures, resulting in higher pipeline processing speed.

Also, even when the data path pipeline is stalled, the flip-flop of the present invention is useful. A logic for controlling a data path requires a control circuit which, when a pipeline in the data path is stalled, compares addresses of data and determines which data is to be selected in the next cycle, so as to determine whether or not loaded data can be effectively used. However, in the flip-flop of the present invention, the control signal setup time is also substantially zero, and therefore, a higher speed is achieved than that of conventional static logic structures, resulting in higher pipeline processing speed. Further, a data control can be performed using a transistor size smaller than when a selection signal is arranged by conventional static logics, thereby making it possible to arrange data paths with a small area. In addition, in static logics, a data transition delay time of each input varies due to a wire resistance or the like, so that a glitch occurs in an output of each static logic, and useless power is generated until data is established. In the configuration of the flip-flop of the present invention, each data and its control line are directly connected to a data input port and a control input port of the flip-flop without via a static logic path, whereby useless power is not generated.

Embodiment 10

Figure 26:
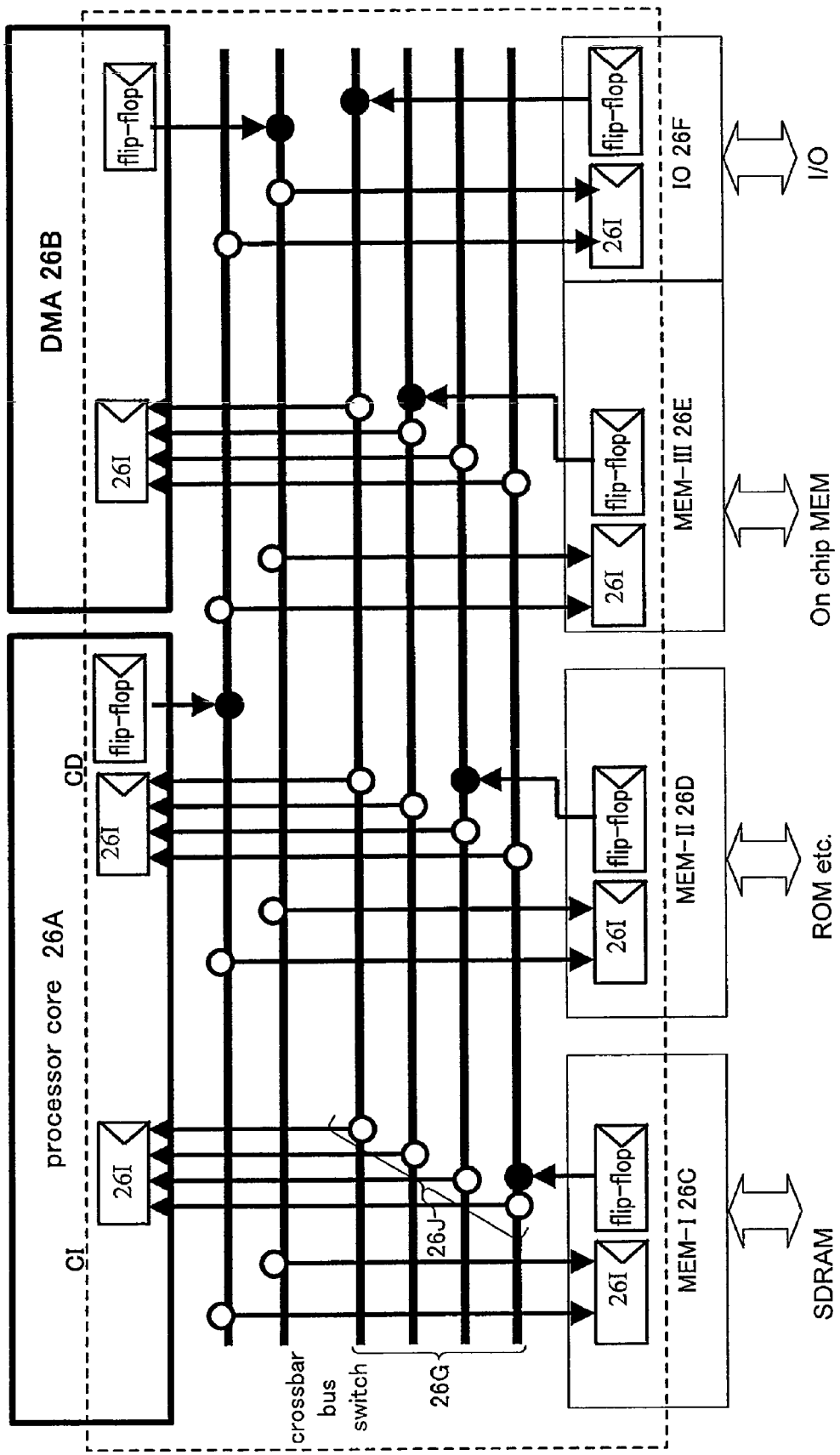
FIG. 26 is a diagram illustrating a crossbar bus switch according to Embodiment 10.

FIG. 26 illustrates an embodiment in which the flip-flop described in the embodiment above is used in a crossbar bus switch, which is used in a system-on-chip or the like.

In FIGS. 26, 26A indicates a processor core and 26B indicates a DMA. 26C is an SDRAM interface block which interfaces with an SDRAM outside the chip. 26D indicates a system bus interface block which interfaces with a ROM, a memory or the like outside the chip. 26E indicates an on-chip memory interface block which controls interface with an on-chip memory or a co-processor. 26F indicates an on-chip I/O interface block which controls interface with an on-chip I/O. The crossbar bus switch has three masters (not shown), two of which are provided in the processor core 26A and one of which is provided in the DMA 26B. The crossbar bus switch also has four slaves (not shown), which are the SDRAM interface block 26C, the system bus interface block 26D, the on-chip memory interface block 26E, and the on-chip I/O interface block 26F. Between four slave buses 26G and each master, a four-input data selection control circuit 26J and a flip-flop 26I which receives its output signal are present. As the four-input data selection control circuit 26J, the multi-input flip-flop of the present invention is used. Thereby, since setup times for data and a control signal are short in the multi-input flip-flop, the transfer rate of the bus can be improved by a reduction in the setup time. Further, since the value of the flip-flop can be held when no control signal is selected, the control of data bus arbitration is not required in each master, resulting in a structure with a small area.

Note that, by using the flip-flop of the present invention with respect to the input to the slave, an effect similar to the above-described master input can be obtained.

Embodiment 11

Figure 27:
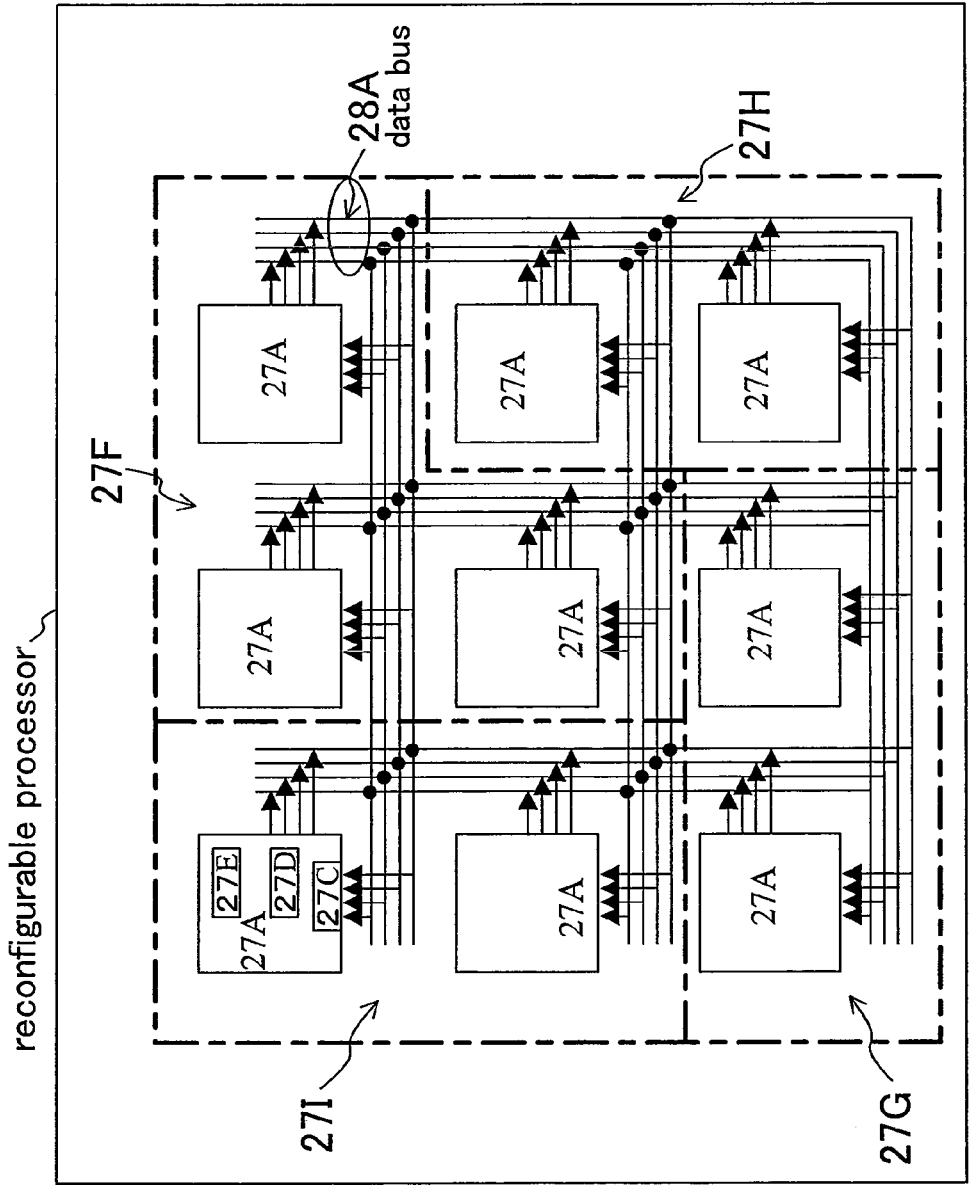
FIG. 27 is a diagram illustrating a reconfigurable processor according to Embodiment 11.

FIG. 27 illustrates an embodiment in which the flip-flop of the present invention is applied to a reconfigurable processor.

In FIGS. 27, 27A indicates each processor element in the reconfigurable processor. The processor element 27A includes a multi-input flip-flop 27C comprised of the flip-flop described in the embodiment above, an operator 27D, a register file 27E, and the like. 28A indicates buses in the reconfigurable processor. Data output from one processor element 27A is directly connected to four data buses. Also, data inputs of the multi-input flip-flop 27C in the processor element 27A are connected to the four respective data buses. In the reconfigurable processor, some of the processor elements 27A are simultaneously subjected to an operation process so as to improve the processing performance of a certain application. For example, when a processor element group 27F is separated from other processor element groups 27G, 27H and 27I, processor elements in each group perform data communication with each other. In this case, since the four groups are separated from each other, an independent bus interface can be constructed in each group. By using the multi-input flip-flop of the present invention, a static selection control logic as in the conventional art is not required, resulting in a high-speed bus interface in each group and a small area of each processor element. Further, regarding clocks of the element groups 27G, 27H and 27I, when the elements 27A in the element group are connected in parallel to perform parallel processing, a clock having the same phase is used, and when the elements 27A in the element group are connected in series to perform serial processing, clocks having different phases are used. For example, when the element group 27I performs two-stage serial processing, a clock having a phase difference of 0 may be used for the first-stage element 27A, while a clock having a phase difference of 180 degrees may be used for the second-stage element. Thereby, by stopping the clock in the second-stage element 27A and providing a static data selection circuit which bypasses the flip-flop, the effect of reducing the area and increasing the speed is obtained. Also, with the above-described structure, even when a certain application is switched to another different application, so that the group structure of processor elements needs to be changed, a conventional static selection control logic is not used, so that a control of changing any bus lines can be performed with high speed. Therefore, switching latency is small, resulting in a higher-performance reconfigurable processor.

Embodiment 12

Figure 28:
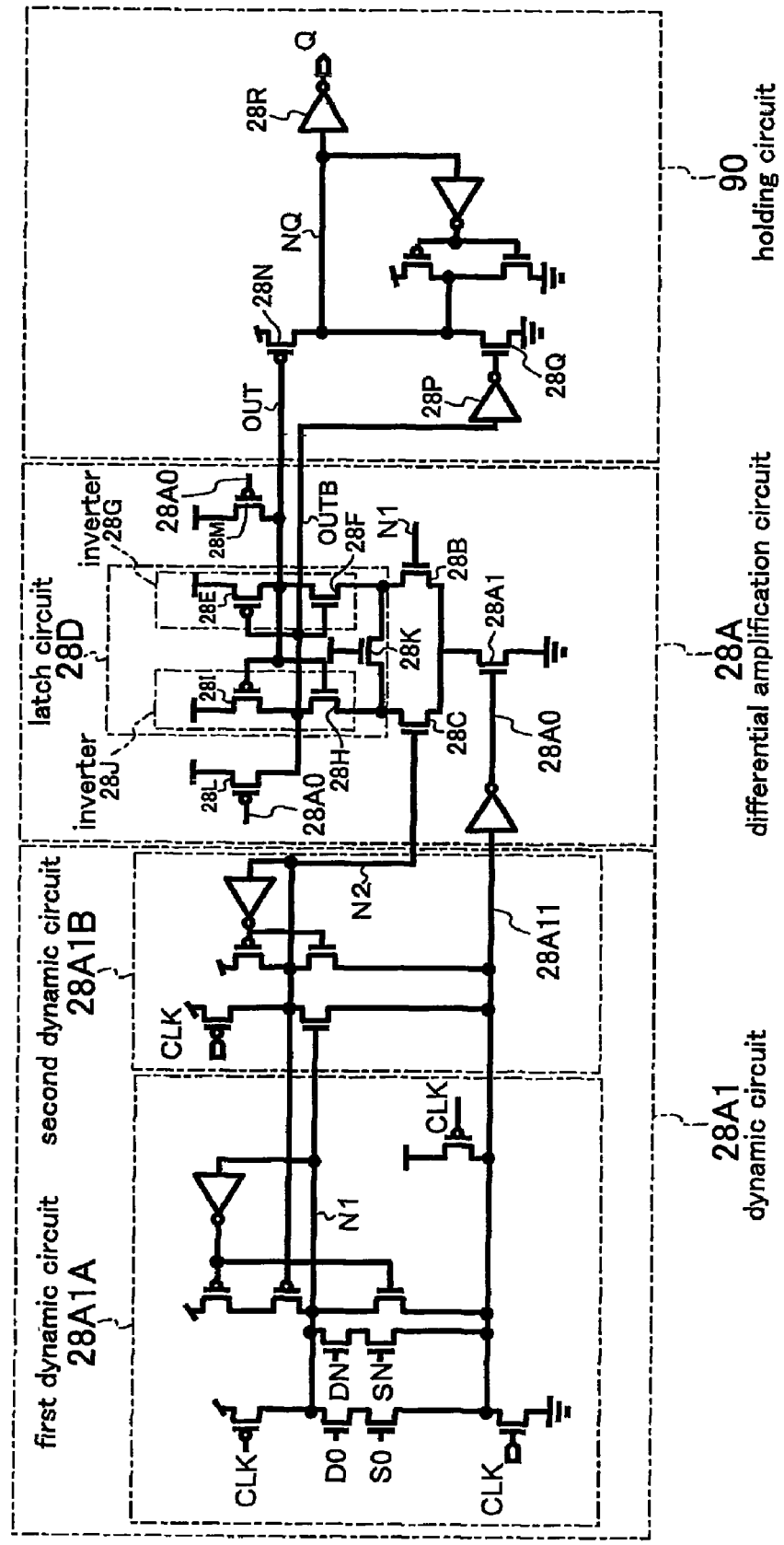
FIG. 28 is a diagram illustrating a structure of a semiconductor integrated circuit according to Embodiment 12.

FIG. 28 illustrates a semiconductor integrated circuit according to Embodiment 12 of the present invention.

This embodiment is different from the semiconductor integrated circuit of FIG. 3(a) in that a differential amplification circuit 28A is inserted between output nodes N1 and N2 of first and second dynamic circuits 28A1A and 28A1B and a holding circuit 90.

An activation signal 28A0 for the differential amplification circuit 28A is a signal obtained by slightly delaying the clock CLK of FIG. 3(a) from a resistance element or a capacitance element comprised of a semiconductor device. In this embodiment, the activation signal 28A0 is connected via an output signal node 28A11 of a dynamic circuit 28A1 and an inverter 28A01 to the gate of the active N-type transistor 28A1 of the differential amplification circuit 28A.

The differential amplification circuit 28A comprises the N-type transistor 28A1, a differential pair transistor in which the gates of N-type transistors 28B and 28C whose sources are connected to the drain of the N-type transistor 28A1 are input terminals thereof, and a latch circuit 28D which amplifies a difference in drain voltage between the N-type transistors 28B and 28C. The latch circuit 28D comprises five transistors, in which an inverter 28G comprising an N-type transistor 28E and a P-type transistor 28F is cross-connected with an inverter 28J comprising an N-type transistor 28H and a P-type transistor 28I. Also, the drains of the N-type transistors 28B and 28C are connected to each other via a high-resistance element (here, an NMOS transistor 28K). The output of the inverter 28G is a node OUT, and the output of the inverter 28J is a node OUTB. Also, when the activation signal is inactivated, the nodes OUT and OUTB are charged to substantially a power source voltage value by the P-type transistors 28L and 28M, respectively.

The node N1 is connected to the gate of the N-type transistor 28B, and the node N2 is connected to the gate of the N-type transistor 28C.

The holding circuit 90 comprises a P-type transistor 28N having a gate to which the node OUT is connected, and an N-type transistor 28Q having a gate to which the node OUTB is connected via an inverter 28P, in which the drain of the P-type transistor 28N is connected with the drain of the N-type transistor 28Q, and the connection node NQ is connected via an inverter 28R to an output pin Q.

With the structure above, when a voltage difference between the voltage of the output node N1 and the voltage of the output node N2 is small, the voltage difference is amplified by the differential amplification circuit 28A with higher speed, so that the voltage difference can be quickly increased to a switching level of the holding circuit. As the number of pieces of input data D0 to DN and the number of their selection signals S0 to SN are increased, the high-speed operation effect is further exhibited than when the dynamic circuit 28A1 and the holding circuit 90 are directly connected to each other as illustrated in FIG. 3(a). This is because the load capacitance of the node N1 is increased with an increase in those numbers, and the voltage transition times of the output node N1 and the output node N2 when connected to a typical holding circuit (e.g., the holding circuit of FIG. 1) is delayed since the voltage transition time of the output signal of the holding circuit is proportional to the voltage transition times of the nodes N1 and N2.

Note that, in this embodiment, a structure is employed in which the activation signal 28A0 is transferred via the dynamic circuit 28A1. Therefore, the capacitance of the node of the dynamic circuit 28A1 is further reflected when the clock CLK is delayed by several stages of buffers. Therefore, an optimal delay value which allows an appropriate voltage difference between the output node N1 and the output node N2 is achieved and the number of transistors is reduced, so that a smaller area and lower power consumption are also achieved.

Note that, when the number of input data signals of the dynamic circuit 28A1 is small, the clock CLK may be directly used as an activation signal for the differential amplification circuit 28A.

Also, although, in this embodiment, the dynamic circuit 28A1 of FIG. 3(a) having a function of selecting any of a plurality of data signals is used, a similar effect is obtained even when a dynamic circuit having another logic function, such as a dynamic circuit having a function of propagating only one data signal or the like, is used.

Figure 29:
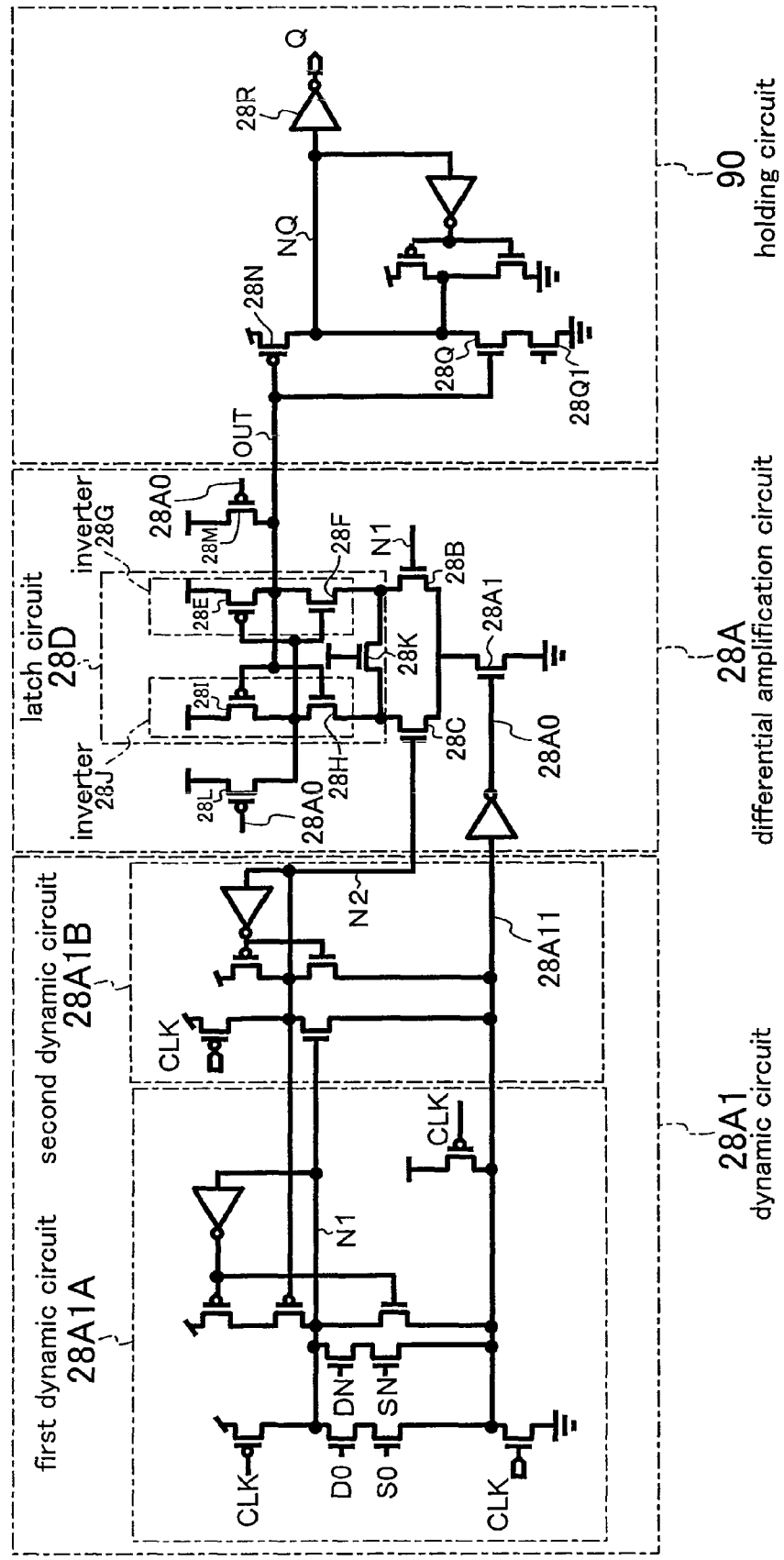
FIG. 29 is a diagram illustrating another structure of the semiconductor integrated circuit of Embodiment 12.

Further, as illustrated in FIG. 29, the holding circuit 90 may receive only one output of the differential amplification circuit 28A and may be connected to the gates of the N-type transistor 28Q and the P-type transistor 28N. An N-type transistor 28Q1 to the gate of which the activation signal 28A0 of the differential amplification circuit 28A is input may be connected in series between the N-type transistor 28Q and the ground.

In addition, although, in this embodiment, the differential amplification circuit 28A is provided in a circuit without the third dynamic circuit (non-selected state detection circuit) 1C of FIG. 1, the differential amplification circuit 28A may be provided in a circuit having the third dynamic circuit (non-selected state detection circuit) 1C of FIG. 1 and the like.

Embodiment 13

Figure 30:
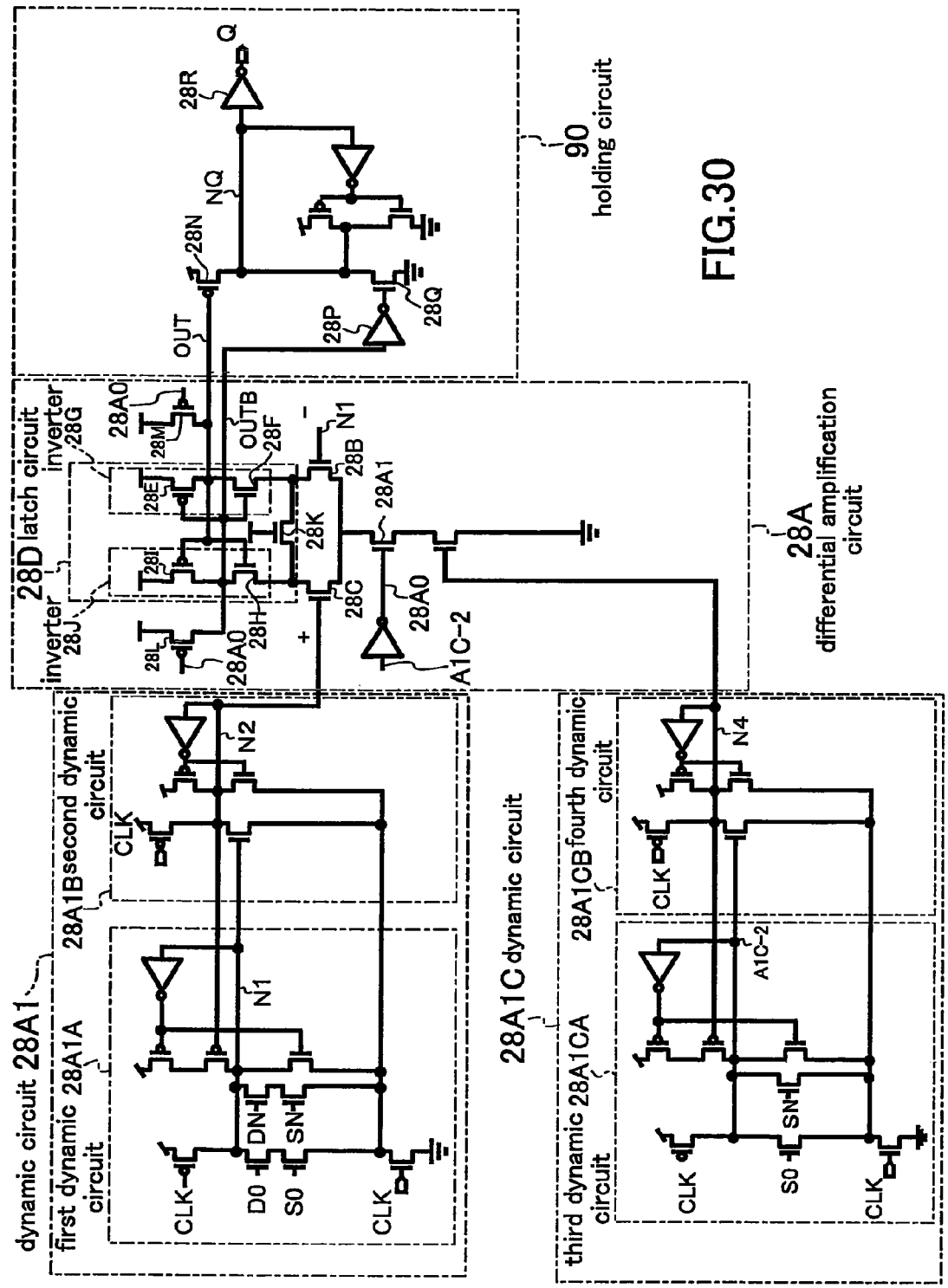
FIG. 30 is a diagram illustrating a semiconductor integrated circuit according to Embodiment 13.

FIG. 30 illustrates a semiconductor integrated circuit according to Embodiment 13 of the present invention. This embodiment is different from the semiconductor integrated circuit of FIG. 28 in that a function of holding the content of data of the holding circuit 90 when none of the selection signals S0 to SN selects the data signals D0 to DN is added.

A dynamic circuit 28A1C comprises a third dynamic circuit 28A1CA and a fourth dynamic circuit 28A1CB. Only selection signals S0 to SN are input to the third dynamic circuit 28A1CA. An output node A1C-2 of the third dynamic circuit 28A1CA is input to the fourth dynamic circuit 28A1CB, and an output node of the fourth dynamic circuit 28A1CB is a node N4. When one or more of the selection signals S0 to SN are selected, the node N4 holds High after a clock goes from Low to High. Also, the node A1C-2 goes from High to Low. When none of the selection signals S0 to SN is selected, the node N4 goes from High to Low after the clock goes from Low to High, and the node A1C-2 holds the High level. When the selection signal S0 goes to High after exceeding a desired hold value, the node A1C-2 goes from High to Low, while the node N4 remains Low. The node AC1-2 and the node N4 are transferred to the gates of two N-type transistors 28A1 and 28AA connected in series in the differential amplification circuit 28A. Therefore, when no selection signal is activated, the differential amplification circuit 28A is not activated, so that the nodes OUT and OUTB remain High, and therefore, the node NQ of the holding circuit 90 is not changed.

As described above, a function of holding the content of data of the holding circuit 90 when no selection signal is activated can be achieved. Thereby, when none of a plurality of pieces of data is selected, the holding circuit 90 can hold the previous data information even after the clock is transitioned, thereby making it possible to reduce setup times of data and a selection signal as compared to the conventional art.

Also, regarding the dynamic circuit 28A1 and the dynamic circuit 28AC1, since the dynamic circuit 28AC1 has a smaller load capacitance, the dynamic circuit 28AC1 has quicker voltage transition of the output node. Therefore, the differential amplification circuit 28A starts an operation during transition of the output nodes N1 and N2 of the dynamic circuit 28A1, so that, even when a voltage difference between the nodes N1 and N2 is small, the voltage difference is amplified with higher speed than in the amplification circuit 28A. In addition, it is advantageous that the vertically symmetrical layout as in FIG. 10 does not need to be formed.

Although, in this embodiment, the differential amplification circuit 28A is provided in a circuit without the third dynamic circuit (non-selected state detection circuit) 1C of FIG. 1, the differential amplification circuit 28A may be provided in a circuit having the third dynamic circuit (non-selected state detection circuit) 1C of FIG. 1 and the like.

Embodiment 14

Figure 31:
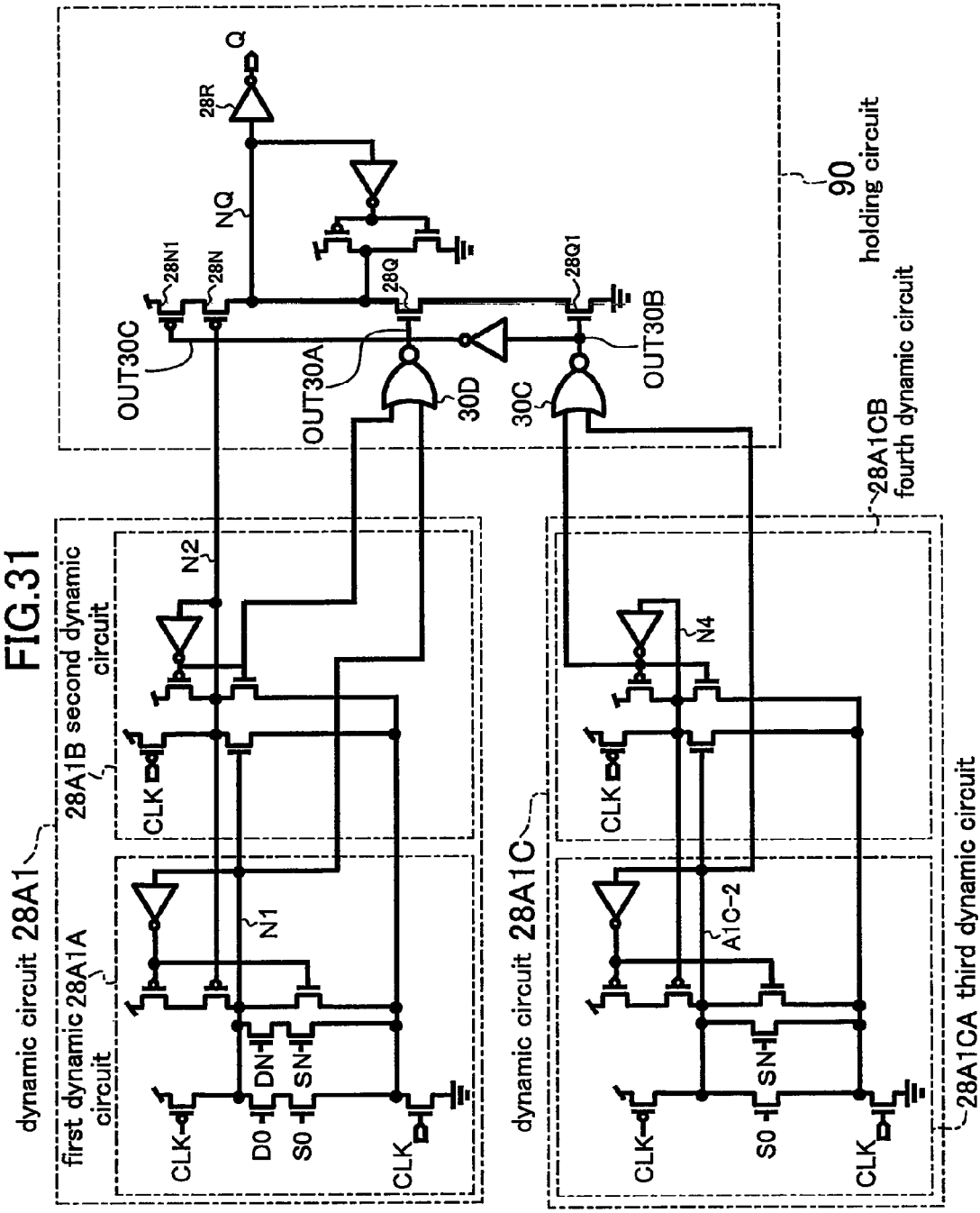
FIG. 31 is a diagram illustrating a structure of a semiconductor integrated circuit according to Embodiment 14.

FIG. 31 illustrates a semiconductor integrated circuit according to Embodiment 14 of the present invention. This embodiment includes the form of the semiconductor integrated circuit of FIG. 11, and further, has a form useful in a case where the vertically symmetrical layout as in FIG. 10 cannot be achieved due to the specification of the height of a cell when the semiconductor integrated circuit is physically designed (layout design).

In FIG. 31, a dynamic circuit 28A1 has a first dynamic circuit 28A1A and a second dynamic circuit 28A1B, receives data signals D0 to DN and selection signals S0 to SN, and outputs nodes N2 and N1. On the other hand, a dynamic circuit 28A1C has a third dynamic circuit (non-selected state detection circuit) 28A1CA and a fourth dynamic circuit 28A1CB, receives only selection signals S0 to SN, and outputs nodes N4 and A1C-2. In the first dynamic circuit 28A1A, the number of stages of N-channel transistors connected in series for selecting any of a plurality of pieces of data (i.e., transistors for inputting data D, selection signals S, and a clock CLK) is three. In the third dynamic circuit (non-selected state detection circuit) 28A1CA, the number of stages transistors connected in series for detecting a state in which none of a plurality of selection signals is selected (i.e., transistors for inputting data D, selection signals S, and a clock CLK) is two, which is smaller by one than the number (three) of stages connected in series in the first dynamic circuit 28A1A.

In FIG. 31, inverted data of the output node N2 and the output node N1 are input to a NOR circuit 30D whose node OUT30A is connected to the gate of an N-type transistor 28Q of a holding circuit 90, and the output node N2 is connected to the gate of a P-type transistor 28N. Also, inverted data of the output node N4 and the output node A1C-2 are input to a NOR circuit 30C whose node OUT30B is connected to the gate of an N-type transistor 28Q1, and whose inverted signal OUT30C is connected to the gate of a P-type transistor 28N1. The N-type transistors 28Q1 and 28Q are connected in series, the P-type transistors 28N and 28N1 are also connected in series, and the drain of the N-type transistor 28Q and the drain of the P-type transistor 28N are connected in common, and the resultant node is NQ.

An operation of the above-described structure will be described. When the clock CLK is Low, the node N2 of the dynamic circuit 28A1 and the node N4 of the dynamic circuit 28A1 are High, and the nodes OUT30A and OUT30B are Low.

Data signals D0 to DN and selection signals S0 to SN are input to the dynamic circuit 28A1. When one of the selection signals S0 to SN is selected and the data signals D0 to DN are High, the node N2 holds High after the clock goes to Low to High. Also, the node N1 goes from High to Low. OUT30A goes from Low to High.

When none of the selection signals S0 to SN is selected, the node N2 goes from High to Low after the clock goes from Low to High, and the node N1 holds High. The node OUT30A holds Low. After the data signal and the selection signal exceed desired hold values, when any of the selection signals S0 to SN goes to High, the node N1 goes from High to Low, while the node N2 remains Low. Therefore, the node OUT30A remains High.

Only selection signals S0 to SN are input to the dynamic circuit 28A1C. When one or more of the selection signals S0 to SN are selected, the node N4 holds High after the clock goes from Low to High. Also, the node A1C-2 goes from High to Low. The node OUT30B goes from Low to High.

When none of the selection signals S0 to SN is selected, the node N4 goes from High to Low after the clock goes from Low to High since the node A1C-2 holds High. The node OUT30B holds Low. After the selection signal S0 exceeds a desired hold value (e.g., the selection signal S0 goes to High), the node A1C-2 goes from High to Low, while the node N4 remains Low. Therefore, the node OUT30B remains Low. Therefore, when none of the selection signals S0 to SN is selected, the holding circuit 90 holds data, and when any of the selection signals S0 to SN is activated, selected data of the data signals D0 to DN is output as an output Q.

Regarding the dynamic circuit 28A1 and the dynamic circuit 28A1C, the dynamic circuit 28A1C has a smaller load capacitance, the dynamic circuit 28A1C has quicker voltage transition of the output node than that of the dynamic circuit 28A1. Therefore, before transition of the output nodes N2 and OUT30A of the dynamic circuit 28A1, the nodes OUT30B and OUT30C hold transition or a potential. Therefore, when none of the selection signals S0 to SN is activated, data in the holding circuit 90 can be reliably held.

As described above, in the dynamic circuit 28A1C, it is not necessary to provide the vertically symmetrical physical design (layout design) as in FIG. 10 in which a dummy data input transistor is required (the dynamic circuit 28AC1 does not require a dummy data input transistor), so that the number of transistors is also reduced, and therefore, a small area and low power consumption are possible. Also, in the dynamic circuit 28A1C, the charge times of the output node N4 and the node A1C-2 are shorter than that of the output nodes N1 and N2 of the dynamic circuit 28A1, and therefore, even when the clock CLK goes from High to Low, a glitch is unlikely to occur in the node NQ of the holding circuit 90, so that the semiconductor integrated circuit is unlikely to malfunction.

Note that a signal input to the gate of the P-type transistor 28N1 may be an output of a logic structure which is High when the dynamic circuit 28A1C is not selected and is Low when the dynamic circuit 28A1C is selected, and can be generated by various logic structures using the node N4 and the node A1C-2.

Embodiment 15

Figure 32:
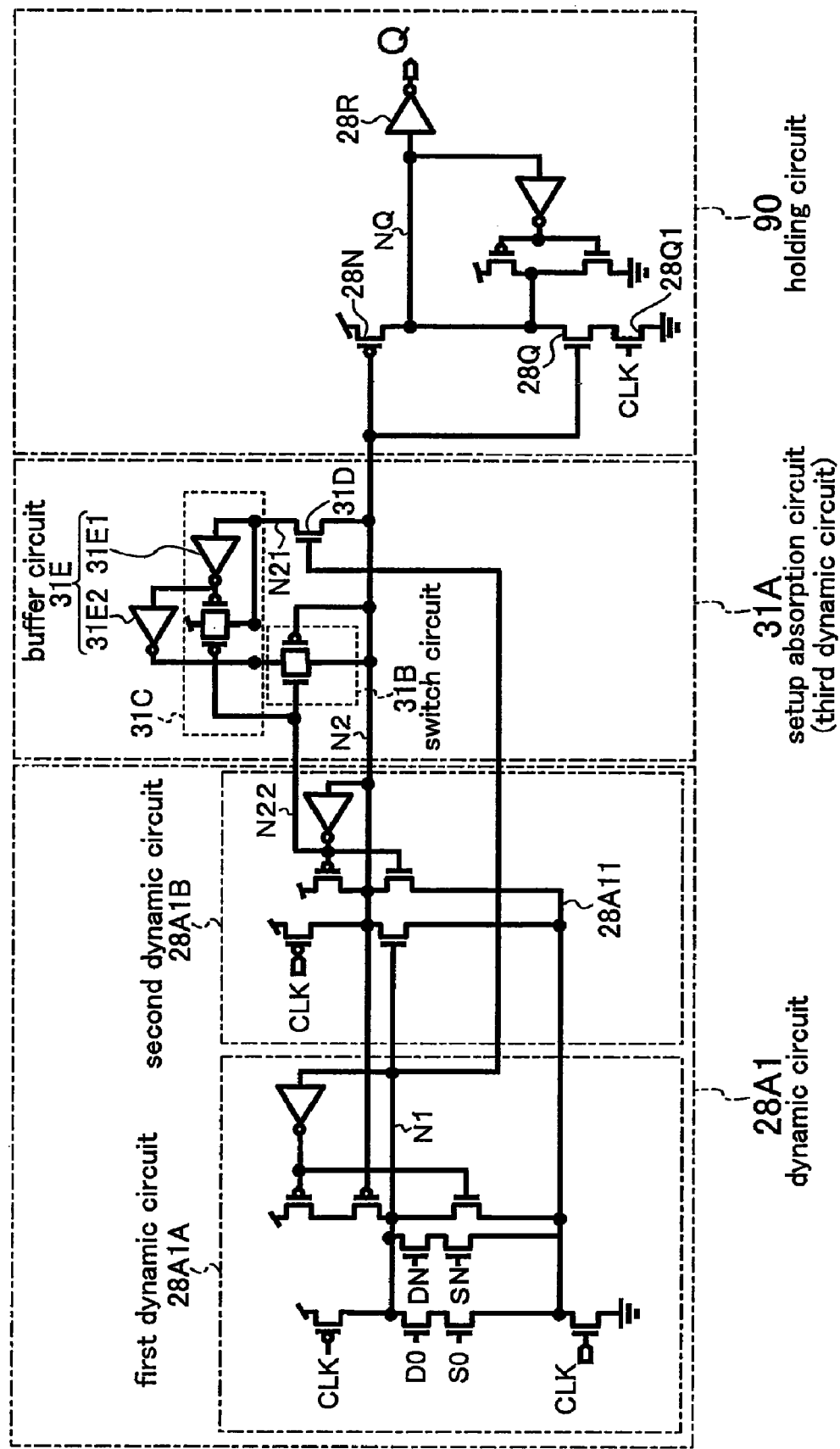
FIG. 32 is a diagram illustrating a structure of a semiconductor integrated circuit according to Embodiment 15.

FIG. 32 illustrates a semiconductor integrated circuit according to Embodiment 15 of the present invention. This embodiment is different from that of FIG. 3(a) in that a setup absorption circuit 31A is inserted between the node N1 of the first dynamic circuit 28A1A and the node N2 of the second dynamic circuit 28A1B and the holding circuit 90.

The setup absorption circuit 31A comprises a switch circuit 31B, a circuit 31C for charging a node N21 and holding a High potential level, and an N-type transistor 31D. The gate of the N-type transistor 31D is connected to a node N1, the source of the N-type transistor 31D is connected to a node N2, and the drain of the N-type transistor 31D is connected to a node N21. Also, the switch circuit 31B comprises a transfer gate. When the node N2 goes to Low, the potential of the node N21 is transferred to the node N2 via a buffer 31E comprised of two inverters 31E1 and 31E2 and the switch circuit 31B. The node N21 is charged when the node N2 is High.

Figure 33:
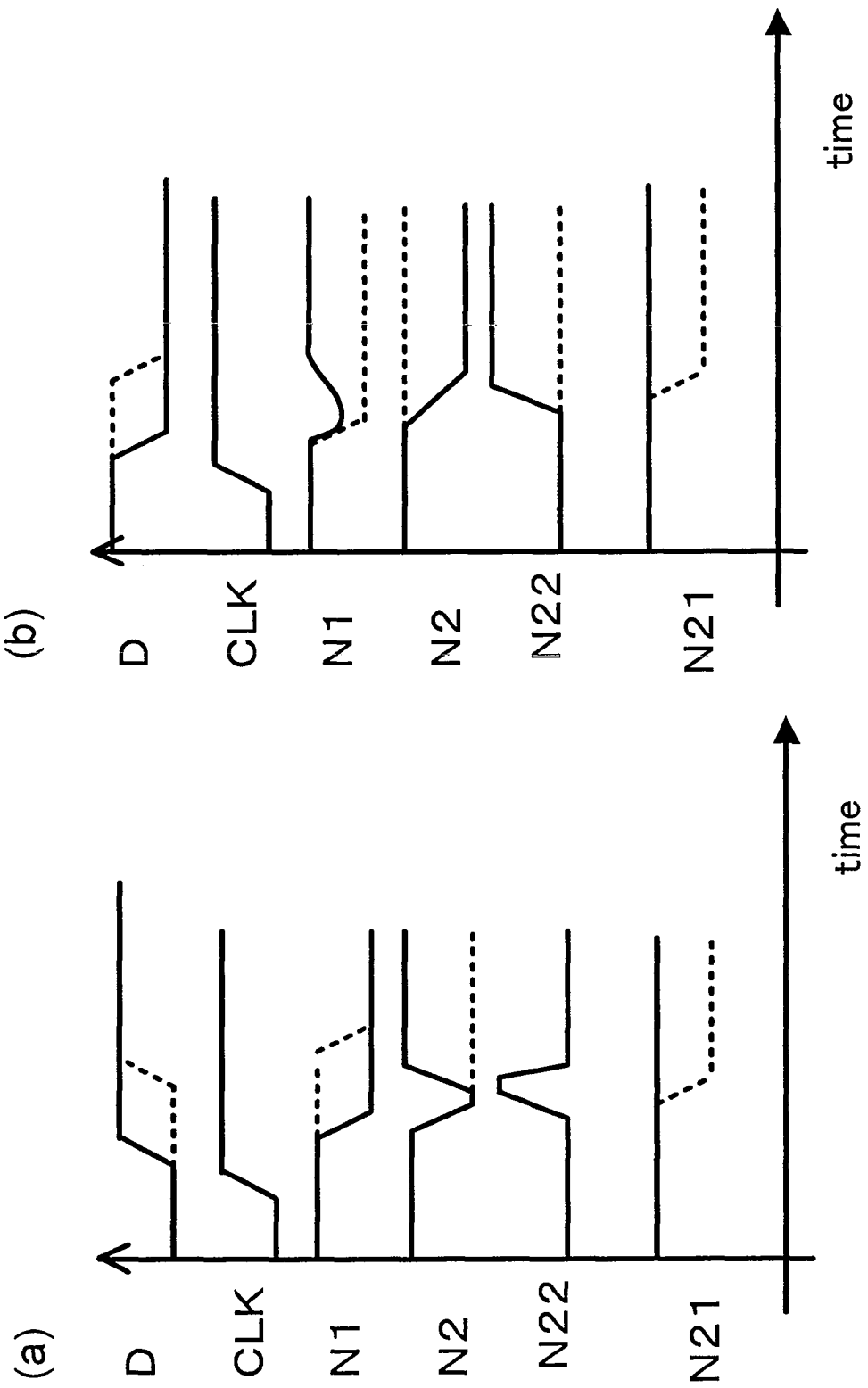
FIG. 33 is a diagram illustrating a timing chart of these miconductor integrated circuit of Embodiment 15.

An operation of the setup absorption circuit 31A will be described with reference to a timing chart of FIG. 33. The horizontal axis represents times, and the vertical axis represents voltage values of each signal, data D, a clock CLK, the node N1, the node N2, the node N21, and a node N22.

In FIG. 33(a), when the clock CLK is Low, the data D is Low, and after the clock CLK goes from Low to High, the data D goes from Low to High slightly later than a prescribed setup time. This case will be hereinafter discussed. Since the output node N1 does not comply with the data setup time, the output node N1 slowly goes from High to Low. Therefore, the output node N2 goes from High to Low. When data arrives within the prescribed setup time, the output node N2 is normally supposed to hold High. Thereafter, the node N22 is inverted. In the timing chart, while the node N22 is inverted, the output node N1 goes to Low, so that the node N21 is held High. Therefore, the output node N2 goes from Low to High via the switch circuit 31B, and the output Q of the holding circuit 90 outputs High. In FIG. 33(a), dashed lines indicate when the data D is significantly delayed form the prescribed setup. In this case, the output node N2 remains Low, and the output Q of the holding circuit 90 outputs Low, so that erroneous data is output.

In FIG. 33(b), when the clock CLK is Low, the data D is High, and after the clock CLK goes from Low to High, the data D goes from High to Low slightly later than a prescribed setup time. This case will be hereinafter discussed. Since the node N1 does not comply with the setup time of the data D, the output node N1 slowly goes from High to Low. Normally, the node N1 needs to hold High. Therefore, the node N2 slowly goes from High to Low. Normally, the node N2 needs to quickly go to Low. In the timing chart, while the output node N1 slowly goes from High to Low, the data D goes to Low, so that a keeper circuit for the output node N1 causes the node N1 to gradually go from an intermediate potential to High. Thereafter, the node N22 is inverted. While the node N22 is inverted, the output node N1 goes to High, so that the node N21 goes from High to Low. Therefore, the output node N2 remains Low via the switch circuit 31B, and the output of the holding circuit 90 outputs Low. In FIG. 33(b), dashed lines indicate when the data D is significantly delayed form the prescribed setup. In this case, the output node N2 remains High, and the output Q of the holding circuit 90 outputs High, so that erroneous data is output.

As described above, even when the data D slightly violates the setup, the setup absorption circuit 31A allows the output Q to indicate a normal value, resulting in a circuit robust against a variation in process, a variation in power source voltage, and the like.

Figure 34:
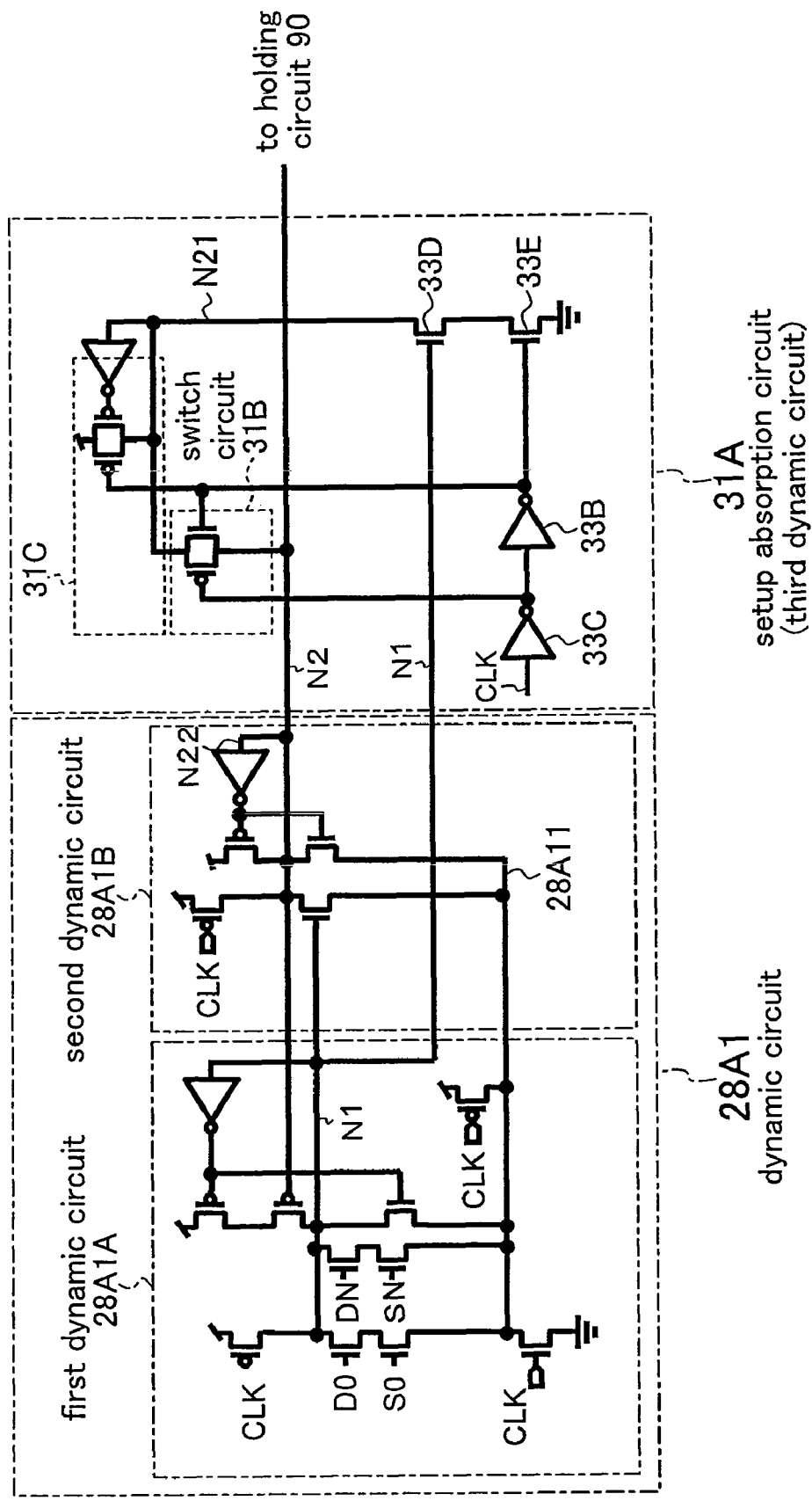
FIG. 34 is a diagram illustrating another structure of a setup absorption circuit included in the semiconductor integrated circuit of Embodiment 15.

Although, as illustrated in FIG. 34, the source of the N-type transistor 31D of the setup absorption circuit 31A is connected to the output node N2, the source of the N-type transistor 31D of the setup absorption circuit 31A may be connected to the drain of an N-type transistor 33E whose source is grounded. Also, a signal line on which the clock CLK is further delayed by inverters 33C and 33B may be connected to the gate of the N-type transistor 33E. In this case, the dynamic node N21 is connected to the output node N2 only via a switch element which is controlled by the signal line on which the clock is delayed. Thereby, when the data D goes from Low to High slightly later than the prescribed setup, the node N2 is quickly charged, resulting in high-speed transition of the voltage of the output Q. Alternatively, the inverted output of the output node N2 may be output to the gate of the N-type transistor 33E.

Also, for the gate of the N-type transistor 33E, a clock which satisfies a holding time constraint of data with higher precision, and a clock having a different phase may be used. Thereby, the violation of the setup time of the data D can be absorbed until the very end of the holding time of the data D. Such a clock having a different phase may be generated by distorting the duty ratio (a ratio of a High period to a Low period) of the clock CLK and inverting the resultant clock.

Although, in this embodiment, the dynamic circuit 28A1 having a function of selecting any of a plurality of data signals using a plurality of selection signals is used (FIG. 3(a)), a similar effect is exhibited by using a dynamic circuit having another logic function, such as a dynamic circuit having a function of propagating only a single data signal or the like.

Also, although, in this embodiment, the setup absorption circuit 31A is provided in a circuit without the third dynamic circuit (non-selected state detection circuit) 1C of FIG. 1, the setup absorption circuit 31A may be provided in a circuit having the third dynamic circuit (non-selected state detection circuit) 1C of FIG. 1 and the like.

INDUSTRIAL APPLICABILITY

As described above, in the present invention, even when no selection signal is activated, so that no data is selected, the output signal of the holding circuit can be satisfactorily held at the previous value. Therefore, the present invention is useful as a dynamic flip-flop circuit with a data selection function or the like.

Also, in the present invention, when input data already matches the value of an output signal from the holding circuit, the operation of at least a portion of the dynamic flip-flop circuit can be forcedly interrupted. Therefore, the present invention is preferably applied to a semiconductor integrated circuit in which a useless operation is suppressed to achieve lower power consumption, or the like.

The invention claimed is:
1. A semiconductor integrated circuit, comprising:
a dynamic logic circuit having a plurality of first input lines for data signals and a first output line;
a scan input circuit having a second input line for a data signal and a second output line; and
a holding circuit having a first transistor, a second transistor, and a third output line,
wherein the first output line is coupled to a gate of the first transistor of the holding circuit, and
the second output line is coupled to a gate of the second transistor of the holding circuit.

2. A semiconductor integrated circuit, comprising:
a dynamic logic circuit having a plurality of first input terminals for data signals and a first output terminal;
a scan input circuit having a second input terminal for a data signal and a second output terminal; and
a holding circuit having a first transistor, a second transistor and a third output line,
wherein a first output from the first output terminal of the dynamic logic circuit is input to a gate of the first transistor of the holding circuit, and
a second output from the second out put terminal of the scan input circuit is input to a gate of the second transistor of the holding circuit.

3. A semiconductor integrated circuit, wherein the semiconductor integrated circuit of claim 1 is a flip-flop circuit.

4. A semiconductor integrated circuit, wherein the semiconductor integrated circuit of claim 2 is a flip-flop circuit.

* * * * *